United States Patent [19]

Kibrick et al.

[11] Patent Number: 4,914,437
[45] Date of Patent: * Apr. 3, 1990

[54] ENCODER FOR MEASURING BOTH INCREMENTAL AND ABSOLUTE POSITIONS OF MOVING ELEMENTS

[75] Inventors: Robert I. Kibrick, Santa Cruz; Calvin R. Delaney, Aptos, both of Calif.

[73] Assignee: Regents of the University of California, Alameda, Calif.

[*] Notice: The portion of the term of this patent subsequent to Apr. 5, 2005 has been disclaimed.

[21] Appl. No.: 165,714

[22] Filed: Mar. 8, 1988

Related U.S. Application Data

[63] Continuation-in-part of Ser. No. 938,164, Dec. 4, 1986.

[51] Int. Cl.⁴ .............................................. H03M 1/22
[52] U.S. Cl. .......................................... 341/3; 341/11; 341/13; 250/231.18
[58] Field of Search ...................... 341/1, 3, 11, 13, 15, 341/16; 250/231 SE, 237 G

[56] References Cited

U.S. PATENT DOCUMENTS 4,628,298 12/1986 Hafle et al. ............................. 341/1
4,736,187 4/1988 Kibrick et al. ......................... 341/3

Primary Examiner—William M. Shoop, Jr.
Assistant Examiner—Brian K. Young
Attorney, Agent, or Firm—Owen, Wickersham & Erickson

[57] ABSTRACT

An optical encoding system for determing the absolute and the incremental positions of a movable member relative to a stationary member. For example, three stationary light sources may be supported by the stationary member for emitting three narrow light beams on respective paths. An encoding band may be supported by the movable member in the paths of the light beams. The band has a timing and incremental encoding track comprising at least one series of alternating light-blocking stripes and light-passing stripes, and a data track comprising a series of distinct absolute position tags. A read head may be supported by the stationary member and has three optical sensors, one for each light beam, two preferably in quadrature with each other for the timing and incremental encoding track, and one for the data track. Each optical sensor includes light sensors for generating an analog signal voltage. A decoding system actuated by these analog signal voltages determines the incremental and absolute position of the movable member relative to the stationary member.

100 Claims, 32 Drawing Sheets

180 INCREMENTAL LINES/REVOLUTION — INCREMENTAL RESOLUTION = 2 DEGREES
180 CHAIN CODE TAGS/REVOLUTION — ABSOLUTE RESOLUTION = 2 DEGREES

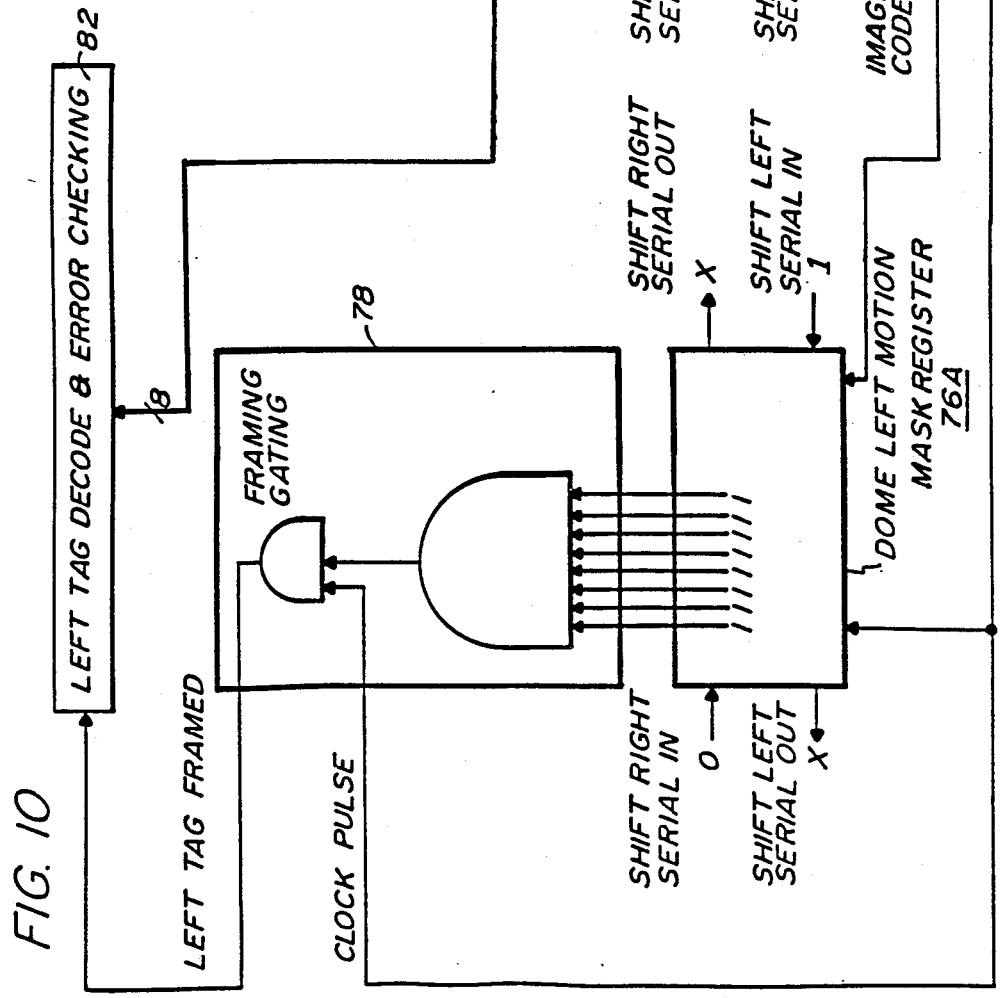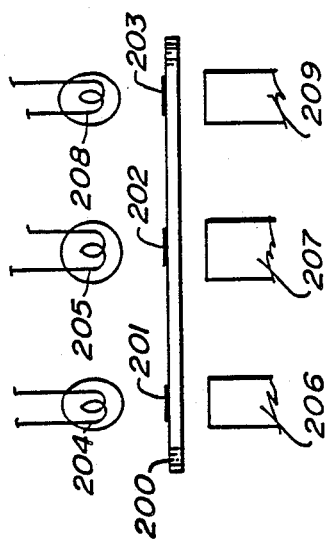
FIG. 19
FIG. 10

180 INCREMENTAL LINES/REVOLUTION -- INCREMENTAL RESOLUTION = 2 DEGREES
180 CHAIN CODE TAGS/REVOLUTION -- ABSOLUTE RESOLUTION = 2 DEGREES

180 INCREMENTAL LINES/REVOLUTION -- INCREMENTAL RESOLUTION = 2 DEGREES
180 CHAIN CODE TAGS/REVOLUTION -- ABSOLUTE RESOLUTION = 2 DEGREES

PHASE COMPARATOR OPERATING FREQUENCY = 1X LINE SPATIAL FREQUENCY

360 LINES (360 COUNTS/REV.) -- INCREMENTAL RESOLUTION = 1 DEGREE
360 CHAIN CODE TAGS/REVOLUTION -- ABSOLUTE RESOLUTION = 1 DEGREES

PHASE COMPARATOR OPERATING FREQUENCY = 2X LINE SPATIAL FREQUENCY

360 LINES (720 COUNTS/REV.) -- INCREMENTAL RESOLUTION = 0.5 DEGREES
720 CHAIN CODES/REVOLUTION -- ABSOLUTE RESOLUTION = 0.5 DEGREES

PHASE COMPARATOR OPERATING FREQUENCY = 4X LINE SPATIAL FREQUENCY

360 LINES (1440 COUNTS/REV.) -- INCREMENTAL RESOLUTION = 0.25 DEGREES
1440 CHAIN CODES/REVOLUTION -- ABSOLUTE RESOLUTION = 0.25 DEGREES

ENCODER FOR MEASURING BOTH INCREMENTAL AND ABSOLUTE POSITIONS OF MOVING ELEMENTS

CROSS-REFERENCE TO RELATED APPLICATION

This application is a continuation-in-part of application Ser. No. 938,164, filed Dec. 4, 1986, now U.S. Pat. No. 4,736,187 issued Apr. 5, 1988.

FIELD OF THE INVENTION

This invention relates to an encoder utilizing a chain code for measuring both the incremental and absolute positions of moving elements, including rotating members.

The encoder of this invention is especially suitable for measuring the azimuthal position of telescope domes. It provides an inexpensive and highly reliable dome-position encoder which has few moving parts and which eliminates the need for a mechanical engagement to the telescope dome. It may also be used to measure accurately the angular or linear position of not only comparably sized moving or rotating objects, such as hangar doors, conveyor belts, and elevators, but also may be used as part of a standard rotary or linear encoder.

Since telescope domes provide an excellent example of how the invention may be used, the application of the invention to such apparatus will be used as the prime demonstrative example in this application, but without limiting the invention to the prime example.

BACKGROUND OF THE INVENTION

A number of techniques have been used to measure the position of large rotating objects such as telescope domes. The most common approach has been a mechanical coupling between a conventional rotary position encoder and the moving surface. Thus, telescope dome position has traditionally been encoded by mechanically coupling a rotary encoder to the edge of the dome.

For example, a pinch roller has been pressed against an inner circumference of the dome, to rotate as the dome revolved. However, if this pinch roller slipped, large errors in position measurement resulted. An alternative approach to the problem has been to attach a chain to the inner circumference of the dome, the chain then driving a sprocket. In either case, the rotating axle of the pinch roller or the sprocket has been used to turn the shaft of a rotary position encoder.

Both incremental and absolute position encoders have been used. When an absolute position encoder was used, a custom-made gear reduction was usually required, so that one rotation of the dome would produce one rotation of the absolute position encoder. Such a custom gear reduction often proved to be more expensive than the absolute position encoder itself. It also tended to introduce errors in position measurement, due to mechanical backlash, and to inexact gearing. When the gear reduction was not exact, the encoder incurred a small incremental error on each rotation; then when the dome was rotated repeatedly in the same direction, this error would accumulate and grow unacceptably large.

While these mechanical couplings sometimes worked well for many years, they could become and eventually became unreliable, especially after decades of mechanical wear. Older domes that shook, wobbled, and nutated as they revolved caused these parts to wear out even faster. For example, the 100-year-old dome on the 1-meter Nickel Telescope and the 30-year-old dome on the 3-meter Shane Telescope, both at Lick Observatory, have suffered from unreliable dome pointing, caused by worn mechanical couplings between the position encoder and the dome.

If an incremental position encoder is used, then some other mechanism is required to establish an initial absolute position. This has often been accomplished by a switch which was tripped whenever the dome was rotated to an index or reference position. However, for a large dome, it can take a considerable period of time to rotate the dome to its initializing position.

In either case, while one can easily obtain conventional position encoders (either absolute or incremental) that are by themselves relatively accurate, reliable, and inexpensive, the accuracy, reliability, and economy of the position measurement that is ultimately achieved is often compromised by the inaccuracy, unreliability, and expense of the mechanical coupling between the encoder and the dome.

Even if an inexpensive and reliable mechanical coupling could be found, currently available rotary encoders do not provide redundancy and are not self-diagnosing. They can and do malfunction, and there is often considerable delay in determining that a malfunction has occurred. In the meantime, valuable observing time is lost when the dome does not point in the proper direction.

Other techniques have been employed, such as having a series of separate switches spaced at regular intervals around the circumference of the stationary part of the dome building; the separate switches were then tripped by a single detent on the moving part of the dome. This method required a tremendous number of switches and wires, and so it was quite costly and complex to maintain. To provide angular resolution comparable to that provided by the present invention, even on an average size dome, would require several thousand separate switches. Clearly, this technique does not offer the requisite economy, accuracy, and reliability.

One object of the invention is to solve these problems and prevent their recurrence.

Because of these problems, various schemes of optical encoding have been tried or considered. All of these schemes involved placing one or more bands of stripes or codes around an inner surface of the rotating portion of the dome. These codes would be sensed by one or more optical sensors attached to the fixed portion of the dome. One such scheme, that of Calvin Delaney in 1979, was a single-track incremental encoder. A similar scheme was used in 1971 for an incremental encoder on the dome of the 40-cm photometric telescope of the Observatoire de Haute Provence, France. Other optical-based schemes that were considered would have used a wider coded band to make a multi-track Gray-code absolute encoder. However, none of these went into general use because of their excessive electronic and mechanical complexity and their susceptibility to skewing errors.

One proposed idea for solving these problems was to use inexpensive commercial fixed-beam bar-code readers to encode the absolute dome position. The idea was to place bar-code symbols around the inside of the rotating part of the dome, with the absolute position at each point encoded in the corresponding bar-code symbol.

As the dome rotated, the bar-code symbols would be drawn past a fixed-beam bar-code reader, which would decode them and provide the absolute position of the dome.

Unfortunately, standard bar-code symbols cannot be scanned this way. Although such symbols can be scanned at many different speeds and from either direction, the speed and direction during any single scan must remain reasonably constant. Since the dome speed or direction can change at any time, the normal motions of the dome cannot be used reliably to scan standard bar-code symbols.

Another object of the present invention is to overcome the problems that are inherent in prior-art optical encoders.

A further object is to provide accurate position encoding for both incremental and absolute indications.

Another problem is presented by the fact that many domes are out-of-round. For example, each of the domes at both the 1-meter and 3-meter Lick Observatory telescopes is out-of-round by more than one inch, and this eccentricity exceeds the depth of focus of most inexpensive optical sensors. Further, besides being out-of-round, the encoder track surface at the dome of the 1-meter telescope at Lick Observatory exhibits considerable vertical warping.

An object of this invention is to overcome the problems presented by out-of-round domes and by vertical warping.

As mentioned earlier, conventional position encoders do not provide redundancy and are not self-diagnosing. This lack of redundant information within conventional position encoders may seem surprising considering the extent to which redundancy is routinely required in electronic systems which generate, store, or transmit information (such as data entry devices, computer memories, or data communications equipment). Such electronic devices routinely provide addition data bits in every data word for either parity or group code checking, and often protect larger blocks of data with checksums or cyclical redundancy check (CRC) codes.

Without such types of checks, subtle, intermittent data errors often go undetected. This can produce disastrous results, especially if the information being generated, stored, or transmitted involves a large financial transaction, a medical diagnosis, or a battlefield decision. Because of the potentially serious consequences of incorrect data going undetected, in most such devices, the complete absence of redundant information, (such as provided by check bits), would be considered totally unacceptable.

Yet conventional position encoders routinely lack any such safeguards, even though such encoders may generate the information on which extremely serious decisions are made.

One might argue that this lack of redundancy could be resolved simply by using two position encoders everywhere instead of one. However, such duplication is not only quite expensive, but it may not always be possible, due to physical constraints imposed by the object whose position is to be encoded. Further, even if one could afford the added expense and find locations at which to mount the additional encoders, this may not solve the problem. Since there are often small variations in accuracy between supposedly identical encoders (or in the mounts which couple them to the object whose position is to be measured), the instantaneous results provided by a pair of such encoders will often not be in exact agreement. This makes it difficult to distinguish subtle encoder malfunctions from normal inter-encoder variability.

Even if one could obtain two encoders (and mountings) which did produce identical results, should one encoder of the pair develop a transient error, it would still prove very difficult to determine which encoder was at fault, and which was providing the correct data. Additional encoders could be added, and some sort of majority voting system implemented to identify the faulty encoder, but such an approach would be extraordinarily expensive and complicated.

What is needed is a position encoder in which the redundancy is contained within the encoder itself, so that the encoder, by itself, can determine when it is malfunctioning and thus identify itself as the source of the problem.

An object of the invention is to provide such a position encoder employing internal redundancy between its incremental and absolute encoding positions.

Another object of this invention is to provide an encoder system having self-diagnosis capabilities, and a related object is to provide such a system with automatic detection of errors.

A further object is to provide such an encoding system in a form that may easily be retrofitted to conventional incremental encoder packages.

Other objects and advantages of the invention will appear from the following description.

SUMMARY OF THE INVENTION

The present invention provides both incremental and absolute position encoding. As related to telescope domes it uses the dome itself as a major component of the encoder. In the preferred form of the invention, the encoding is done optically. A band (or series of bands) of reflective material imprinted with a coded pattern of stripes is attached to an inner surface of the rotating portion of the dome. This pattern is made up of two separate tracks: a timing track, which is used in encoding incremental positions, and a data track, which is used to encode the absolute position. The timing track, adjacent to the data track makes the code on the data track self-clocking. Similar effects can be obtained by using electrically conductive bands and brush contacts.

As the dome rotates, these two tracks move past a read head attached either to a stationary part of the telescope housed inside the building or to a stationary part of the building itself. The read head contains three optical sensors that detect changes in reflectivity as the stripes move past the sensors. Two of the three optical sensors scan the timing track, and the horizontal spacing between them is adjusted so that the signals they produce are in quadrature. By comparing the phase relationship between the signals from these two sensors, the direction of dome motion is determined. The amount of motion is given by counting the number of signal transitions, as in most conventional incremental encoders.

As an alternative, the two tracks may be on the stationary member and the read head supported on the movable member.

Each sensor preferably pairs a light-emitting diode with a phototransistor. The light-emitting diode (LED) emits a small infrared beam that, in one form of the invention, is either reflected or absorbed by the light or dark marks on the coded band. The phototransistor measures the reflected light and generates an analog voltage proportional to the intensity of the reflected beam. In another form of the invention, the light is passed through transparent portions of the band or is barred by opaque portions. Thus, in general the optical encoder of this invention uses bands with light-blocking stripes or light-passing stripes.

The resulting analog signals may be used directly with some types of computers but generally are converted to digital TTL levels by a separate operational amplifier and a Schmitt trigger for each phototransistor output. These three TTL levels are fed to separate input lines on an input/output port of a microcomputer, which then computes the dome position from these inputs.

Although it is preferable (for economy and flexibility) to use a microcomputer to process the sensor-derived TTL levels, these functions can also be performed by using conventional digital logic circuits. To simplify the description of these functions, they are described in terms of digital logic circuits, although, preferably, these functions are actually performed by the microcomputer.

In this instance, the TTL levels generated from the two timing track sensors are fed into the computer at a portion programmed to function as a phase comparator; the phase comparator outputs a direction level signal and a clock pulse corresponding to each incremental tick of motion. The computer is so programmed that these outputs control an "up/down counter" function, which measures the incremental position. The computer is also programmed so that the direction level signal and clock pulse control four "shift register" functions that process the signals from the data track. The "up/down counter", "shift registers", and some other registers may be located in the microcomputer's RAM. The logic for the phase comparator and for the clocking and gating of the various registers is implemented in software.

The third optical sensor scans the data track, which contains a serial stream of data bits composing a chain code sequence. The chain code sequence is used to encode a series of distinct absolute-position tags. Each tag is encoded as a serial bit stream, and is composed of a fixed number of consecutive data bits from the chain code sequence. Each tag is decoded by the software into a corresponding absolute position. Preferably, the tags may be used as indices to access a look-up table of absolute positions, which is in the microcomputer's memory.

As stated before, the invention is applicable generally to both rotary and linear encoders. The light beam may be reflected, as described above, or the light source and detector may be on the opposite sides of the timing and data tracks, and the reflective portions are then replaced by transparent portions. There are still light-blocking portions (dark or opaque or non-reflective) and light-passing portions (transparent or reflective). The tracks, instead of being on a cylindrical surface, may be on a flat disk for a rotary encoder. For a linear encoder, they will be on a flat surface, whether reflective or transparent. Instead of a single timing track with the light sources and sensors spaced to be in quadrature, it may be better in some circumstances to use two timing tracks themselves spaced or coordinated with the light system to be in quadrature.

BRIEF DESCRIPTION OF THE DRAWINGS

FIG. 10 is a detailed diagram of the framing gating logic in the microcomputer of FIG. 9.

FIG. 19 is a diagrammatic view in elevation of the glass disk of FIG. 18 in combination with a light source and a sensor.

DESCRIPTION OF THE PREFERRED EMBODIMENT

Figure 1:
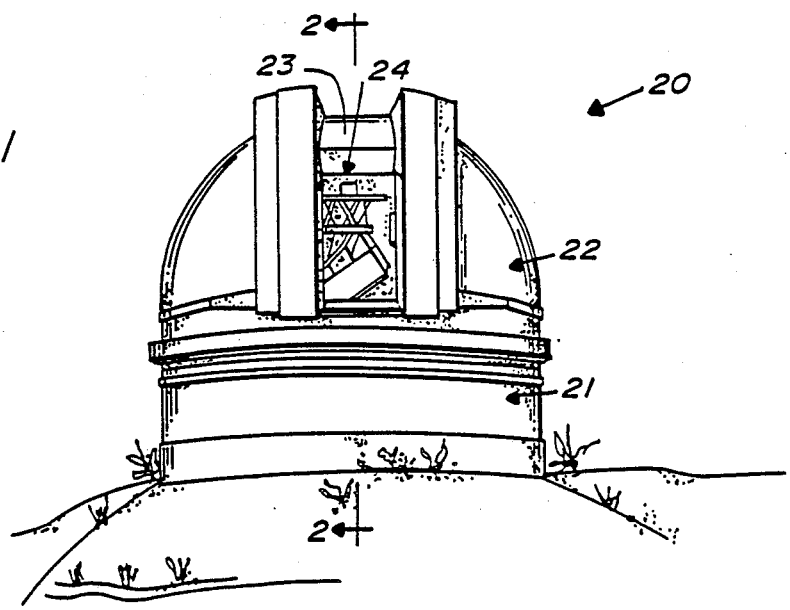
FIG. 1 is a view in elevation of the exterior of an observatory telescope dome building, showing the window or gap in the dome.
Figure 2:
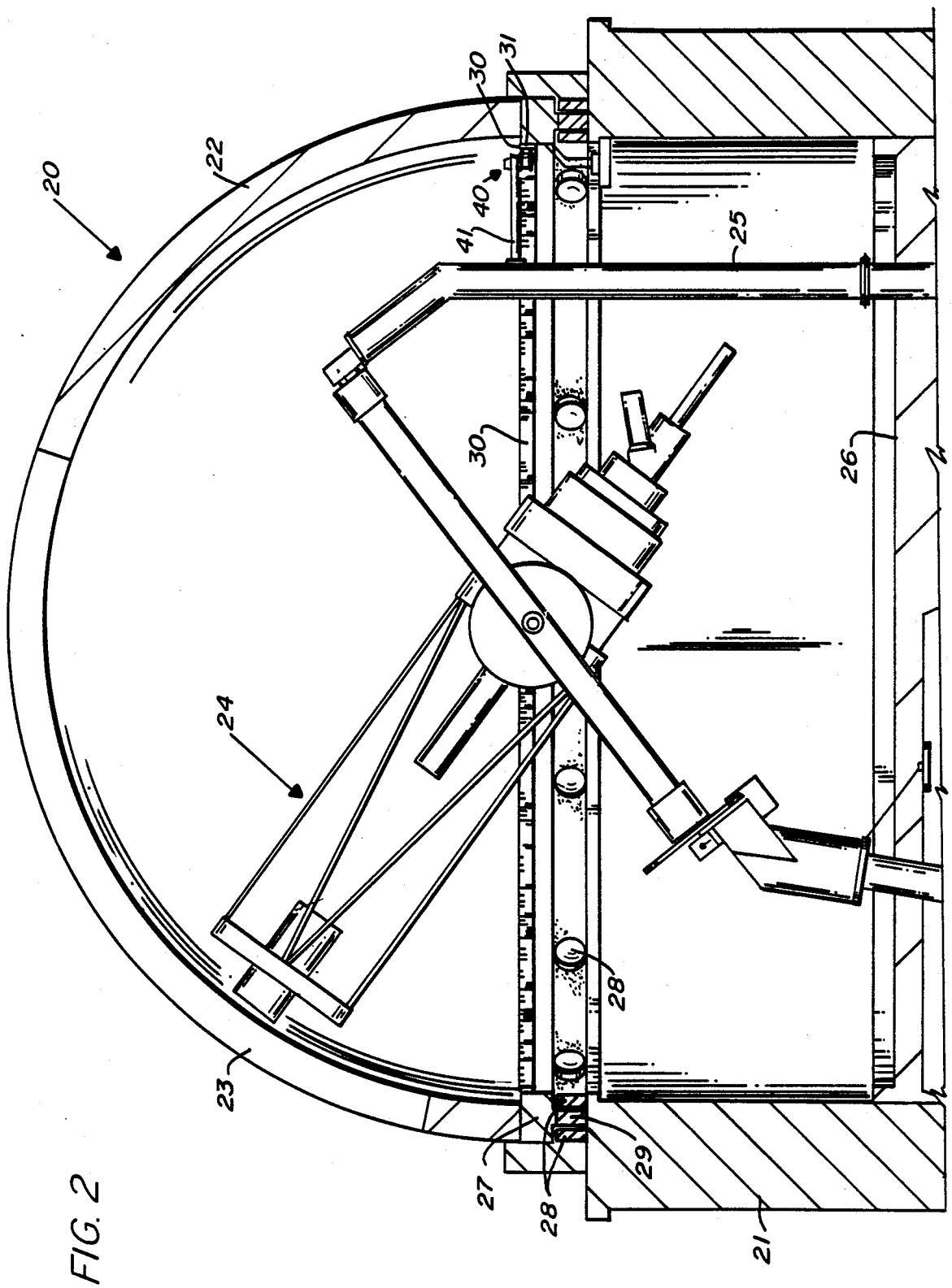
FIG. 2 is a view in elevation and in vertical section taken along the line 2—2 in FIG. 1.

The Dome 22 (FIGS. 1 and 2)

To exemplify the invention, FIG. 1 shows a telescope dome building 20 comprising a stationary cylindrical structure 21 with a rotatable dome 22 having a window, slit, or gap 23 with which a telescope 24 is aligned, the remainder of the dome 22 excluding unwanted stray light and affording shelter. Inside the building 20, as shown in FIG. 2, is the telescope 24 rotatably and pivotally mounted on an upright member 25 that is stationary and is affixed to a floor or foundation 26.

Inside the building 20 is the telescope 24, which moves independently of the rotatable dome. It is very important that they both can be properly aligned so that the telescope 24 can look through the dome slit 23. The basic purpose of the encoder of this invention is to know the absolute position of the slit or window 23 at all times, so that the independent motion of the dome 22 can be coordinated with that of the telescope 24. Since the dome 22 and the telescope 24 may move within different coordinate reference frames, coordinated motion usually requires that they be driven at different rates of speed.

As shown in FIG. 2, the dome 22 has a lower circular edge 27 mounted on rollers 28 that ride on a circular track 29 at the upper edge of the stationary cylindrical structure 21.

Figure 3:
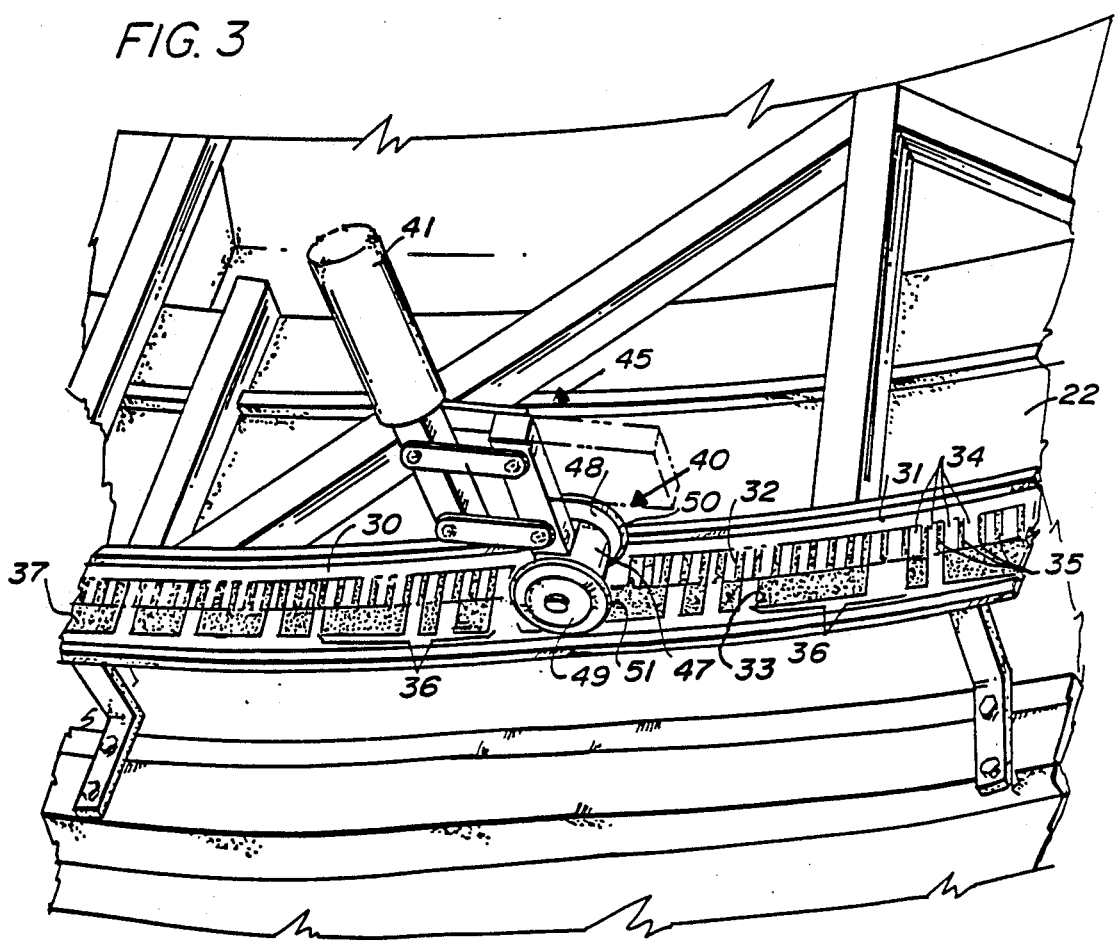
FIG. 3 is an enlarged fragmentary view in perspective of a portion of the dome building, showing portions of the data and timing tracks and a portion of the read head.

The Encoder Tracks 32 and 33 (FIG. 3)

As shown in FIGS. 2 and 3, the dome 22 itself is a major component of the encoder of this invention. A band 30 imprinted with a coded pattern of stripes is attached to a generally cylindrical inner surface portion 31 of the rotating dome 22. This pattern is made up of two separate tracks: a timing track 32, which is used for encoding incremental positions, and a data track 33, which is used to encode the absolute position.

The timing track 32 may be a continuous, dome-encircling series of identical light-reflecting rectangles 34 alternating with identical, non-reflecting dark rectangles 35, preferably identical in size to the rectangles 34. The rectangles 34 and 35 are narrow stripes that may be numbered adjacent to one edge of each dark stripe 35. They may be about 5 mm. wide and 25 mm high. The stripes 34 may be made of highly reflective metal foil.

The data track 33 is adjacent to the timing track 32. The light-reflecting rectangles 34 and non-reflecting dark rectangles 35 on the timing track 32 define a corresponding series of bit positions on the data track 33. The width of each bit on the data track 33 equals the spatial width of each incremental tick on the timing track, which is in turn determined by the operation of a phase comparator 71 shown in FIG. 9 and discussed in a later section of this description.

A reflective (or light-passing) data bit on the data track 33 is treated as a "one", while a non-reflective (or light-blocking) data bit is treated as a "zero". This convention of light-passing meaning "one" and light-blocking meaning "zero" is arbitrary, and can be reversed should that prove convenient.

The complete pattern of data bits on the entire data track 33 composes a chain code sequence 37. The number of data bits in this sequence is equal to the number of incremental ticks J per revolution of the encoder band 30. This number J is set by the configuration of the timing track 32 and phase comparator 71. The chain code sequence 37 enables the data on the data track 33 to be self-synchronizing.

The chain code sequence 37 is used to encode a series of distinct absolute-position tags 36. Each tag is composed of a fixed number T of consecutive data bits taken from the set of the J data bits of the chain code sequence 37. For example, in the implementation illustrated in the Appendix, the tags 36 are 8 bits long (i.e., T is 8), and the chain code sequence 37 is 120 bits in length (i.e., J is 120). Because of the properties of chain codes, each such tag 36 is distinct from every other tag 36 on the data track 33, and each such tag 36 has T−1 consecutive data bits in common with those tags 36 immediately adjacent to it on the data track 33.

Chain codes are described in a paper titled "Chain Codes and Their Electronic Applications", by Heath and Gribble in Vol. 108, Part C, 1961, of the Proceedings of the Institution of Electrical Engineers, and in U.S. Pat. No. 4,628,928 (Hafle et al). Heath and Gribble point out that since any given bit of a chain code sequence is a logical function of a fixed number of the immediately preceding bits in the sequence, that given bit can be used (similar to a parity bit) to detect errors in the preceding bits from which it is derived. Similarly, since a given group of bits is functionally related to different sets of immediately preceding bits in the sequence, that given group can be used (similar to a group code) to detect and correct errors in the preceding bits from which it is derived.

Thus, the properties of chain codes allow one or more check bits 38 to be associated with each absolute position tag 36. The check bit (or bits) 38 for any tag 36 is obtained simply by taking the next bit (or bits) in the chain code sequence 37 that follow immediately after the bits of the given tag 36. The check bit (or bits) 38 can be used similar to a parity bit (or group code bits) to allow error detection (and possibly error correction) on the absolute position tag 36. The number of bits C allocated for check bits 38 depends on the level of error detection and correction that is desired. In the implementation that is illustrated in the Appendix, only a single bit (i.e., C=1) is used for the check bits(s) 38, thus allowing detection of single-bit errors in the tags 36.

The absolute position tags 36 are not a direct binary encoding of absolute position of the encoder band 30, but are instead codes which are translated or decoded into corresponding absolute positions. This may be accomplished in a number of ways, but preferably the tags 36 may be used as indices to access a look-up table (or equivalent computer memory) of absolute positions.

The band 30 may be comprised of clear mylar strips upon which the patterns for the timing track 32 and data track 33 are printed, as by a device such as a laser printer, and to which a layer of aluminized mylar tape is applied, against the printed side of the strips, using a clear adhesive. The taped side of the band 30 may be secured to the surface 31 by a suitable adhesive. The printed patterns, which may consist of laser printer toner particles, of the two tracks 32 and 33 are then visible through the clear, non-printed side of the mylar strips and are physically protected since they are sandwiched between these strips and the aluminized mylar tape, which provides a reflective underlayer.

In this case, the light-reflecting rectangles 34 and the "one" bits within each tag 36, appear as reflective areas of aluminized mylar tape viewed through the clear mylar strip. The non-reflecting rectangles 35 and the "zero" bits within each tag 36 appear as non-reflecting areas of opaque laser printer toner particles (which hide the reflective aluminized mylar tape underlayer) viewed through the clear mylar strip.

The Read Head 40 (FIGS. 3-6)

Figure 4:
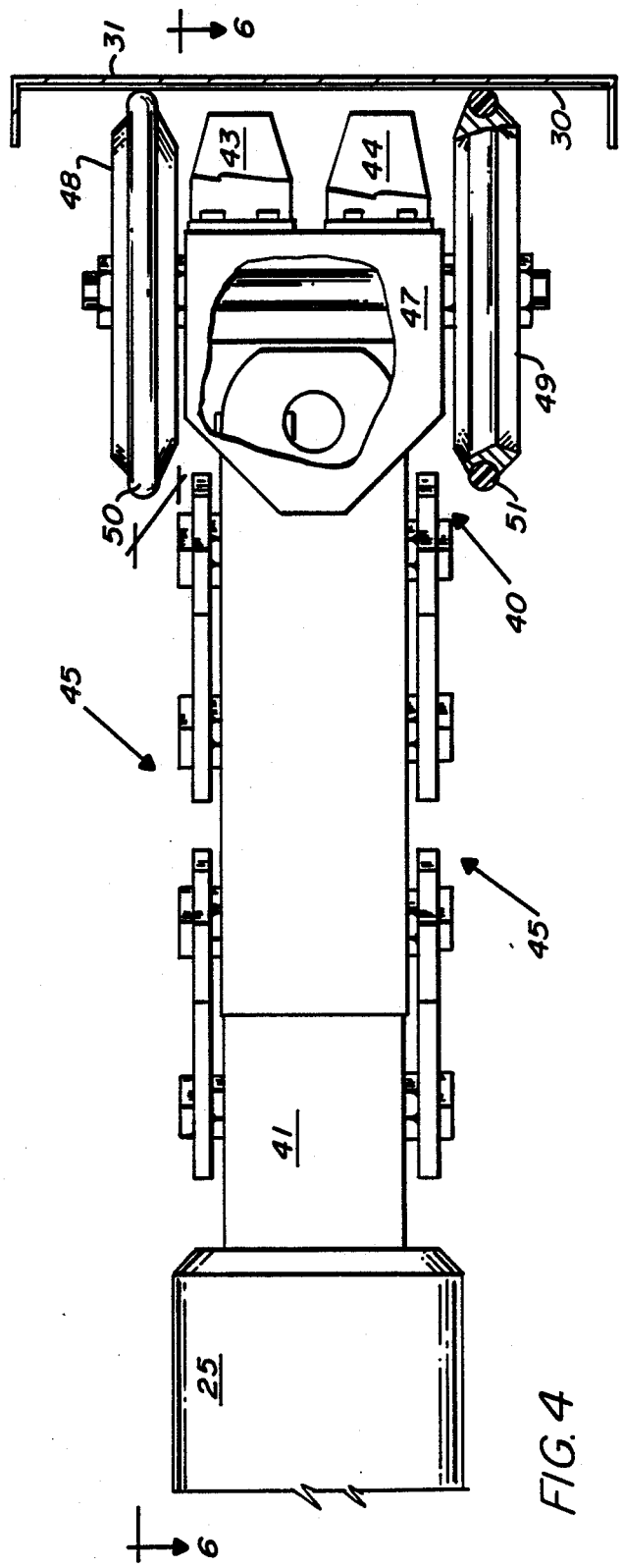
FIG. 4 is a view in side elevation, partly in section, of the read head and its mounting and a portion of the timing and data tracks.
Figure 5:
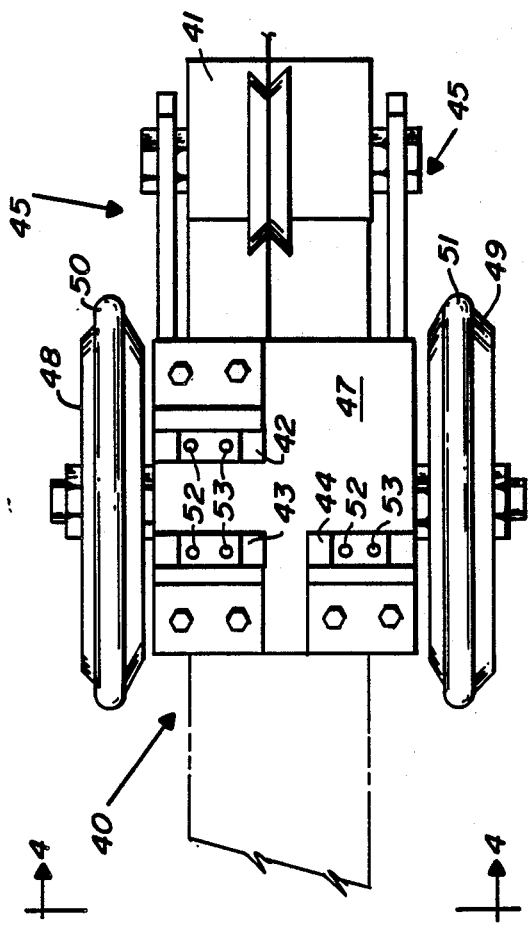
FIG. 5 is a view in front elevation of the read head and its mounting.
Figure 6:
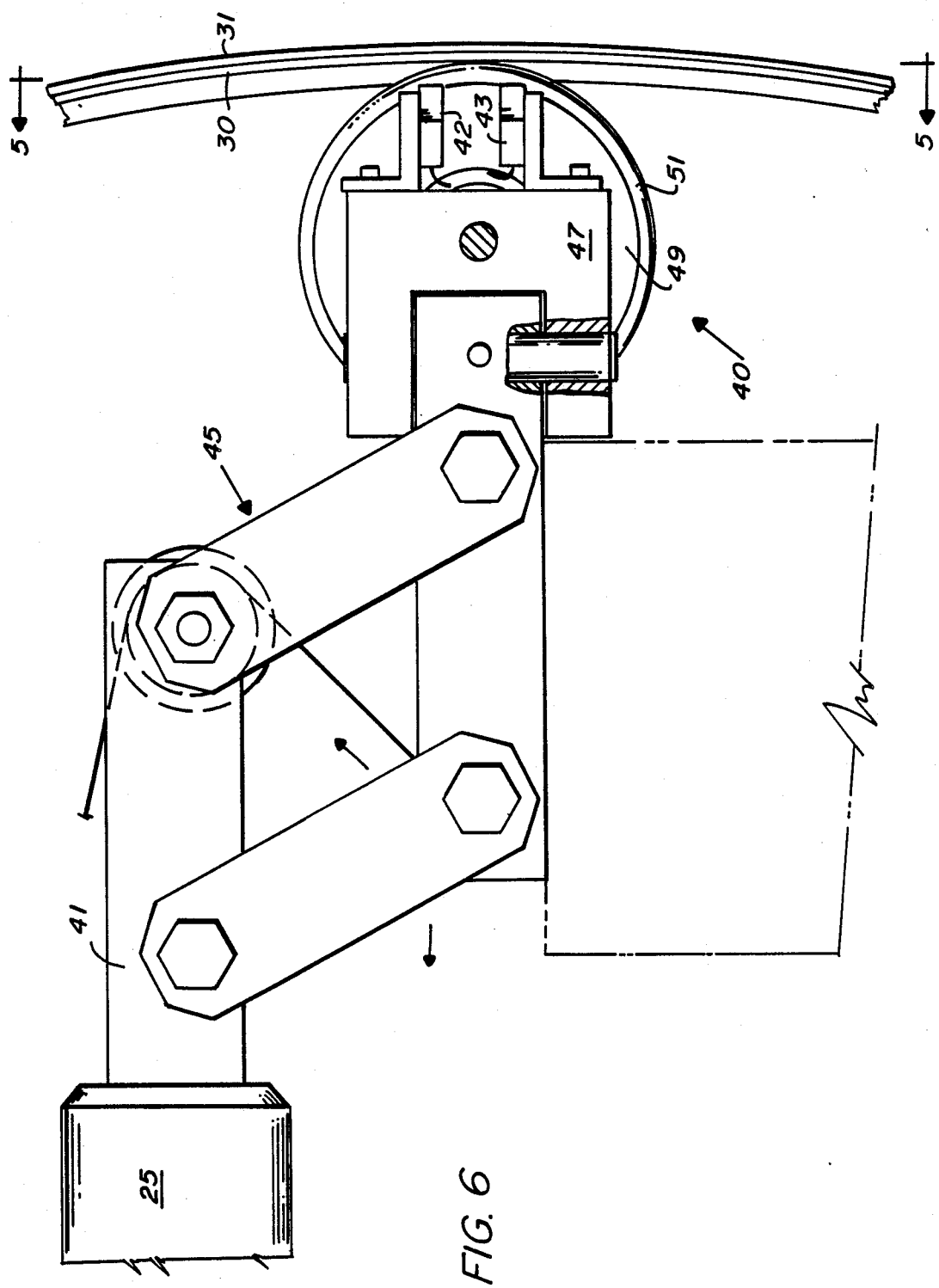
FIG. 6 is a top plan view of the read head and its mounting and a portion of the timing and data tracks.

As the dome 22 rotates, these two tracks 32 and 33 move past a read head 40 at one end of a stationary column 41 mounted either on the stationary telescope support 25 see FIGS. 4 and 6) or (as shown in FIGS. 11 to 16) on a stationary part of the dome 107. The read head 40 contains three optical sensors 42, 43, and 44 (FIG. 5) that detect changes in reflectivity as the stripes 34 and 35 and tags 36 move past the sensors. If desired, the read head 40 may be mounted on the rotatable dome 22, and the tracks 32 and 33 may be supported by a stationary portion of the building 20.

Theoretically, the read head 40 could be mounted rigidly on the column 41, and if the dome 22 is perfectly round it may be. In fact, the read head 40 can be mounted rigidly with respect to radial motion so long as the out-of-roundness of the dome surface 31 is significantly less than the depth of focus of the optical sensors 42, 43, and 44 that are used. For example, if sensors 42, 43, and 44 with a depth of focus of 0.75 inch were to be used (these are available but at much greater expense than the sensors currently recommended) then the dome's cylindrical surface 31 could be out-of-round by as much as 0.5 inch, (i.e., ±0.25 inch).

However, affordable off-the-shelf sensors do not have sufficient depth of focus (i.e., greater than 1 inch) to enable the use of badly out-of-round domes. Also, while a rigid mount would simplify installation, it might prove less forgiving of earthquakes, which are quite common at some observatories. Unfortunately, many domes 22 are out-of-round. For example, each of the domes at both the 1-meter and 3-meter Lick Observatory telescopes is out-of-round by more than one inch, and this eccentricity exceeds the depth of focus of the optical sensors 42, 43, and 44. As a result, the read head 40 is mounted to move radially, so as to keep the optical sensors 42, 43, and 44 focused on the encoder timing and data tracks 32 and 33.

This is accomplished by a spring-loaded parallelogram linkage 45 between the read head 40 and the column 41. This linkage 45 introduces a small (less than ⅛ incremental tick of motion) uncertainty in the azimuthal position of the read head 40. This, however, is tolerable. A piston (keyed to prevent rotation of the concentric cylinders) may be used instead, but would require more complicated machining.

The proper spacing of the parallelogram linkage 45 relative to the encoder track surface 31 may be provided by two wheels 48 and 49 which are preferably connected to a block 47 in the middle of the parallelogram linkage 45 and which roll along the encoder track surface 31. Neoprene O-rings may be used as tires 50 and 51 on these wheels 48 and 49 because of neoprene's exceptional resistance to ozone. (At altitudes above 4,000 feet, the ozone concentration is sufficient to degrade normal buna-N O-rings.) The traction provided by these tires 50 and 51 is unimportant, for even if they slip, the functioning of the encoder is not affected.

Besides being out-of-round, the encoder track surface 31 at the dome 22 of the 1-meter telescope at Lick Observatory exhibits considerable vertical warping. To correct for such a problem, the optical sensors 42, 43, and 44 are preferably mounted on the block 47 in the center of the parallelogram linkage 45, and the block 47 pivots vertically. The two wheels 48 and 49 which roll along the encoder track surface 31 are preferably connected to this block 47. The wheels 48 and 49 and the tires 50 and 51, which provide for the proper spacing of the parallelogram linkage 45, also provide for the proper alignment of the vertically pivoting block 47. Were the encoder track surface 31 not warped, the block 47 would not need to pivot.

The wheels 48 and 49, their tires 50 and 51, the pivoting block 47, and the parallelogram linkage 45 are the only moving parts in the read head assembly 40, and none of these require machining to any precise tolerance. Even if the more traditional approach of coupling a rotary encoder to the dome were used, a similar assembly would be required to keep the mechanical pick-off for that encoder in contact with an out-of-round or vertically warped dome. Thus, the cost of this assembly should not be viewed as an *added* cost of using the encoder of this invention.

Figure 7:
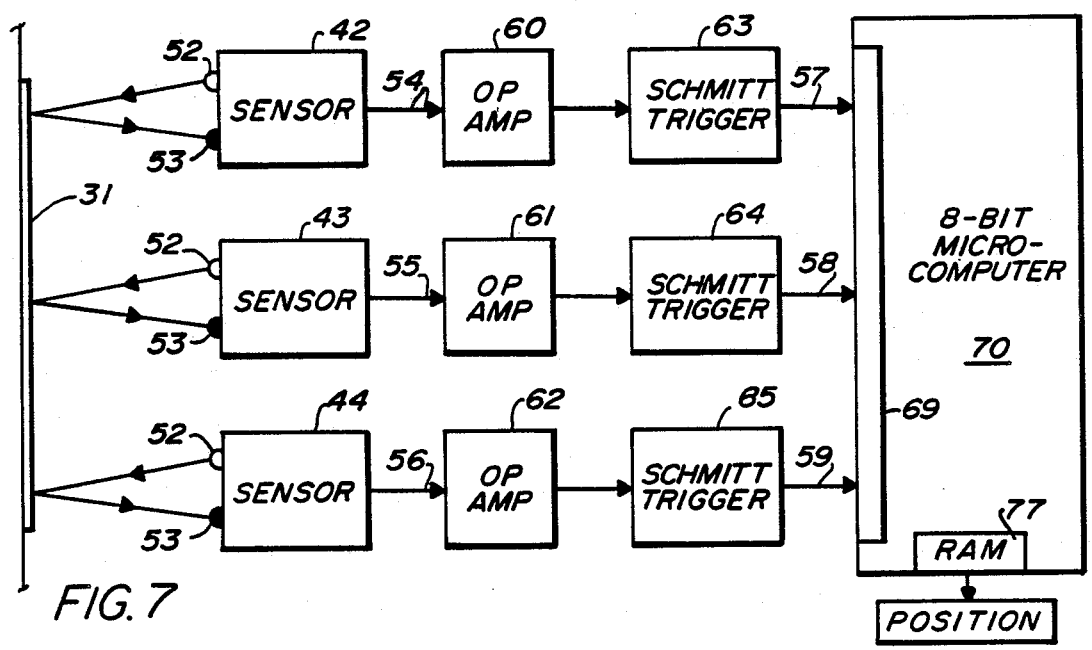
FIG. 7 is a block diagram of the encoder system.
Figure 8:
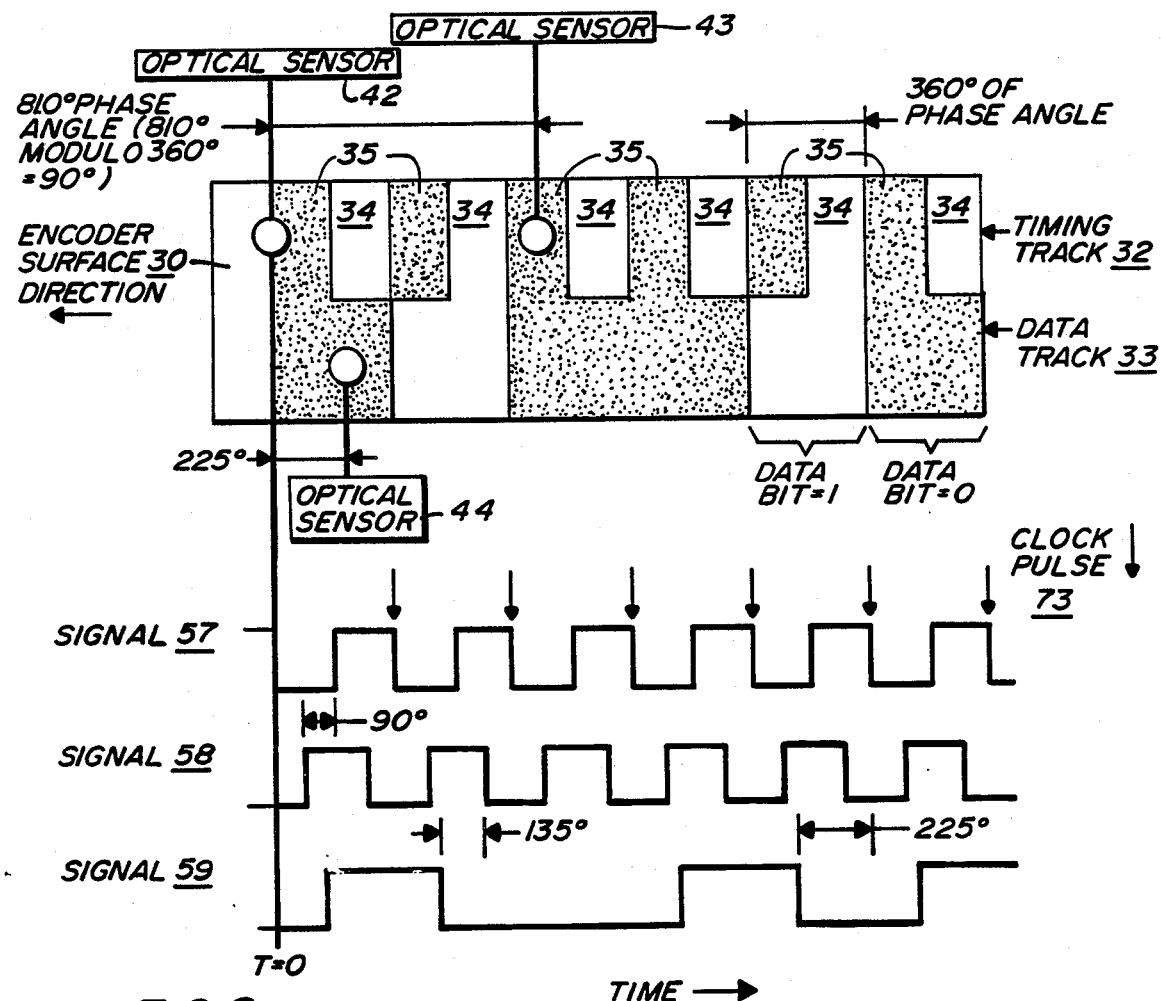
FIG. 8 is a diagrammatic view of a portion of the timing and data tracks showing how quadrature of the timing track may be achieved by the sensors and its relation to the data track and its sensor.

The Optical Sensors 42, 43, and 44 and their Generated Analog Voltages (FIGS. 7 and 8)

The three optical sensors 42, 43, and 44 of the encoder read head 40 are used to scan the timing and data tracks 32 and 33. The sensors 42 and 43 are accurately spaced to develop their signals in quadrature although they respond to a single timing track 32. Each sensor 42, 43, and 44 pairs a light-emitting diode 52 (as a light source) with a phototransistor 53. The light-emitting diodes 52 for the sensors 42 and 43 may each emit a narrow, low-intensity infrared beam that is either reflected by a light reflecting stripe 34 or absorbed by a non-reflecting stripe 35 on the timing track 32 of the coded band 30, and reflection or nonreflection is sensed by its phototransistor 53. Similarly, the light-emitting diode 52 of the sensor 44 sends a beam to the data track 33 and its sensor 53 detects whether that beam is reflected or absorbed.

Two optical sensors 42 and 43 scan the timing track 32, and the signals they produce are in quadrature, as shown in FIG. 8. By comparing the phase relationship between the signals from these two sensors 42 and 43, the direction of dome motion is determined. The amount of motion is given by counting the number of signal transitions.

Each phototransistor 53 measures the reflected light and generates an analog voltage proportional to the intensity of the reflected beam. Thus, the sensor 42 generates an analog voltage 54: the sensor 43 generates an analog voltage 55, and the sensor 44 generates an analog voltage 56.

Conversion of the Analog Voltages (FIG. 7)

As shown by FIG. 7 the resulting three analog signals 54, 55 and 56 are converted to three digital TTL levels 57, 58 and 59, respectively, by a separate operational amplifier 60, 61, or 62 and a Schmitt trigger 63, 64, and 65 for each phototransistor output. These three TTL levels 57, 58, and 59 may be fed to separate input lines of an input/output port 69 of an 8-bit microcomputer 70, which then computes the dome position from these inputs. As shown in FIG. 8, the signals 57 and 58 are in quadrature.

Figure 9:
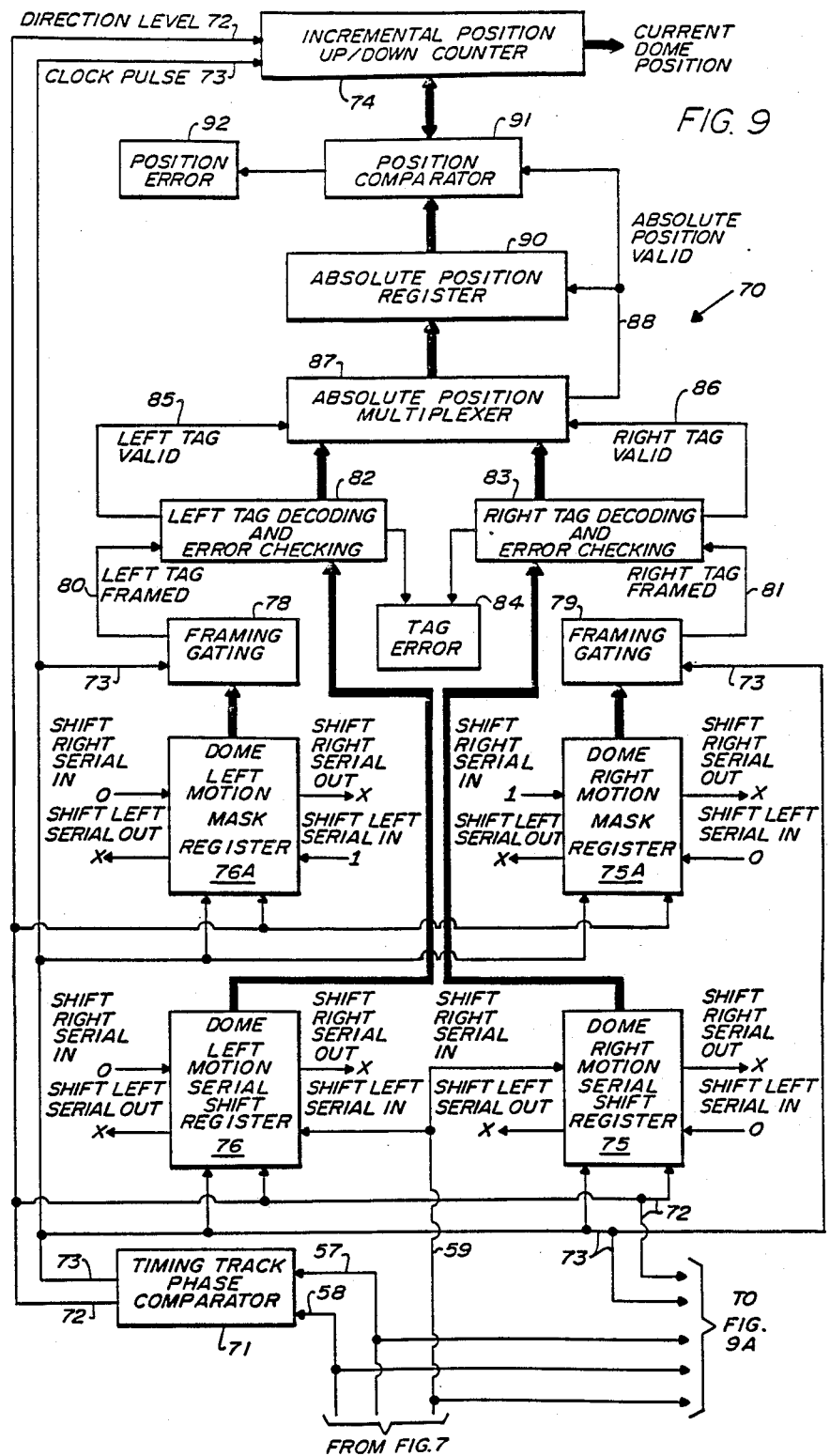
FIG. 9 is a block diagram of the functional operation of the microcomputer of FIG. 7.

The Microcomputer 70 (FIGS. 9 and 10)

The microcomputer 70 is programmed to give a series of functions and the following discussion treats these functions as though they were separate "circuits". In fact, all the "circuits" now to be described are simulated by the computer program executed by the microcomputer 70. Because the instructons of this computer program execute sequentially rather than concurrently, certain simplifying assumptions are possible in terms of the operation of the simulated "circuits" to be described. In particular, timing details such as circuit propagation delays and potential race conditions have been ignored (for the sake of simplifying the description) since the various "circuit" simulations execute at different stages of the computer program, and are thus immune to such timing problems.

However, were the functions to be described implemented using real circuits, as opposed to simulated circuits, such timing issues would need to be addressed. In some cases, delay circuitry may need to be added between various functions to eliminate race conditions. For example, a clock pulse signal which feeds many different circuits which in turn feed each other may in fact require various levels of delay prior to feeding some of these circuits. In other cases, race conditions may be resolved by clocking some circuits on the rising edge of the given clock pulse signal, and other circuits on the falling edge. One skilled in the art of digital logic design can make timing adjustments as may be needed.

As shown in FIG. 9, the TTL levels 57 and 58 generated from the two sensors 42 and 43 are fed to a portion of the microcomputer 70 programmed to act as a phase comparator 71; the phase comparator 71 outputs a direction level signal 72 and a clock pulse 73 corresponding to each incremental tick of motion.

A 1X phase comparator 71 that produces the clock pulses shown in FIG. 8 operates as follows:

Any positive-going transitions of the signal 57 that occur when the signal 58 is in the low state cause the direction level signal 72 to be set to the high state and a clock pulse 73 to be generated. Any negative-going transitions of signal 57 that occur when the signal 58 is in the low state cause the direction level signal 72 to be set to the low state and a clock pulse 73 to be generated. Transitions of the signal 57 that occur when the signal 58 is in the high state are ignored.

2X and 4X phase comparators operate in a similar fashion, but are more complicated since they use a greater number of the possible combinations of transitions of the two signals 57 and 58.

The phase comparator 71 can be programmed to respond either to all possible combinations of transitions of the signals 57 and 58, or to only some subset of these combinations. If programmed to respond to all combinations, the phase comparator 71 outputs the direction level signal 72 and clock pulse 73 at four times (4X) the spatial frequency of the stripe-pairs (34 and 35) on the timing track 32. If programmed to respond only to some combinations, it can generate these outputs at either once (1X) or twice (2X) the spatial frequency of the stripe-pairs.

The spatial width of the incremental tick generated by the encoder is a function of the frequency at which the phase comparator 71 is operated. When the phase comparator is operated at four times (4X) the spatial frequency of the stripe-pairs, the spatial width of each incremental tick corresponds to one half the width of a single stripe (34 or 35) on the timing track 32. When operated at 2X, the spatial width of each tick equals the width of a single stripe (34 or 35). When operated at 1X, the tick width equals the width of a stripe-pair (34 and 35).

The choice of operating frequency (1X, 2X, or 4X) for the phase comparator 71 involves trade-offs between resolution and robustness, with 1X giving the greatest robustness (i.e., immunity to skewing or quadrature misadjustments) and 4X giving the greatest resolution. However, the choice of operating frequency does not change the logic of any of the other portions of the encoder. For the purposes of simplifying the remaining discussion and figures, the operating frequency of the phase comparator 71 will be taken as 1X, and thus the spatial width of an incremental tick will equal the width of a stripe-pair (light-blocking stripe 35 plus light-passing stripe 34) on the timing track 32.

The computer is programmed so that the direction level signal 72 and clock pulse 73, (which are generated by the phase comparator 71 for each incremental tick of motion), control an "up/down counter" function 74, which measures the incremental position. The computer is also programmed so that the direction level signal 72 and clock pulse 73 control two "shift register" functions 75 and 76 that process the signal 59 from the data track 33, plus two other identically-sized "shift register" functions 75A and 76A, which are used to keep track of the alignment of valid data within the first two "shift register" functions 75 and 76. The up/down counter 74, shift registers 75, 75A, 76, and 76A, and some other registers are located in the RAM of the microcomputer 70. The logic for the phase comparator 71 and for the clocking and gating of the various registers is implemented in appropriate software.

The "shift register" functions 75, 75A, 76 and 76A are all identically-sized multi-bit bi-directional serial shift registers. (A suitable integrated circuit that may be used to construct these shift registers is the Am74LS299 8-bit Universal Shift/Storage Register manufactured by Advanced Micro Devices of Sunnyvale, Calif.) For example, these registers 75, 75A, 76, and 76A may be 16 bits wide. The number of bits may be larger or smaller depending upon the number of bits T used to encode the absolute position tags 36 (which depends on the number of such tags, and hence, the resolution of the encoder) and the number of bits C used for the check bits 38 associated with each tag 36. The total number of bits M required to store both a tag 36 and its corresponding check bits 38 is simply the sum T plus C. Thus, the size in bits N of each of the shift register functions 75, 75A, 76, and 76A must be at least M (i.e., T plus C) bits. Since shift registers are often manufactured in sizes that are multiples of 4 or 8 bits, the number of bits N may exceed M, in which case the excess bits need not be used.

In such cases where the number of bits N exceeds M, one might think that the excess N-minus-M bits in each shift register would prove useful. In fact, the excess N-minus-M bits in the shift register functions 75A and 76A introduce an extra layer of complexity into nearly all of the various implementations to be discussed. Thus, in cases where the width in bits N of the shift register functions 75A and 76A can be matched to the value M, considerable savings may be realized in the amount of logic needed to implement the overall system. In some cases, these savings may help to justify increasing the number of bits C allocated for check bits 38. In the implementation shown in the Appendix, the value of N is not matched to M, since the value of T is 8, C is 1, M is 9, and N is 16; thus, that implementation shows all the logic required for the general case where N does not equal M. When various alternative implementations are discussed in later sections of this specification, if simplifications to the logic are possible in the special case where N equal M, these simplifications will be noted.

Alternatively, it may be possible to adjust the effective width of some types of shift registers to be less than their maximum width; in such cases, the effective width N may be tailored to match the desired width M. While such implementations may increase the complexity of the connections to the shift register, this increased complexity is offset by the various simplifications to the remaining logic that result from matching the effective shift register size N to the desired value M. The effective size of a shift register may be reduced on those types of shift registers which have both serial and parallel input and output capabilities.

For example, such shift register devices may be connected so that each parallel output is fed back to the corresponding next "lower" (i.e., where lower" is to the right) parallel input. When such a shift register is connected in this fashion, a parallel load operation will result in an effective shift right operation. To shift data into the shift register from the left (i.e., a shift left operation), a mode control input (or set of inputs) on the shift register is set so that the shift register is placed into a "serial input" mode. The data to be shifted in is then presented to the serial input, the shift direction level (if any) is set to indicate shifting to the left, and a shift clock pulse applied. To shift data into the shift register from the right (i.e., a shift right operation), the mode control input (or set of inputs) is set so that the shift register is placed into a "parallel input" mode. The data to be shifted in is then presented to the leftmost bit position (i.e., that bit position located zero bit-positions from the left edge of the register) of the parallel input, and a parallel load pulse or clock pulse applied.

To reduce the effective size of such a shift register by K bits, the shift right input is instead connected to the parallel input bit position located K bit-positions from the left edge of the register (rather than to the leftmost bit position), and any previous connection to that bit position (i.e., that bit position located K bit-positions from the left edge) is removed.

The operation of the up/down counter function 74, and shift register functions 75, 75A, 76, and 76A is as follows:

When the direction level signal 72 is in the high state, the clock pulse signal 73 causes the counter function 74 to be incremented, and the "shift register" functions 75, 75A, 76, and 76A to be shifted right. When the direction level signal 72 is in the low state, the clock pulse signal 73 causes the counter function 74 to be decremented, and the "shift register" functions 75, 75A, 76, and 76A to be shifted left.

The up/down counter function 74 is constrained to count modulo the number of incremental ticks J per revolution of the encoder band 30 (e.g., modulo 120). This may be accomplished by using comparator functions to check the parallel counter output of the up/down counter function 74 to see whether the up/down counter function 74 has counted up to the value J, or down to the value minus one. In the first case, the counter function 74 must be reset from the value J to the value zero (which may be accomplished by subtracting the value J from the value in the counter function 74), while in the second case, the counter function 74 must be reset from the value minus one to the value J minus one (which may be accomplished by adding the value J to the value in the counter function 74). Either case may be used to trigger generation of a once-per-revolution "index" pulse, since either case occurs when the encoder band 30 has just rotated through incremental position zero. The logic required to test for these two cases and generate the "index" pulse is illustrated in the Appendix to this specification. In the special case where the counter function 74 already counts modulo J (e.g., if J were 256 and counter function 74 were an 8-bit-wide binary up/down counter), then if the counter function 74 provides "overflow/underflow" (or "carry/borrow") signals, these may be used to generate the "index" pulse, and the comparators used to test whether counter function 74 counted up to J or down to minus one would not be needed. Alternatively, the index pulse may be generated when the absolute position reaches zero.

When the dome 22 rotates, the direction level signal 72 and the clock pulse 73 that the phase comparator 71 derives from the timing track 32 are used to shift the bits obtained from the data track 33 into one of the two N-bit (e.g., 16-bit) bi-directional serial shift registers 75 and 76. (See FIGS. 9 and 10.) Conceptually, these two registers 75 and 76 can be imagined as existing side-by-side and, when using 16-bit shift registers they form a 32-bit-wide window through which the microcomputer 70 "views" the data track 33. (For N-bit shift registers, the window is 2 N bits wide.) After proper initialization, a minimum of N consecutive bits (e.g., 16) in this window always corresponds to an identical sequence of N bits (e.g., 16) on the section of the encoder data track 33 that is currently positioned in front of and immediately adjacent to the read head 40. The bits in the window are always aligned such that the bit nearest the "center" of the window (i.e., the "center" being the boundary between shift registers 76 and 75) corresponds to the data bit that has just passed under the optical sensor 44 for the data track 33.

The direction of dome rotation determines in which direction the registers 75, 75A, 76, and 76A are shifted, and the distance moved determines the number of shifts that occur. For each incremental tick of motion, the registers 75, 75A, 76, and 76A are shifted by one bit. The registers 75, 75A, 76, and 76A can be shifted in either direction, but all registers 75, 75A, 76, and 76A perform the identical shift sequence. The registers 75 and 76 are not connected in cascade; so the contents of one register 75 will never shift into the other register 76 and vice versa. In fact, none of the four serial shift outputs is connected to anything; so the bits which shift out of the registers 75 and 76 are shifted into oblivion. The two registers 75 and 76 share a common serial input, namely, the signal 59 from the optical sensor 44 that scans the data track 33.

The shift registers 75A and 76A mirror the configuration of the shift registers 75 and 76. The two registers 75A and 76A are both N-bit-wide bi-directional serial shift registers. They are not connected in cascade; so the contents of one register 75A will never shift into the other register 76A, and vice versa. In fact, none of the four serial shift outputs is connected to anything; so the bits which shift out of the registers 75A and 76A are shifted into oblivion. The two registers 75A and 76A share a common serial input, namely, a line which is permanently tied to the high (i.e., one) state.

A one bit in a given bit position in the register 75A means that the corresponding bit position of the register 75 contains data, while a zero bit means the corresponding bit position in the register 75 may be considered as empty. Similarly, the bit positions in the register 76A indicate whether the corresponding bit positions in the register 76 contain data, or may be considered as empty. Because the contents of the registers 75A and 76A form masks which identify the "empty" and "non-empty" bits of the corresponding registers 75 and 76, the registers 75A and 76A are referred to as "mask" registers.

The actual operation of these registers 75, 75A, 76, and 76A proceeds as follows. On power up, the registers 75, 75A, 76, and 76A are set to zero. The dome 22 must be moved a small amount (at least M incremental ticks, e.g., 9 incremental ticks) in either direction to initialize either the registers 75 and 75A or the registers 76 and 76A. When the dome 22 rotates to the right by one incremental tick, registers 75, 75A, 76, and 76A are shifted right one bit (See FIG. 9). The bit from the data track 33 is shifted into the shift right serial input of the "dome right motion shift register 75", while a one bit is shifted into the shift right serial input of the "dome right motion mask register 75A". At the same time, a zero bit is shifted into the shift right serial inputs of both the "dome left motion shift register 76" dome 22 moves to the left, the converse is true.

After the dome 22 (and hence the encoder band 30) has moved M (e.g., 9) consecutive incremental ticks of motion to the right, the "dome right motion mask register 75A" will contain ones in its leftmost-M bit positions. These bit positions feed the "right framing gating function 79", which may be an M-bit-wide AND gate. The all-ones input to this AND gate causes the framing gating function 79 to generate a "right tag framed" strobe 81, indicating that the leftmost-M bit positions of the "dome right motion serial shift register 75" now contain the M most recently read data bits from the data track 33 on the encoder band 30.

Similarly, when the encoder band 30 has moved M (e.g., 9) consecutive incremental ticks of motion to the left, the "dome left motion mask register 76A" will contain ones in its rightmost-M bit positions. These bit positions feed the "left framing gating function 78" which may also be an M-bit wide AND gate. The all-ones input to this AND gate causes the framing gating function 78 to generate a "left tag framed" strobe 80, indicating that the rightmost-M bit positions of the "dome left motion serial shift register 76" now contain the M most recently read data bits from the data track 33 on the encoder band 30.

Alternatively, the M-bit-wide AND gate functions used to implement the framing gating functions 79 and 78 may be replaced by the output of the Mth bit from the "center" edge (i.e., the "center" being the boundary between mask register functions 76A and 75A) of the corresponding mask register functions 75A and 76A. For example, in the right mask register function 75A, one bits shift in from the left edge (i.e., "center" edge) of the register, while zero bits shift in from the right edge. As a result, the only way in which the Mth bit position from the left edge of this register can contain a one bit is for all of the other M-minus-one bit positions to its left to contain one bits as well. Thus, testing whether that Mth bit position (from the left edge) contains a one bit is equivalent to testng whether all of the leftmost-M bit positions contain one bits; this latter test is precisely the condition being tested by the M-bit-wide AND gate function used to implement the right framing gating function 79. As a result, the M-bit-wide AND gate function may be eliminated, and the output of the Mth bit position from the left edge of the right mask register function 75A used as the "right tag framed" strobe 81. Similarly, the output of the Mth bit position from the right edge (i.e., "center" edge) of the left mask register function 76A may be used as the "left tag framed" strobe 80.

The tag framed strobes 80 and 81 signal a tag decoder 82 or 83 (which may be implemented as a look-up table) to attempt decoding (i.e., look-up) of the M-bit data pattern presented by the corresponding shift register 76 or 75. In the absence of a malfunction, the M-bit data pattern obtained from the register 76 or 75 should correspond to the bit pattern formed by combining one of the T-bit absolute position tags 36 embedded within the chain code sequence 37 with the C bits of that tag's corresponding check bits pattern 38.

The tag decoder 82 or 83 checks the M-bit data pattern from the register 76 or 75 for validity in two ways. First, it checks that the leading T bits of the M-bit pattern from the register 76 or 75 match one of the T-bit absolute position tags 36 embedded within the chain code sequence 37. Second, it checks that the remaining C check bits 38 of the M-bit pattern are in the correct state for the given absolute position tag 36. The tag decoder 82 or 83 may also check the absolute position tag 36 for adjacency, that is, whether or not the given tag is located physically adjacent to the last tag 36 decoded.

If the tag 36 fails either test, an error signal 84 is generated, and the tag 36 is ignored. If the tag 36 is valid, it is decoded by the tag decoder 82 or 83 into an absolute position. The tag decoder 82 or 83 also generates a "tag valid" strobe 85 or 86, which causes the decoded absolute position to be passed through an absolute position multiplexer 87 to an absolute position register 90. The multiplexer 87 generates an "absolute position valid" strobe 88, which causes the decoded absolute position that it is passing to be latched into the absolute position register 90 (FIG. 9) and which also signals a position comparator 91 to compare the absolute position in the register 90 to the incremental position in the incremental position up/down counter 74. If they do not match, an error signal 92 is generated, and the incremental position is reset to the absolute position.

A given tag 36 will decode to one of two different absolute positions, depending on whether it is framed in the "dome right motion" shift register 75 or the "dome left motion" shift register 76. The positions correspond, respectively, to the tag 36 being positioned either just to the right or just to the left of the read head 40. The difference between these two positions (taken modulo the incremental size J of the encoder) will be a fixed offset, namely M (e.g., 9) incremental ticks.

Impaired Redundancy During Periods of Direction Reversal

After the dome 22 has rotated at least N (e.g., 16) incremental ticks to the right, the dome right motion mask register 75A will be filled with ones, and the left motion mask register 76A will contain only zeroes. This indicates that all N (e.g., 16) bits of the dome right motion shift register 75 are filled with the N most recently read data bits from the data track 33, and that the N h(e.g., 16) bits of the dome left motion shift register 76 are all empty. Conversely, after the dome 22 has rotated a corresponding amount to the left, the "left side" registers 76 and 76A become "filled", and the "right side" registers 75 and 75A become "emptied".

Immediately after the dome 22 has reversed its direction of rotation, and before it has rotated at least N (e.g., 16) incremental ticks in the new direction, the registers 75, 75A, 76, and 76A will not be in either of the two above described states; neither the "left side" registers (76 and 76A) nor the "right side" registers (75 and 75A) will be "filled" or "empty". Rather, both sides will be partially "filled" (or partially "empty", depending on your outlook). At such times, there may be an insufficient number of one bits in the proper bit positions of either mask register 76A or 75A to trigger the corresponding framing gating functions 78 or 79, and the tag decoding and error checking functions 82 and 83. Thus, during such times, the absolute and incremental positions are not cross-checked, since no new absolute positions are generated by the tag decoders 82 or 83. In addition, during such times, while the data bits read from the data track 33 are being stored into the appropriate shift register 75 or 76, they are not being checked for validity; any redundancy these bits might provide will not be available until the register (75 or 76) into which they are stored becomes sufficiently filled to trigger its corresponding framing gating function (79 or 78).

This lack of redundancy or cross-checking during the period of direction reversal is not a serious problem, for a number of reasons. First, the problem is quickly resolved once the mask and shift registers on the side corresponding to the new direction of motion become sufficiently filled. Second, the data bits that are not being checked during the reversal had just been checked immediately beforehand when they were read while the dome 22 was moving in the previous direction. Third, the portion of the timing track 32 being traversed during the reversal had also just been checked immediately beforehand while the dome 22 was moving in the previous direction. However, since certain types of malfunctions may be most likely to occur during direction reversals, the lack of redundancy during this period remains a concern.

Three Approaches to Improving Redundancy During Direction Reversals

The lack of redundancy and cross-checking during the direction reversal may be dealt with in a number of ways. First, one can envision adding additional framing gating functions that would test all of the intermediate bit positions in which a tag 36 might be located during the direction reversal; these intermediate positions would correspond to a tag 36 being framed partially in the right side register 75 and partially in the left side register 76. The tag decoding functions 82 and 83 would need to be adjusted to compensate for these intermediate framings of the tag 36. However, the logic to implement this tends to be quite cumbersome and to increase greatly the complexity of the system.

Second, there may be a system in which on each incremental tick of motion the contents of the mask registers (75A and 76A) and shift registers (75 and 76), instead of being fed to the framing gating and tag decoding functions shown in FIG. 9, would instead be latched in parallel into an identically-sized set of matching mask registers (75A' and 76A') and shift registers (75' and 76'). This system is partially illustrated in FIG. 25. Thus, these new registers (75', 75A', 76', and 76A') initially contain an instantaneous copy, or snapshot, of the contents of the original registers, 75, 75A, 76, and 76A, respectively. By connecting in cascade the corresponding new shift register functions for the left and right sides (i.e., 76' to 75', and 76A' to 75A'), the contents of these new "snapshot" functions may be shifted left or right as necessary so that any tag 36 they might contain may be aligned into those M bit positions of the "snapshot" shift register function set 76'-75'that are connected to a tag decoding function. (Note: shift register functions that are connected in cascade operate as if they are a single shift register function. In such cases, they are referred to as a "shift register function set", and their identifying numbers linked with a hyphen, with the leftmost member of the set listed first, e.g., shift register function set 76'-75'.) By insuring that the tag 36 to be decoded is always aligned in a fixed position within the "snapshot" shift register function set 76'-75', the need for separate tag decoder functions for the left and right sides is eliminated, and a single, common, tag decoder function may be used. Also, once the shift register functions (76 and 75) and mask register functions (76A and 75A) have been initialized after power-up (i.e., once the encoder band 30 has moved M consecutive incremental ticks of motion in either direction), valid tags 36 will be decoded on every subsequent incremental tick of motion, even during direction reversals, thus maintaining redundancy between the incremental and absolute position measurements.

The group of M consecutive data bits selected from the snapshot shift register function set 76'-75' for presentation to a common tag decoder function may be chosen as follows: First, the "snapshot" is taken, that is, the contents of register functions 75, 76, 75A, and 76A are copied, respectively, into the register functions 75', 76', 75A', and 76A'. Then, the cascaded snapshot shift register function set 76'-75', and the cascaded snapshot mask register function set 76A'-75A' are both shifted right until either a zero bit is detected in the rightmost bit position of the left snapshot mask register function 76A', or until M shifts occur, whichever comes first. Note that the test for detection of the zero bit is made before each shift, so that if the rightmost bit of snapshot mask register function 76A' is initially zero, no shifting of the snapshot register function sets 76'-75' and 76A'-75A' will occur. The number of shifts that do occur is counted in a new "snapshot shift count" counter function 76F', which is set to zero at the time each snapshot is taken, and counted up one count for each bit the snapshot register function sets 76'-75' and 76A'-75A' are shifted right.

At the end of this procedure, the M data bits most recently read from the data track 33 may be aligned in the M leftmost bits of the right snapshot shift register function 75'. Accordingly, these leftmost M bit positions of the right snapshot shift register function 75' are connected to the parallel input of a common tag decoder function 83'. The decoder function 83' is activated by the tag framed signal 86', which is generated by the output of the Mth bit from the left edge of the right snapshot mask register function 75A'. The "snapshot shift count" counter function 76F' supplies to the tag decoder function 83' the number of bit positions that the snapshot register function sets 76'-75' and 76A'-75A' were shifted (to achieve the above described alignment) so that the tag decoder function 83' may adjust the decoded absolute position as necessary to compensate or the alignment shift.

Unfortunately, the above described system will only function properly in the special case where the width in bits N of the mask register functions (76A, 75A, 76A', and 75A') equals the number of bits M connected to the tag decoding function 83'. In many implementations, this condition will not be met. In such cases where the value of N (e.g., 16) exceeds M (e.g., 9), the bits that are aligned (at the end of the alignment procedure) within the M leftmost bits of the right snapshot shift register function 75' (i.e., those bit positions connected to the common tag decoder function 83') will not always correspond to the M most recently read bits from the data track 33. (The reason this is so is explained in detail in a later section of this specification.) Further, the logic required to implement the snapshot registers functions (76', 75', 76A', and 75A') and "snapshot shift count" counter function 76F', and to carry out the above-described alignment procedure is quite large, and would greatly increase the complexity of the system.

Third, one can envision a one-data-track, four-sensor system (not illustrated) in which the dual (left side and right side) N-bit-wide shift registers (76 and 75) and masks registers (76A and 75A) would be replaced by a single N-bit-wide shift register and mask register. A fourth sensor channel (identical in form to the third sensor channel used to produce the signal 59 from the data track 33) would be added to sample the data bits from the data track 33 and produce a signal. The signal 59 (produced by the existing third sensor channel) would feed the shift right serial input of the new shift register, while the new signal (produced from the new fourth sensor channel) would feed the shift left serial input of the new shift register. Both serial inputs to the new mask register would be tied to the high (i.e., one) state. The sensor 44 (used by the third sensor channel to generate the signal 59) would be positioned to sample the data track 33 at a point N bit-positions (on the data track 33) to the left from the point at which the new sensor (used by the new fourth sensor channel to generate the new signal) was positioned. Thus, the bit spacing on the data track 33 between the positions of sensor 44 and the new sensor would match the width in bits N of the new shift register.

When the dome 22 rotated to the right, the data bits read by sensor 44 would shift (via the shift right serial input) into the leftmost bit of the new shift register. Conversely, when the dome 22 rotated to the left, the data bits read by the new sensor would shift (via the shift left serial input) into the rightmost bit of the new shift register. Thus, the register would provide an N-bit wide window through which the microcomputer 70 would view the data track 33. In the special case where the width in bits N of the new shift register and new mask register is equal to M (e.g., 9), then this "viewing window" is also M bits wide. Since this new M-bit-wide "viewing window" would no longer have distinct left and right sides (as was previously the case with the original shift registers 76 and 75), the problem of a tag 36 shifting back and forth between the left and right sides during direction reversals would be eliminated. Further, the need for separate left and right framing gatings and tag decoders would be eliminated as well. In fact, the new mask register and a corresponding framing gating would be needed only to determine when the encoder had made sufficient motion after power-up to initialize the new shift register; once filled with ones, the new mask register remains filled. Finally, note that while this approach requires four sensors, it only requires three (or possibly only two) tracks, since only a single data track is needed.

While this third approach may lead to significant simplifications of the shift register, mask register, framing gating, and tag decoding functions, these simplifications are only possible in the special case where the width in bits N of the new shift register and mask register is equal to M. In those cases where N (e.g., 16) exceeds M (e.g., 9), the group of the M consecutive data bits most recently read from the data track 33 still jumps back and forth within the N-bit-wide "viewing window" of the new shift register when the dome 22 reverses its direction of rotation.

In addition, this third approach suffers from other problems. Specifically, it imposes very severe tolerances on the stability of the spacing between the sensor 44 and the new sensor, and on the stability and regularity of the spacing between the data bits on the data track 33. Further, since a fourth sensor channel is required, this increases the complexity of the optical, mechanical, and analog electronic portions of the encoder, which are likely to be the most failure prone. Finally, the use of a fourth sensor channel precludes the use of such a system as a retrofit to existing optical incremental encoders, since such encoders typically provide only three sensor channels.

A Simplified Approach to Improving Redundancy During Direction Reversals

Fortunately, the lack of redundancy and cross-checking during periods of direction reversal can be addressed in a much simpler manner. Immediately following a direction reversal, the shift and mask registers on the side corresponding to the new direction of motion are "filling" (the shift register with data, and the mask register with ones), while the registers on the other side are "emptying". In the design illustrated in FIG. 9, the bits that are shifted out of the registers that are "emptying" are shifted into oblivion since they do not connect to anything, as indicated by the symbol X. However, immediately following a direction reversal the registers that are being "emptied" in fact contain redundant information that can be used to cross-check the data being read from the data track 33. Specifically, if a mask register that is "emptying" shifts out a one bit, the corresponding shift register that is "emptying" will shift out a data bit which should match the data bit just read from the data track 33 and shifted into the shift register that is "filling".

For example, suppose that the dome 22 had been rotating to the right, that the dome right motion mask register 75A was filled with ones, and that the dome right motion shift register 75 was filled with data. The most recently read data bit from the data track 33 would have just shifted into the leftmost bit of register 75. If the dome now reversed direction, and began rotating to the left, that same data bit on the data track 33 would now be read in the opposite direction, and would be shifted into the rightmost bit of the dome left motion shift register 76. At the same time, a one bit would be shifted left out of the dome right motion mask register 75A, and the reading of the given data bit that had been obtained when the dome had previously rotated to the right would be shifted left out of the dome right motion shift register 75. In the absence of a malfunction, the data bit shifted left out of register 75 should match the data bit just read from the data track 33 and shifted left into register 76.

Figure 23:
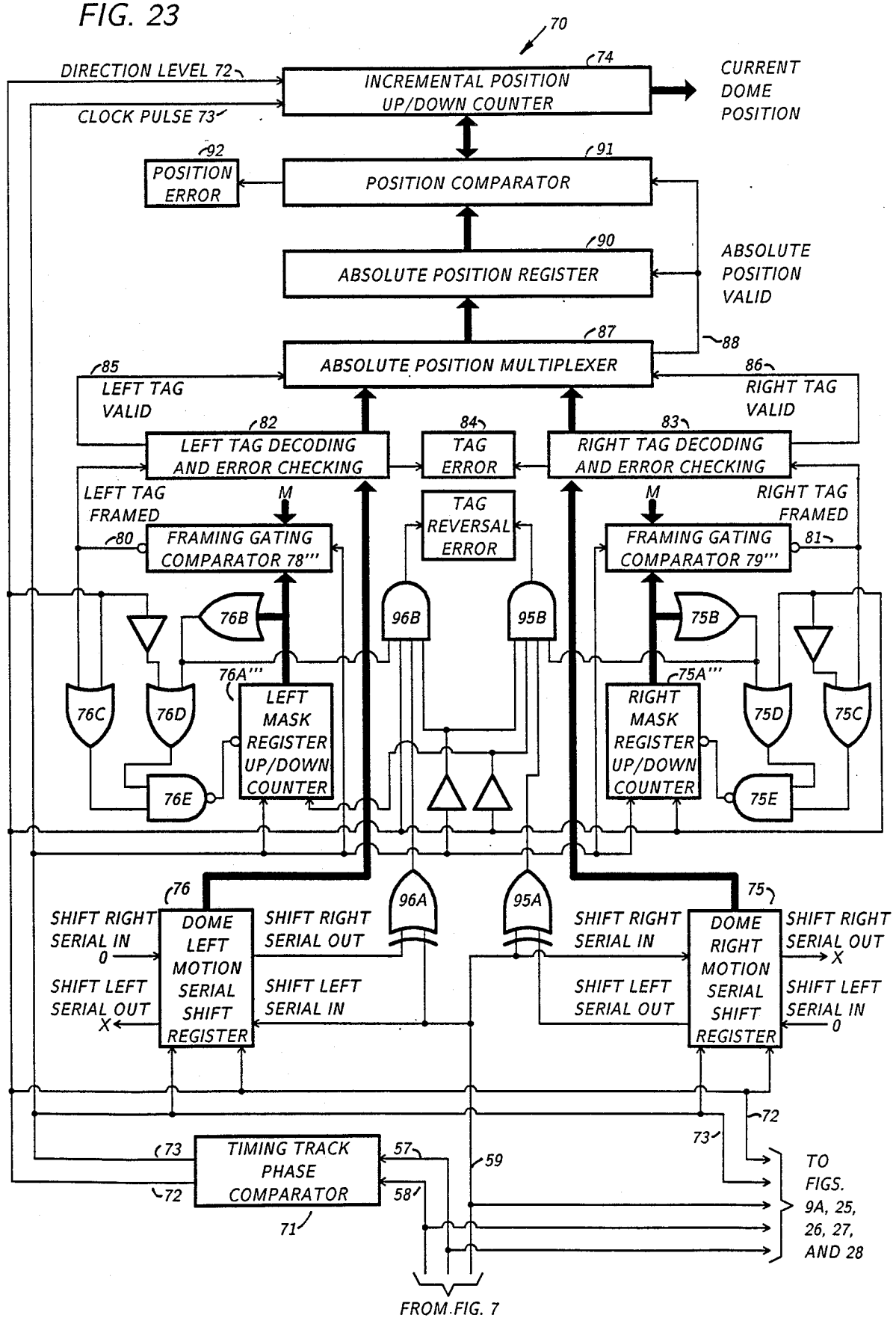
FIGS. 23 through 28 are similar to FIG. 9, but showing a series of alternate configurations described in the text.
Figure 24:
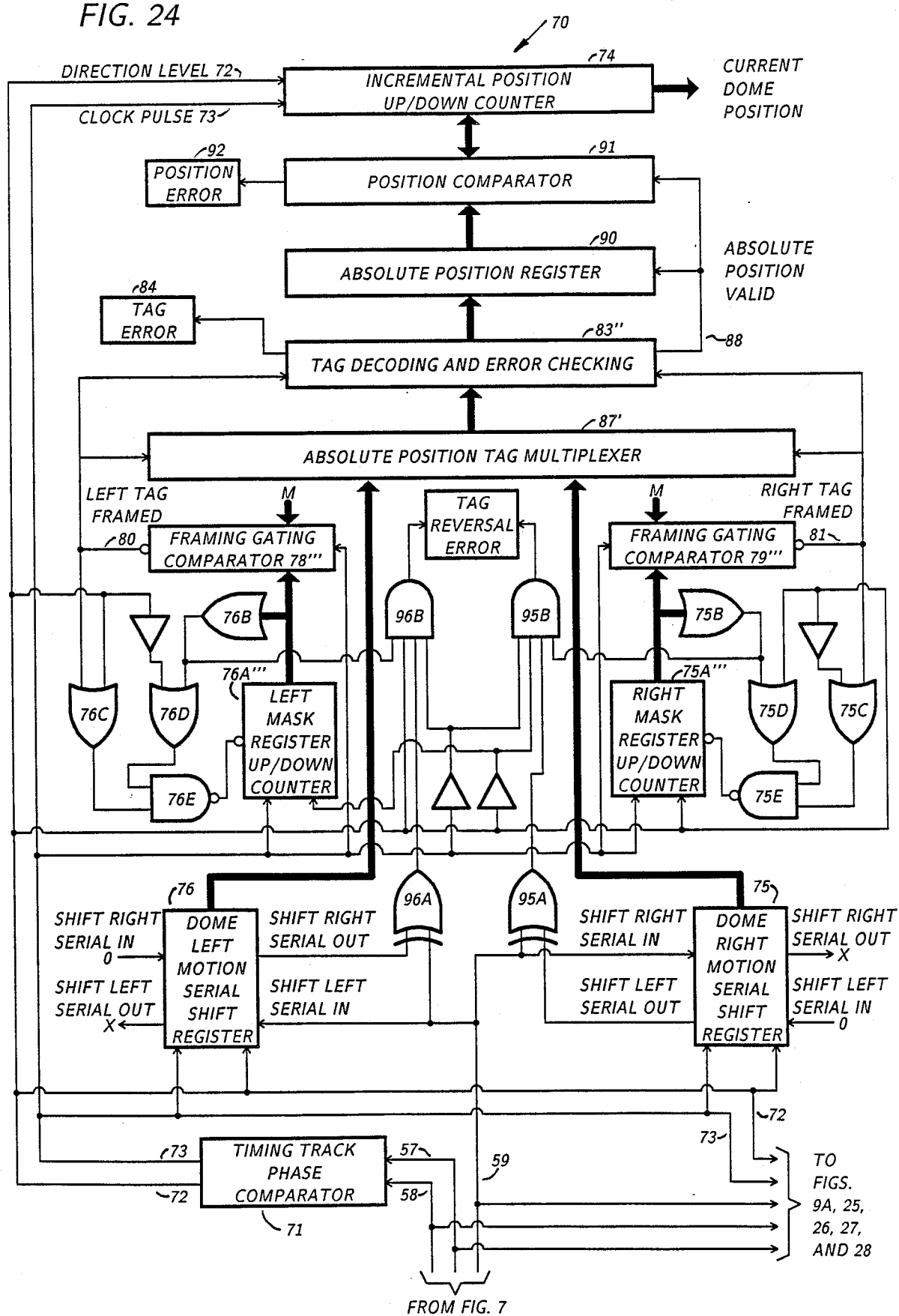

This method of providing cross-checking during direction reversals is shown in FIGS. 23 and 24. The logic required to implement it is quite simple. When the dome 22 is rotating to the right, if a one bit shifts out of the shift right serial output of the dome left motion mask register 76A, then the corresponding bit that shifts out of the shift right serial output of the dome left motion shift register 76 is compared to the data bit just read from the data track 33. Conversely, when the dome 22 rotates left, if a one bit shifts out of the shift left serial output of the dome right motion mask register 75A, then the corresponding bit that shifts out of the shift left serial output of the dome right motion shift register 75 is compared to the data bit just read from the data track 33. In either case, if the comparison fails (i.e., the bits do not match), a "tag reversal" error is reported. Also, in either case, if a zero bit shifts out of the mask register that is "emptying", then that mask register and its corresponding shift register are already completely empty, and the comparison is not performed.

The above-described method insures that the encoder (once initialized after power-up) will cross-check redundant sources of information on every incremental tick of motion, regardless of direction reversals; thus most common types of errors can be detected within a single incremental tick of motion.

Some Alternative Implementations of the Mask Register Functions 75A and 76A, and Framing Gating Functions 79 and 78

The mask register functions 75A and 76A, and corresponding framing gating functions 79 and 78, are used to determine when the corresponding shift registers functions 75 or 76 are sufficiently filled with data so that the corresponding tag decoding and error checking functions 83 and 82 can be activated. The number of one bits in a mask register function 75A or 76A indicates the number of data bits contained in the corresponding shift register function 75 or 76. The framing gating functions 79 and 78 produce their corresponding tag framed strobes 81 and 80 when the number of one bits in the corresponding mask register function 75A or 76A equals or exceeds M bits (e.g., 9 bits). In the implementation shown in FIGS. 9 and 10, the mask register functions 75A and 76A are implemented using N-bit-wide bi-directional serial shift register functions, and the framing gating functions 79 and 78 are implemented using M-bit-wide AND gate functions.

In an alternative system, shown in FIG. 23, the shift-register-based mask register functions 75A and 76A are replaced by new mask register functions 75A''' and 76A''' that are implemented with up/down counter functions, and the AND-gate-based framing gating functions 79 and 78 are replaced by new framing gating functions 79''' and 78''' that are implemented with comparator functions. These up/down counter functions and comparator functions must be of sufficient width (in bits) to contain the binary representation of the value M. In the discussion that follows, it is assumed that the value of M is 9, so that the up/down counter functions and comparator functions must be at least 4 bits wide in order to contain the binary representation of the value 9, i.e., binary 1001. For values of M greater than 15, functions greater than 4 bits in width would be required. Where necessary, such functions may be assembled by connecting in cascade multiple functions of the same type.

The up/down counter function used to implement the new mask register functions 75A''' and 76A''' may employ separate "load", "enable", "clock", "up/down", and parallel counter inputs, and produces "ripple clock" and parallel counter outputs. If the parallel counter inputs are all tied to the low state (i.e., zero), the counter function may be cleared to zero by pulsing the "load" input low. Counting is inhibited when the "enable" input is pulled to the high state (i.e., one). When the counter is enabled (i.e., when the "enable" input is low), if the "up/down" input is high, then a pulse on the "clock" input causes the counter to count up, while if the "up/down" input is low, a pulse on the "clock" input causes the counter to count down. The "ripple clock" output may be connected to the "enable" input of a subsequent up/down counter function to allow such functions to be cascaded together to form counter functions of arbitrary width. (A suitable integrated circuit that may be used for the up/down counter function is the Am74LS169A Synchronous Four-bit Programmable Up-Down Counter manufactured by Advanced Micro Devices of Sunnyvale, Calif.)

The comparator function used to implement the new framing gating functions 79''' and 78''' may employ two separate sets of parallel inputs (each set being at least 4 bits wide), and may produce an output which indicates when the two sets of inputs are equal. (A suitable integrated circuit that may be used for this function is the Am25LS2521 Eight-Bit Equal-to Comparator manufactured by Advanced Micro Devices of Sunnyvale, California; this 8-bit-wide circuit is in fact twice as wide as what is required.)

The up/down counter function used to implement the right mask register function 75A''' and the comparator function used to implement the right framing gating function 79''' are connected as follows:

The parallel inputs of the mask register up/down counter function 75A''' are all tied low, and the "load" input connected to a power-up clear pulse so that the counter function 75A''' is set to zero on power-up. The "clock" input of counter function 75A''' is connected to the negative-going clock pulse signal 73, and the "up/down" input to the direction level signal 72.

The "ripple clock" output of counter function 75A''' is not used unless M exceeds 15, in which case it feeds the "enable" input of a subsequent counter function connected in cascade.

The parallel output of the 4-bit-wide up/down counter function 75A''' feeds a 4-input- OR gate function 75B (which is used to test whether the value in counter function 75A''' is zero), and also feeds one of the two sets of parallel inputs to the comparator function used to implement the framing gating function 79'''.

The individual bits of the other set of parallel inputs to the comparator function 79''' are either tied high or low as necessary in order to supply the binary value of M (e.g., 1001 binary or 9 decimal). Any unused bits on either set of the parallel inputs to the comparator function 79''' are tied low (i.e., to zero). Thus, the comparator function 79''' produces an active-low "equal-to" output when the value in the counter function 75A''' equals M (e.g., 9). This "equal-to" output produced by the comparator function 79''' is used as the "right tag framed" signal 81, and it activates the "right tag decoding and error checking" function 83.

The "right tag framed" signal 81 also feeds one input of a 2-input OR gate function 75C, the other input of which is connected to an inverted version of the direction level signal 72. The output of this OR gate function 75C (which goes low when the dome 22 is moving to the right and the counter function 75A''' has been counted up to the value M) is fed to one input of a 2-input NAND gate function 75E, and is used to prevent the counter function 75A''' from counting up past the value M.

The output of the 4-input OR gate function 75B (which goes low when the contents of counter function 75A''' is zero) is fed to one input of a 4-input AND gate function 95B (which is used for detecting tag reversal errors), and is also fed to one input of a 2-input OR gate function 75D, the other input of which is connected to the direction level 72. (Note that the output of OR gate function 75B provides a signal that is high as long as any of the M data bits most recently read from the data track 33 is contained within the leftmost-M bits of shift register function 75, and goes low when shift register function 75 no longer contains any of the M most recently read data bits.)

The output of the 2-input OR gate function 75D (which goes low when the dome 22 is moving left and the counter function 75A''' has been counted down to zero) is fed to the other input of the 2-input NAND gate function 75E (whose first input is connected to the output of OR gate function 75C, as described above), and is used to prevent the counter function 75A''' from counting down past the value zero.

The output of the 2-input NAND gate function 75E is connected to the "enable" input of counter function 75A''', and thus prevents the counter function 75A''' from counting up past M when the dome 22 is rotating right, or from counting down past zero when the dome 22 is rotating left.

The up/down counter function used to implement the left side mask register function 76A''' and the comparator function used to implement the left side framing gating function 78''' are similarly connected so that a "left tag framed" signal 80 is produced when the left side mask register up/down counter function 76A''' counts up to the value M (e.g., 9). Like the right side mask register up/down counter function 75A''', the left side mask register up/down counter function 76A''' is cleared to zero on power up, and is similarly prevented from counting down below zero or counting up above M (e.g., 9) by corresponding gate functions 76B, 76D, 76C, and 76E. The main difference between the right side mask register up/down counter function 75A''' and left side mask register up/down counter function 76A''' is that they count in opposite directions, that is, when the counter function 75A''' counts up, the counter function 76A''' counts down, and vice versa. (Note that this is analogous to the operation of the original mask register functions 75A and 76A in which mask register function 75A "fills" while mask register function 76A "empties", and vice versa.) This is accomplished by reversing the sense of the direction level signals fed to the counter function 76A''' and gate functions 76C and 76D relative to those fed respectively to the counter function 75A''' and the gate functions 75C and 75D.

The new mask register functions 75A''' and 76A''', and the corresponding framing gating functions 79''' and 78''', operate as follows:

When the dome 22 moves to the right, mask register up/down counter function 75A''' counts up, until it reaches a count of M (e.g., 9), at which point the framing gating function 79''' generates a "right tag framed" signal 81 which (via gate functions 75C and 75E) inhibits its counter function 75A''' from counting up any further. The signal 81 also activates the "right tag decoding and error checking function" 83. At the same time, mask register up/down counter function 76A''' counts down, until it reaches a count of zero, at which point any further attempts to count it down are inhibited by the operation of gate functions 76B, 76D, and 76E.

Similarly, when the dome 22 moves to the left, mask register up/down counter function 76A''' counts up, until it reaches a count of M (e.g., 9), at which point the framing gating function 78''' generates a "left tag framed" signal 80 which (via gate functions 76C and 76E) inhibits counter function 76A''' from counting up any further. The signal 80 also activates the "left tag decoding and error checking function" 82. At the same time, mask register up/down counter function 75A''' counts down, until it reaches a count of zero, at which point any further attempts to count it down are inhibited by the operation of gate functions 75B, 75D, and 75E.

Since the mask register up/down counter functions 75A''' and 76A''' are not allowed to be counted up past M (e.g., 9) nor counted down below zero, these counter functions 75A''' and 76A''' indicate, respectively, how many of the M data bits most recently read from the data track 33 are contained in the leftmost-M bits of shift register function 75 or the rightmost-M bits of shift register function 76.

The procedure used to check for tag reversal errors is modified as follows:

The data bit from the shift right serial output of the dome left motion serial shift register function 76 is fed to one input of a 2-input exclusive-OR gate function 96A, the other input of which is fed the data bit (signal 59) from the data track 33. The output of this gate function 96A (which goes high if the two data bits disagree) feeds one input of a 4-input AND gate function 96B. The other 3 inputs of this AND gate function 96B are fed, respectively, the direction level signal 72 (which is high if the dome is rotating right), the output of OR gate function 76B (which is high if shift register function 76 contains any of the M data bits most recently read from the data track 33), and an inverted version of the clock pulse signal 73 (high during clock). Thus, if the output of AND gate function 96B goes high, it indicates that the dome is rotating to the right, that the shift register function 76 contains at least some of the M most recently read data bits, and that the data bit that just shifted out of the shift right serial output of shift register function 76 does not match the data bit just read from the data track 33; hence, a tag reversal error occurred when the dome reversed its rotation from left to right.

A similar check is performed for the opposite direction by connecting the shift left serial output of the dome right motion serial shift register function 75 to one input of a 2-input exclusive-OR function gate 95A, the other input of which is fed the data bit (signal 59) from the data track 33. The output of this gate function 95A (which goes high if its two inputs disagree) feeds one input of a 4-input AND gate function 95B. The other 3 inputs of this AND gate function 95B are fed, respectively, an inverted version of the direction level signal 72 (high if the dome is rotating to the left), an inverted version of the clock pulse signal 73 (high during clock), and the output of OR gate function 75B (which is high if shift register function 75 contains any of the M most recently read data bits). Thus, if the output of AND gate function 95B goes high, a tag reversal error occurred when the dome reversed its rotation from right to left.

While this alternative system employing mask register up/down counter functions 75A''' and 76A''' (and framing gating functions 79''' and 78''') may be more cumbersome to implement than the original system employing mask register functions 75A and 76A (and framing gating functions 79 and 78), it demonstrates the point that alternative implementations of the mask register and framing gating functions can be developed which provide essentially equivalent functionality. (This alternative system also provides some advantages which will be described in a subsequent section of this specification.)

Additional alternative implementations may be possible. For example, in the special case where M is 15, the comparator functions (79''' and 78''') may be replaced with 4-input NAND gate functions. Other types of up/down counter functions may provide specialized "carry" and "borrow" outputs that might be used to reduce the number of gate functions (e.g., functions 75B, 75D, 76B, and 76D) required. In any case, alternative implementations of the mask register functions 75A''' or 76A''' must keep track of how many of the M data bits most recently read from the data track 33 are contained within those bit positions of the corresponding shift register function 75 or 76 that are connected to the corresponding tag decoding functions 83 or 82. Any alternative implementations of the framing gating function 79''' or 78''' must determine when that number of data bits is sufficient to activate the corresponding tag decoding and error checking functions 83 and 82.

Some alternative implementations of the tag decoding and error checking functions 82 and 83, and absolute position multiplexer 87

The tag decoding and error checking functions 82 and 83 are used to validate an absolute position tag 36, and decode it into an absolute position. As illustrated in FIG. 9, separate tag decoding functions 82 and 83 are provided for the left and right sides, since the absolute position corresponding to a given tag 36 depends on whether that tag 36 is framed in the left shift register function 76 or the right shift register function 75. As shown in FIG. 9, the left tag decoder function 82 receives its parallel input from the parallel output of the left shift register function 76, and sends its parallel output to the left parallel input of the absolute position multiplexer function 87 when triggered by the left tag framed signal 80. Similarly, the right tag decoder function 83 receives its parallel input from the parallel output of the right shift register function 75, and sends its parallel output to the right parallel input of the absolute position multiplexer function 87 when triggered by the right tag framed signal 81.

In an alternative system shown in FIG. 24, the multiplexing of information from the left and right sides may occur at an earlier stage in the processing of the absolute position tag 36. For example, the multiplexing may occur prior to the step of decoding the tag 36 into an absolute position. In such an alternative system, a new absolute position tag multiplexer function 87' has its left parallel input connected to the parallel output of the left shift register function 76, and its right parallel input connected to the parallel output of the right shift register function 75. The parallel output of the tag multiplexer function 87' is connected to the parallel input of a new tag decoder function 83'', whose parallel output is in turn connected to the parallel input of the absolute position register 90. The "left tag framed" signal 80 (generated by the left framing gating function 78''') is connected to the "left side select" input of the tag multiplexer function 87', and to a corresponding input on the new tag decoder function 83''. The "right tag framed" signal 81 (generated by the right framing gating function 79''') is connected to the "right side select" input of the tag multiplexer function 87', and to a corresponding input of the new tag decoder function 83''. The tag decoder function 83'' generates an "absolute position valid" signal 88, which connects to the absolute position register 90 and to the position comparator 91.

This alternative system operates as follows:

When the right framing gating function 79''' generates a right tag framed signal 81, this triggers the tag multiplexer function 87' to select its right parallel input, thus passing the parallel data (i.e., a potential tag 36) from the parallel output of the right shift register function 75 to the parallel input of the new tag decoder function 83''. The tag decoder function 83'' checks the potential tag 36 for validity, and if it is valid, decodes the tag 36 into an absolute position. The right tag framed signal 81 informs the tag decoder 83'' that the tag 36 originated from the right shift register function 75, so that the tag decoder function 83'' may adjust the decoded absolute position as necessary. The tag decoder function 83'' generates an "absolute position valid" signal 88, thus triggering the absolute position register 90 to latch the adjusted absolute position supplied to its parallel input, and triggering the position comparator 91 to make a comparison.

When the left framing gating function 78''' generates a left tag framed signal 80, this triggers the tag multiplexer function 87' to select its left parallel input, thus passing the parallel data (i.e., a potential tag 36) from the parallel output of the left shift register function 76 to the parallel input of the new tag decoder function 83''. The tag decoder function 83'' checks the potential tag 36 for validity, and if it is valid, decodes the tag 36 into an absolute position. The left tag framed signal 80 informs the tag decoder 83'' that the tag 36 originated from the left shift register function 76, so that the tag decoder function 83'' may adjust the decoded absolute position as necessary. The tag decoder function 83'' generates an "absolute position valid" signal 88, thus triggering the absolute position register 90 to latch the adjusted absolute position supplied to its parallel input, and triggering the position comparator 91 to make a comparison.

In the implementation illustrated in the Appendix to this specification, the tag decoder 83'' is implemented as a look-up table containing the absolute position corresponding to a tag 36 being framed in the right shift register function 75. When decoding tags 36 that originate from the right shift register function 75 (as indicated by the signal 81), the tag decoder 83'' uses the value from the look-up table directly, and sends this value to the absolute position register 90. When decoding tags 36 that originate from the left shift register function 76 (as indicated by the signal 80), the tag decoder 83'' computes an adjusted absolute position by subtracting (modulo J) the value M from the value obtained from the look-up table, and sends this adjusted value to the absolute position register 90. This subtraction operation is provided by the microcomputer 70.

In implementations which do not use a microcomputer 70, the computation of the adjusted absolute position for tags 36 framed in the left shift register function 76 may prove difficult, and it may still be desirable to have two different sets of look-up tables (i.e., tag decoder functions), one for decoding tags 36 framed in the right side, and one for tags 36 framed in the left side. However, it may prove economical to combine these two different tables into a single decoding device (such as a ROM circuit) of sufficient size to hold both tables. One of the address bits (e.g., the most significant address bit) of such a device may be used to select between the two different tables. The value of this address bit may be derived from the signals 80 and 81 which indicate whether the tag 36 originated in the left shift register function 76 or right shift register function 75. The parallel output of the tag multiplexer 87' (which selects the appropriate entry from the selected table) may then be used to form the remaining part (e.g., the least significant address bits) of this address, and thus select the appropriate entry from the selected look-up table. In implementations (even microcomputer-based implementations) where it is more economical to provide two look-up tables rather than perform a subtraction modulo J, this approach may be used to combine these two separate tables into a single decoding device, thus allowing a single look-up operation to obtain the appropriate entry from the desired table.

An alternative implementation of the shift register functions 75 and 76

Figure 27:
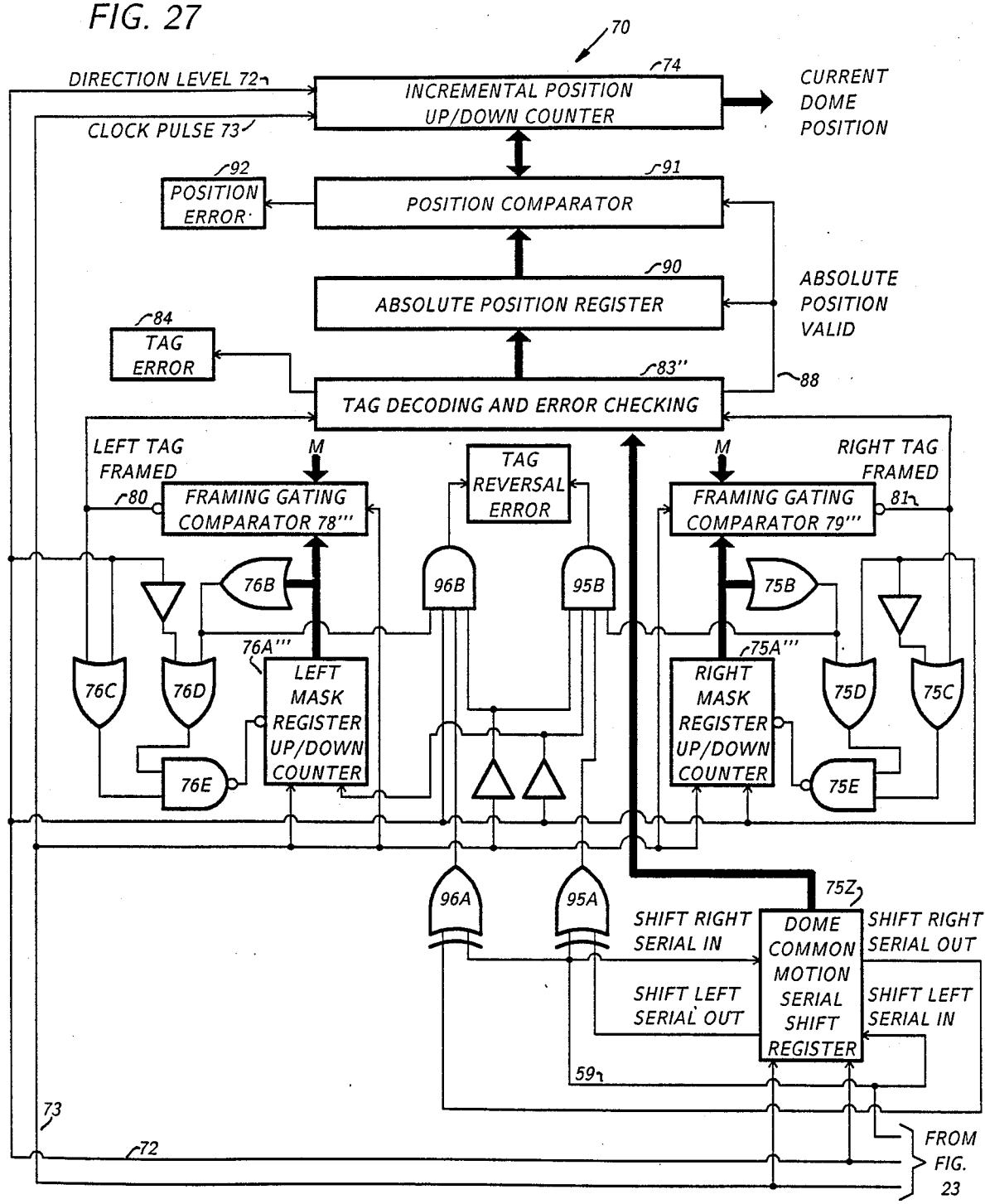

All of the implementations illustrated so far have contained a separate right motion shift register function 75 and left motion shift register function 76. One can envision an alternative system, as shown in FIG. 27, employing only a single shift register function 75Z. As shown in FIG. 27, the shift right serial input and the shift left serial input of function 75Z are both connected to the signal 59 from the data track 33. When the dome 22 rotates right, the data bits enter the function 75Z from the left edge (i.e., shifting right), while for rotation to the left, the data bits enter from the right edge (i.e., shifting left). Thus, the function 75Z "fills" with data regardless of the direction of the dome rotation.

While the implementation shown in FIG. 27 employs only a single shift register function 75Z, it still maintains separate mask register functions (75A''' and 76A''' and framing gating functions (79''' and 78''') for the right and left sides. When the right framing gating function 79''' generates a "right tag framed" signal 81, this indicates that the shift register function 75Z is "filled" with a potential tag 36. The absolute position corresponding to this condition is equivalent to the given tag 36 being framed in the right motion shift register function 75. Conversely, when the left framing gating function 78''' generates a "left tag framed" signal 80, this indicates that function 75Z is "filled", and that the absolute position is equivalent to the given tag being framed in the left motion shift register 76.

Note that during direction reversals, the sequence of bits in shift register function 75Z will be scrambled, and will not correspond to the sequence of data bits most recently read from the data track 33. However, during such times, the mask register functions (75A''' and 76A''') will indicate that the function 75Z is only partially "filled", and thus the corresponding framing gating functions (79''' and 78''') will not generate either "tag framed" signal (81 or 80). Accordingly, no attempt will be made to decode the contents of shift register function 75Z while it is in such a "scrambled" state. (However, the data bits that shift out of function 75Z during direction reversals still correspond to the data bits about to be read from the data track, so that the serial outputs of function 75Z may be connected to the tag-reversal error-detection logic as indicated.) Once the dome has made sufficient consecutive motion in a given direction to trigger the corresponding "tag framed" signal 81 or 80, the function 75Z will be "filled", and the sequence of bits it contains will not longer be scrambled.

In the special case where the width in bits N of the shift register function 75Z is equal to M, then the parallel output of function 75Z can be connected (as shown in FIG. 27) directly to the parallel input of a common tag decoding function 83''. This eliminates the need for either separate tag decoding functions 82 and 83, or an absolute position tag multiplexer function 87'. However, similar to the implementation illustrated in FIG. 24, this common tag decoding function 83'' must also receive the left and right "tag framed" signals 81 and 80 so that it can adjust the decoded absolute position to compensate for the tag 36 being framed in either the left or right side.

In the general case where the width in bits N of the shift register function 75Z exceeds M, then a "framed" tag still shifts back and forth between either the left edge or the right edge of function 75Z depending on the direction of rotation. In such cases, either separate tag decoder functions 82 or 83 would be required as shown in FIG. 23, or an absolute position tag multiplexer 87' would be required as shown in FIG. 24. In either case, the rightmost-M bits of the parallel output of function 75Z would be connected to the left tag decoder function 82 (or the left parallel input of the tag multiplexer 87'), while the leftmost-M bits would be connected to the right tag decoder function 83 (or the right parallel input of the tag multiplexer function 87').

Measuring the alignment position of the M-bit-wide "framing window" within the 2N-bit-wide "viewing window" (FIGS. 29 to 38)

As discussed in the previous sections, when the dome reverses its direction of rotation, the framing of tags 36 (and their corresponding check bits 38) shifts back and forth within the 2N-bit-wide window provided by the left and right shift register functions 76 and 75. This shift in the framing of the tags 36 is a consistent source of annoyance and complexity in most of the implementations described so far. Some of these implementations offer partial solutions to this problem but at a cost of excessive complexity.

What is needed is an efficient method for determining which set of M consecutive bits should be selected from the shift register function set 76-75 for presentation to a tag decoder function 83'. (Note that although shift register functions 76 and 75 are not connected in cascade, the fact that they normally share a common serial input, i.e., signal 59, allows them to be viewed as a shift register function set.) The problem of selecting the correct set of M consecutive data bits (i.e., those M data bits most recently read from the data track 33) reduces to the problem of identifying the current position of an M-bit-wide "framing window" which shifts back and forth within the 2N-bit-wide "viewing window" of the shift register function set 76-75 as the dome 22 reverses its direction of rotation.

FIGS. 29 to 38 illustrate the operation of the shift register functions (75 and 76, or 75Z) and mask register functions (75A and 76A, or 75A''' and 76A'''), and show how the alignment of the M-bit-wide (e.g., 9 bit wide) "framing window" shifts back and forth within the 2N-bit-wide (e.g., 24 bit wide) "viewing window" (formed by functions 75 and 76) as the dome 22 reverses direction. In these figures, the width in bits N of the shift register functions 75 and 76 is 12, while the number of bits M (i.e., the number of bits connected to the corresponding tag decoder functions) is 9. (Note that shift register function 75Z is M bits (e.g., 9 bits) wide, and provides an M-bit-wide "viewing window".)

As a conceptual aid to following both the motion of the dome 22 and the corresponding movement of data through the shift register functions, each data bit of the data track 33 (which is actually either a light-passing or light-blocking stripe) is symbolized in these figures by a distinct letter. These letters are assigned so that the sequence of data bits on the data track 33 appears as an alphabetically-ordered sequence of lower and upper case letters (the lower case letters preceding the upper case letters). When a given data bit is "read" (i.e., the given data bit moves past sensor 44), the letter symbolizing that bit is shown as being stored into the "centermost" bit position (i.e., bit position 1) of the appropriate shift register function 75 or 76, and into either the rightmost or leftmost bit position of shift register function 75Z, as appropriate. The shift-register-based mask register functions 75A and 76A show the actual bit patterns they contain. Note that these mask register functions are constrained (by logic such as that shown in FIG. 25) to contain no more than M (e.g., 9) ones. (The reason this is done will be explained shortly.) The up-down-counter-based mask register functions 75A''' and 76A''' show the actual counts they contain, and are constrained (by logic such as that shown in FIG. 23) to values between zero and M (e.g., 9). A block in the lower left-hand corner of each of these figures shows the M most-recently-read data bits, and the direction in which each was read.

Figure 29:
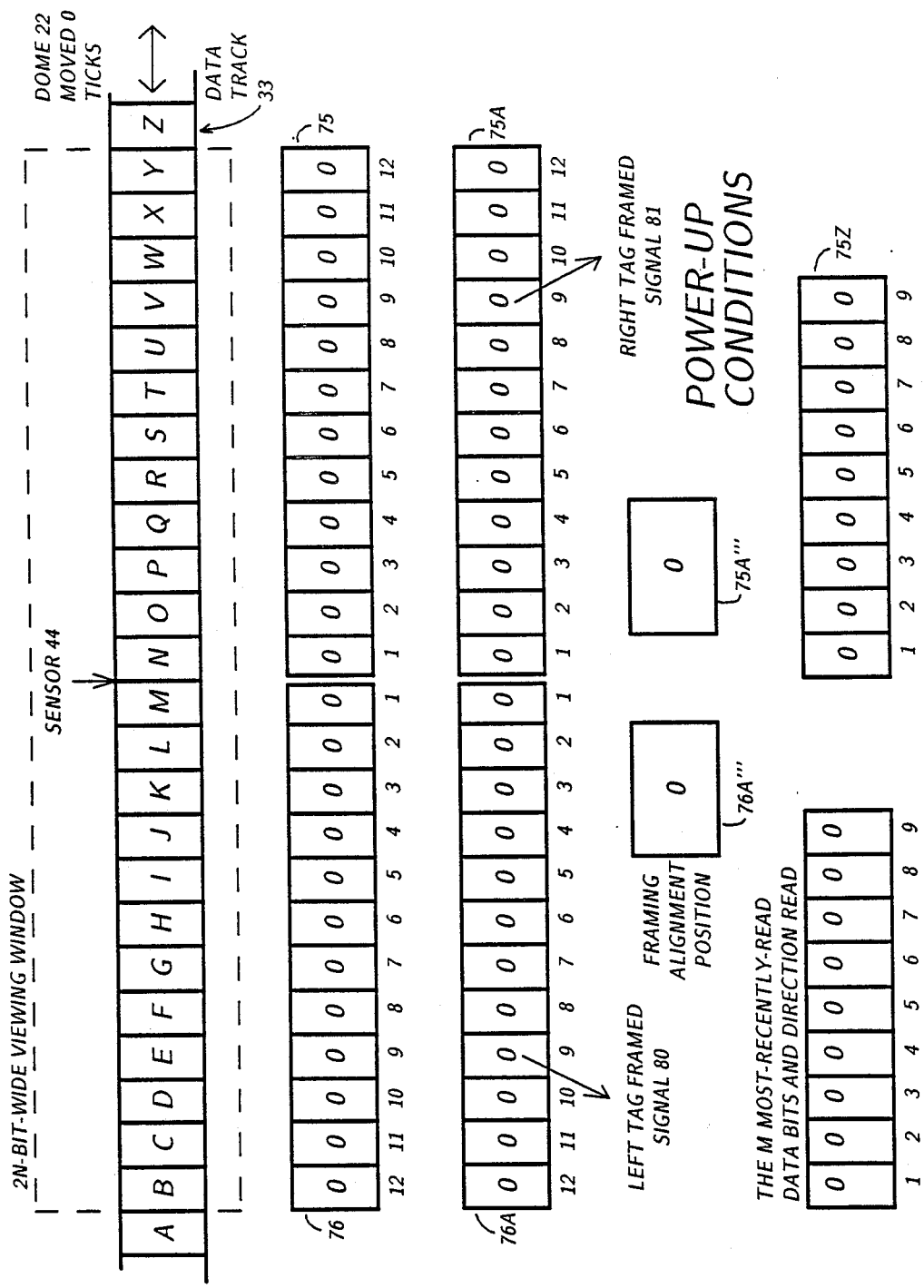
FIGS. 29 through 38 are a series of diagrams illustrating the measuring of the alignment position of an M-bit-wide "framing window" within a 2 N-bit-wide "viewing window".
Figure 30:
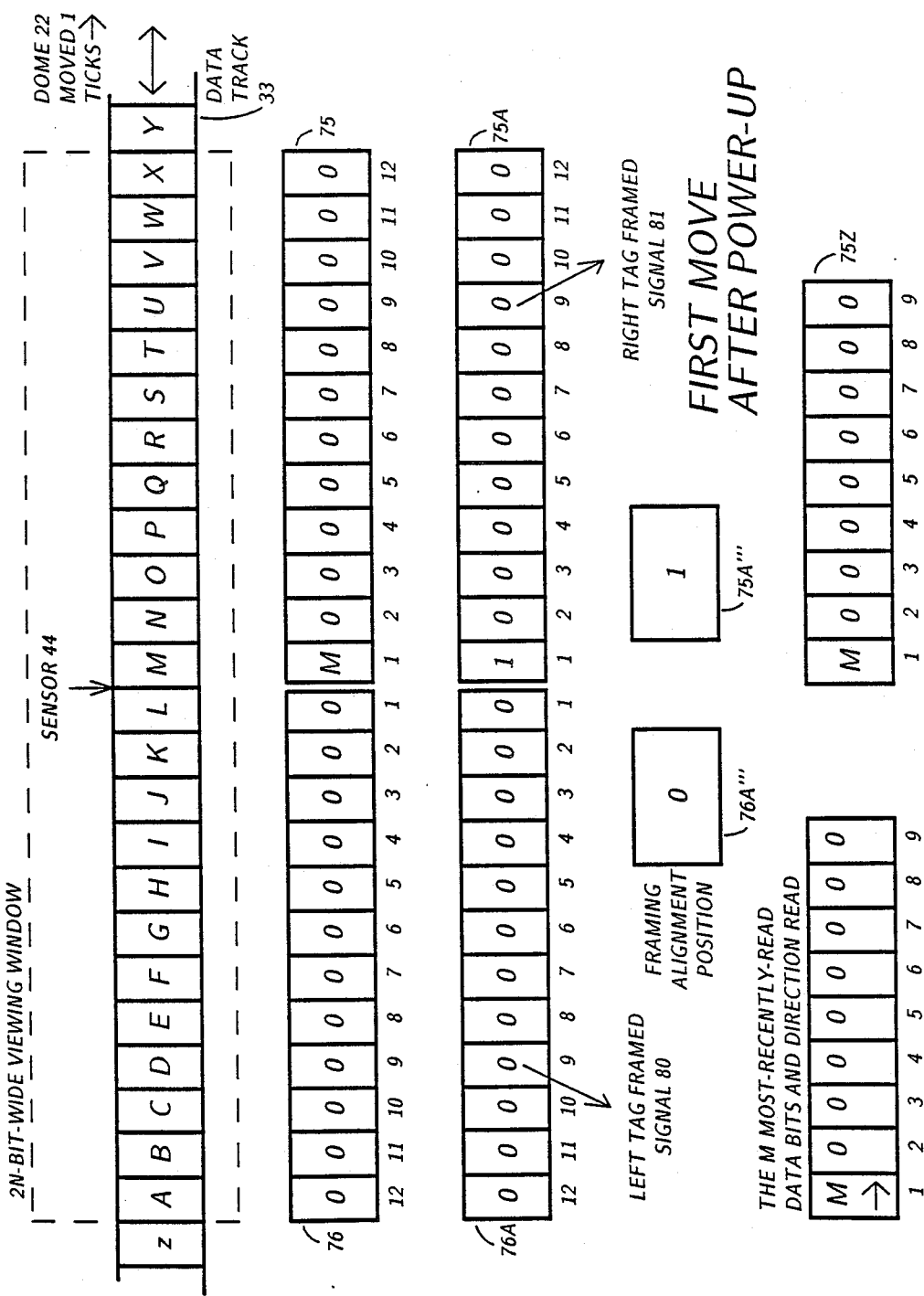
Figure 31:
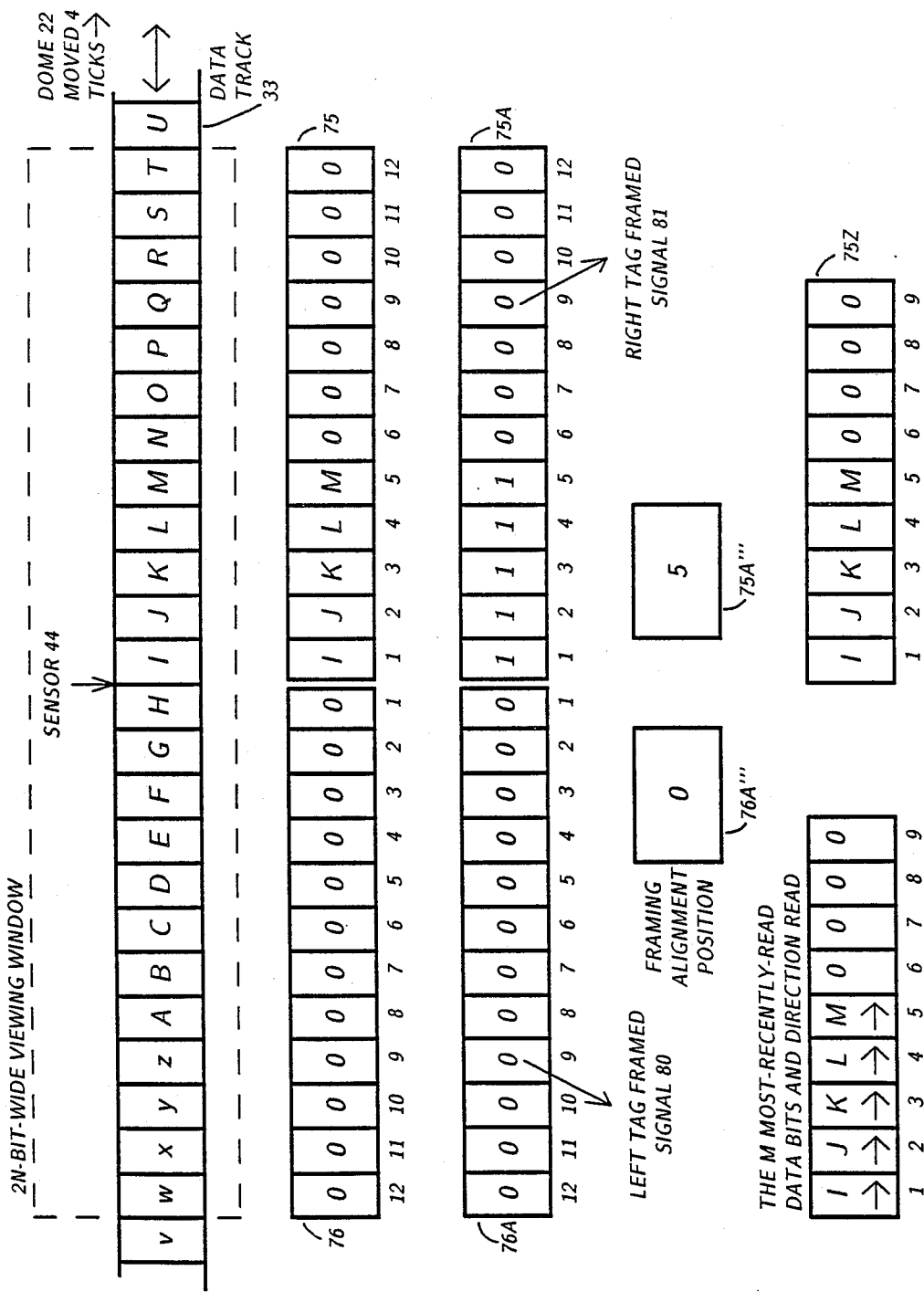
Figure 32:
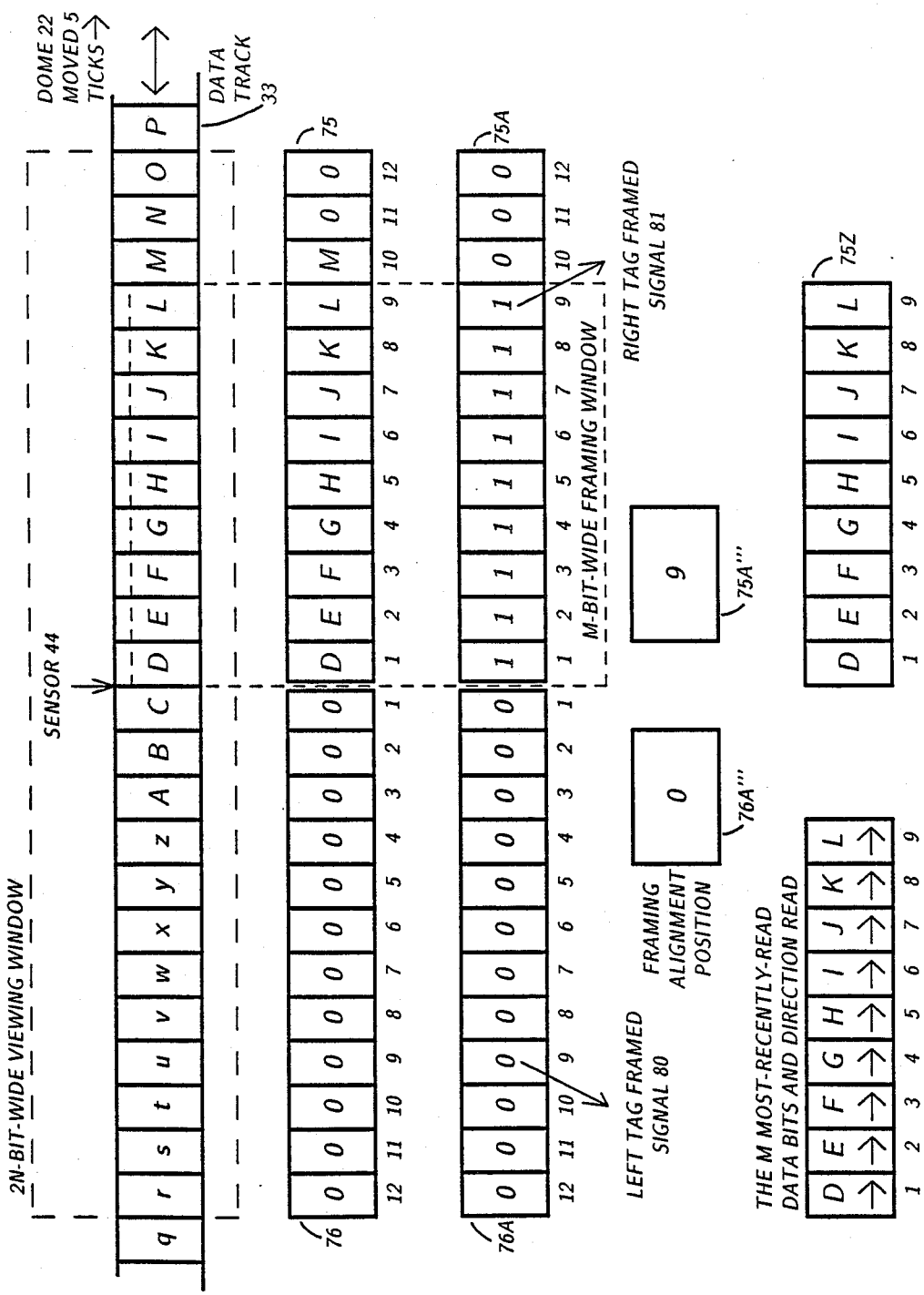
Figure 33:
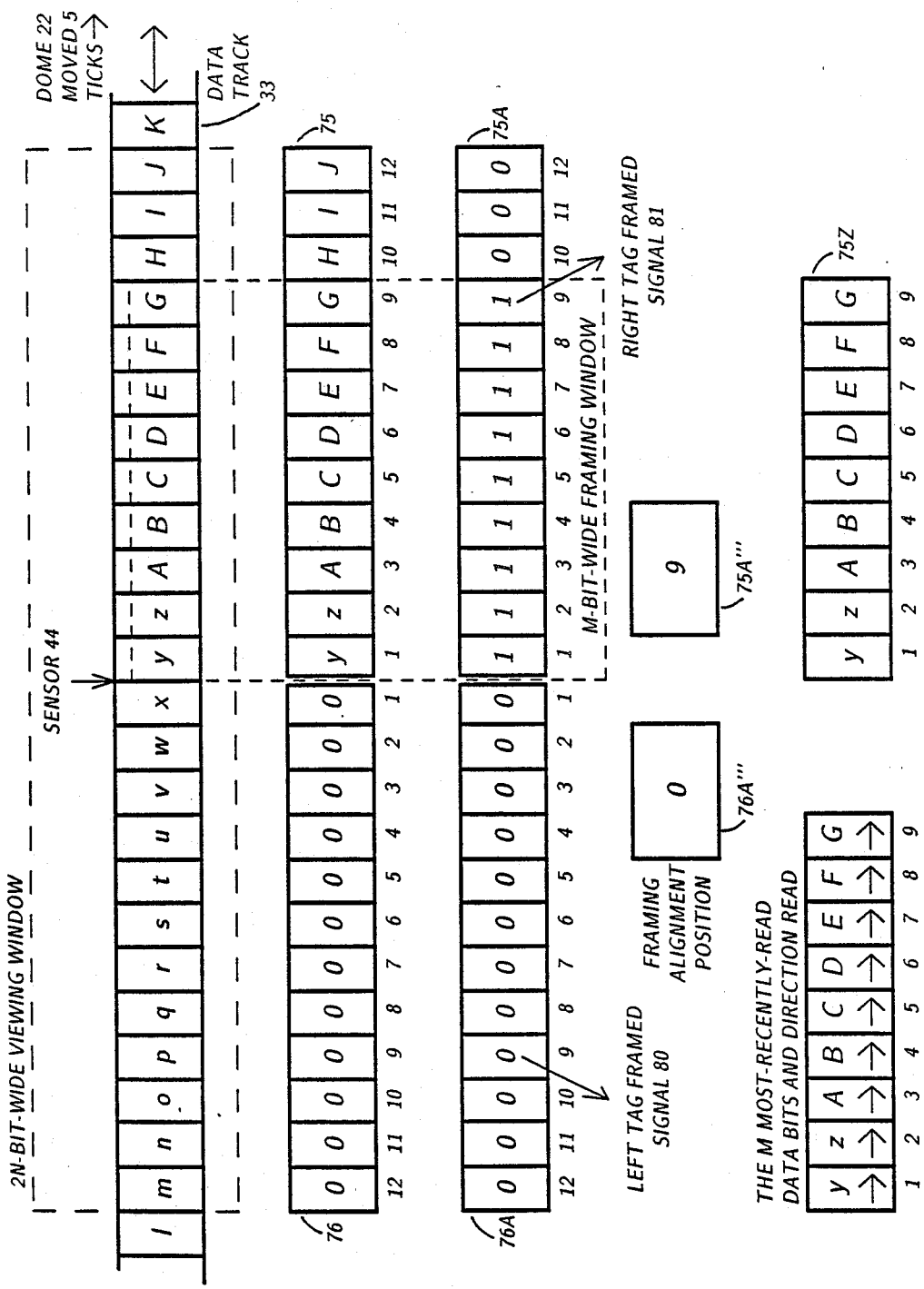
Figure 34:
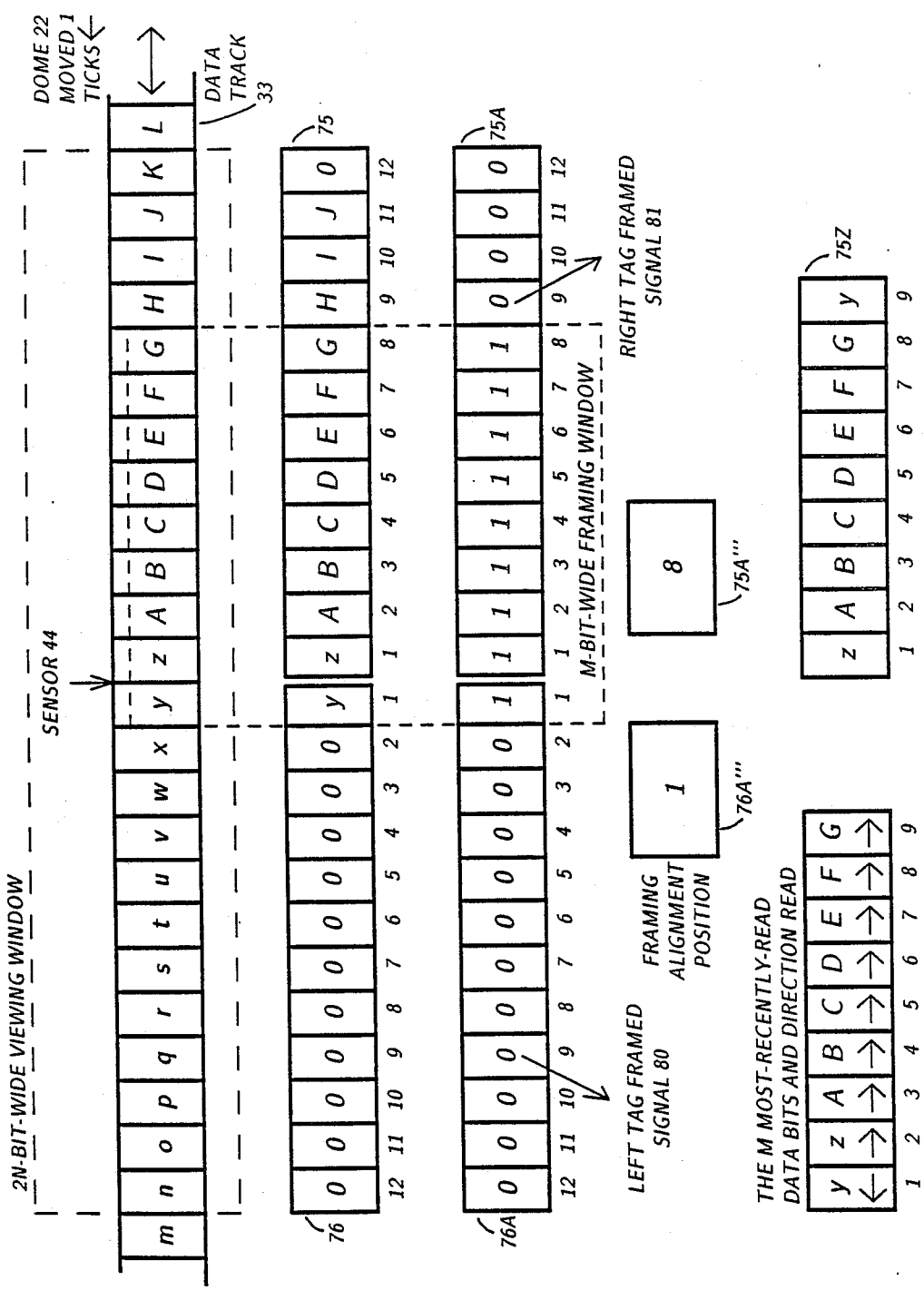
Figure 35:
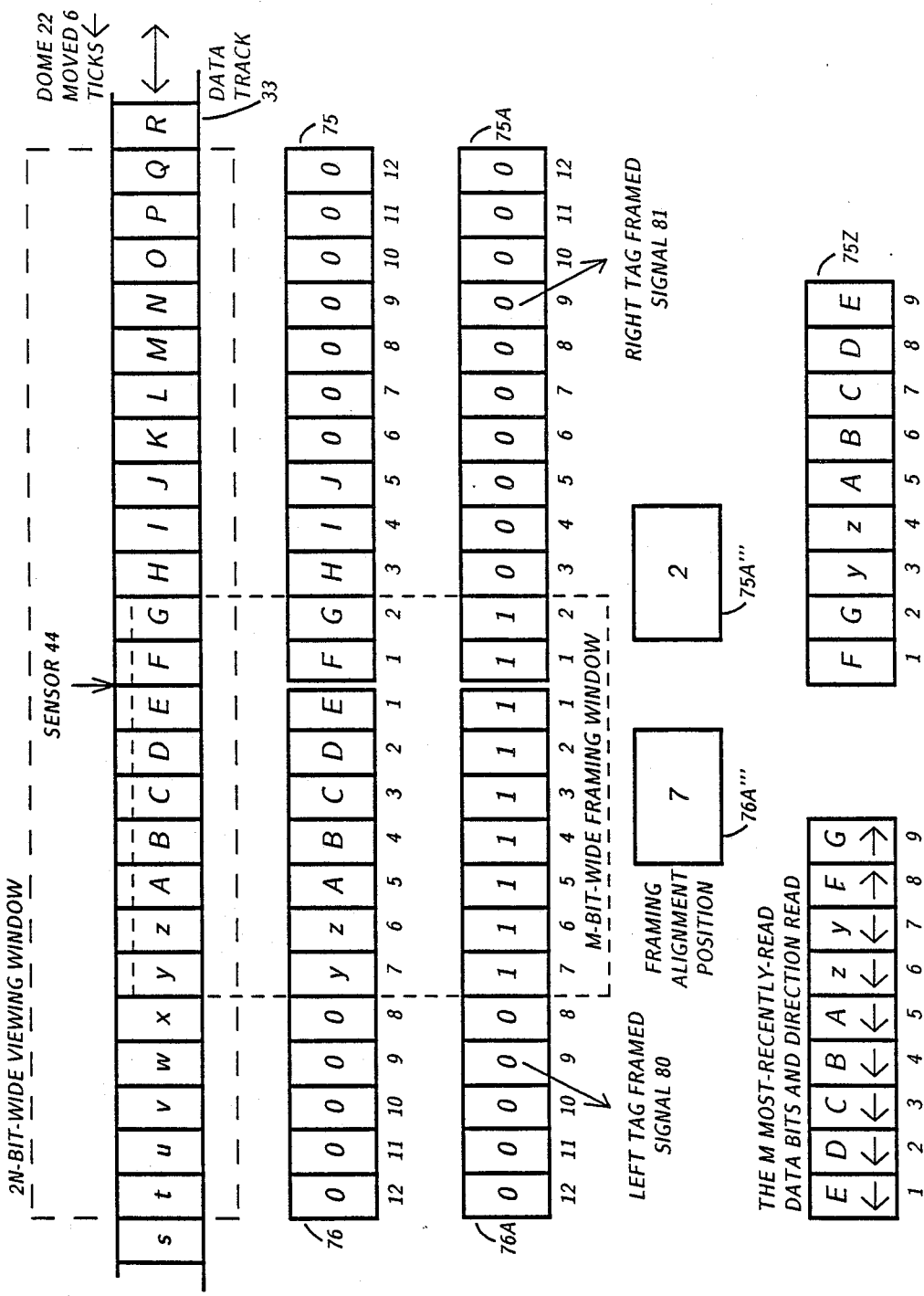
Figure 36:
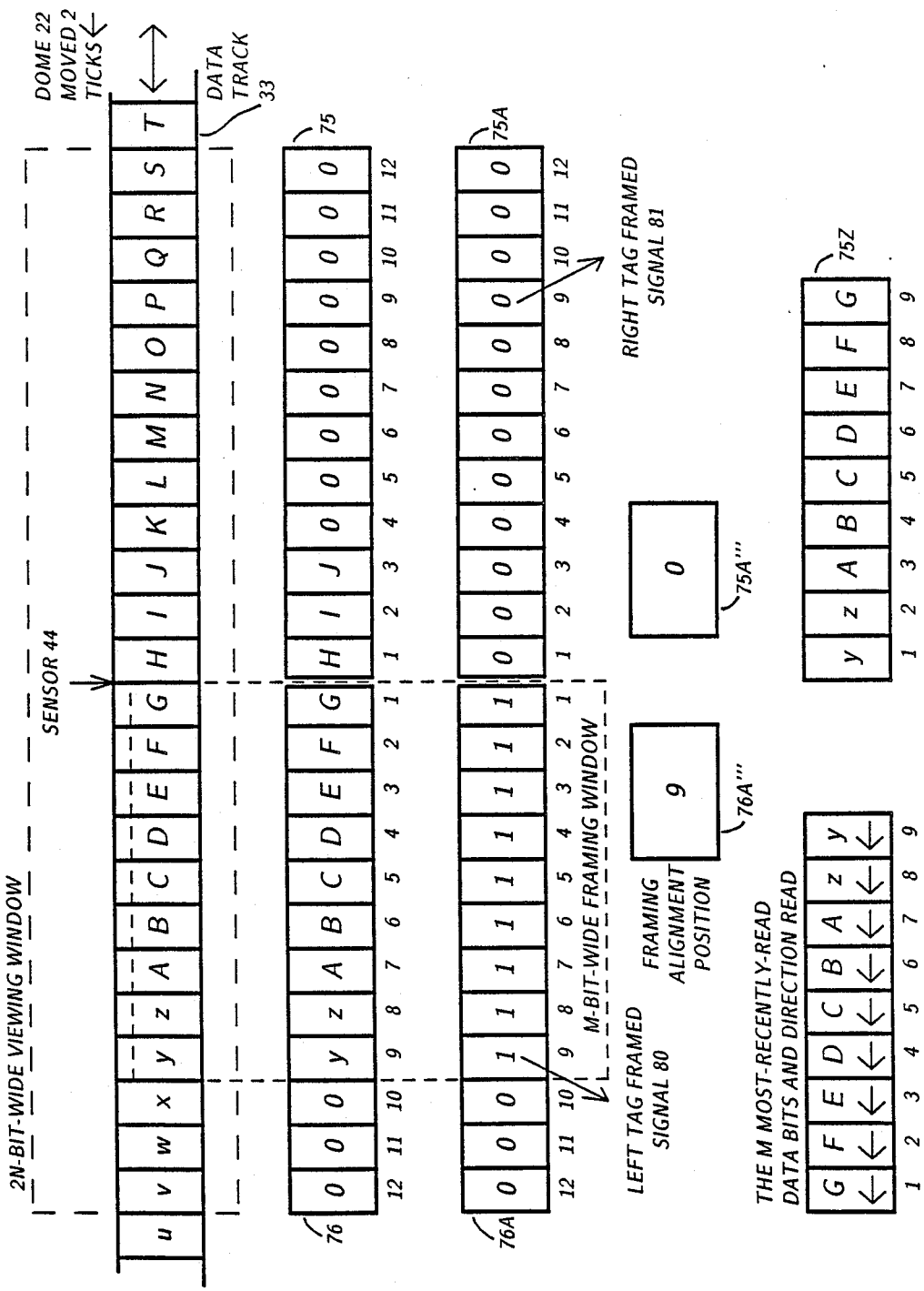
Figure 37:
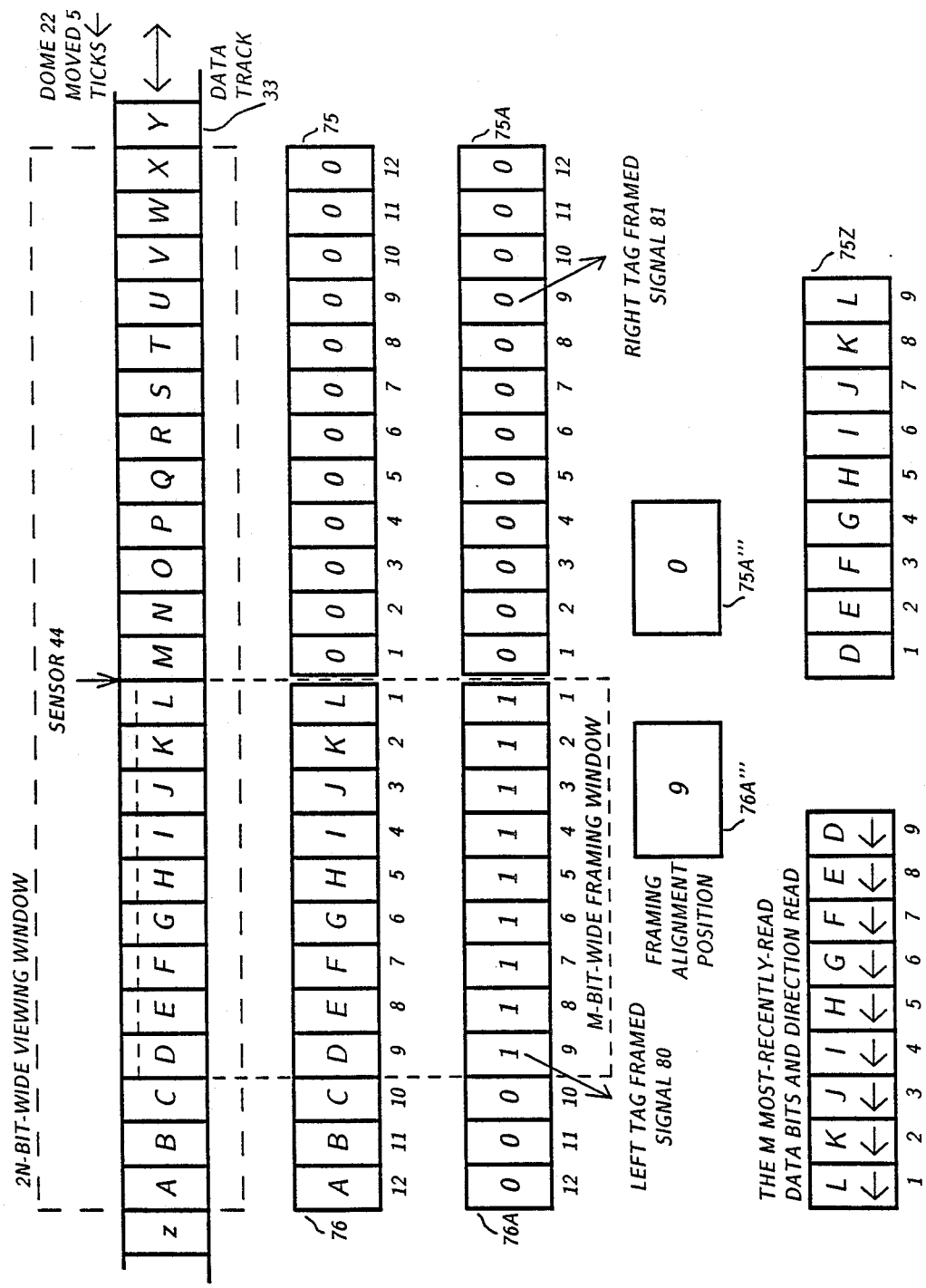
Figure 38:
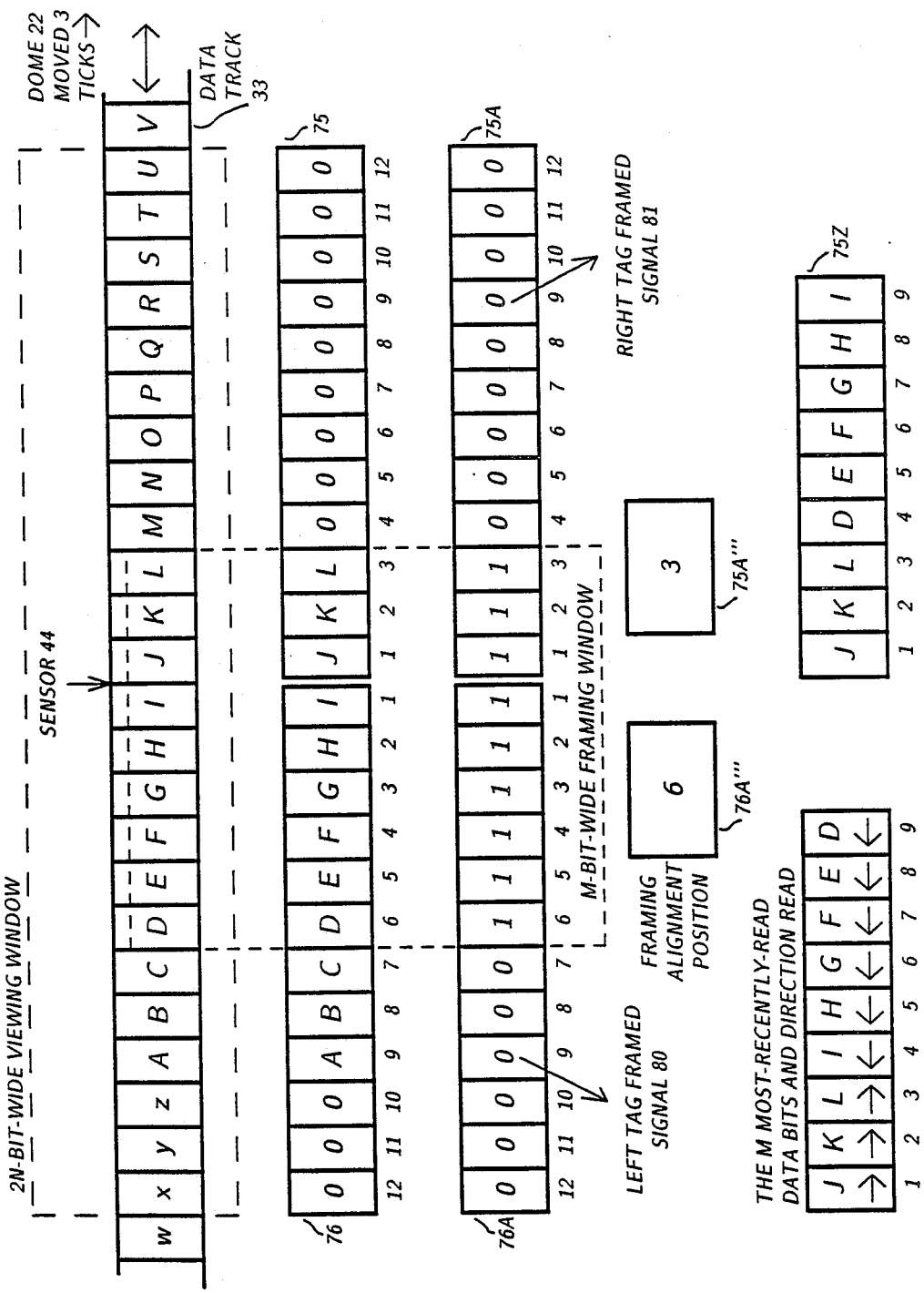

FIGS. 29 to 38 show the respective state of the system after each one of a sequence of motions of the dome 22. FIG. 29 shows the state of the system at power-up, with all of the various functions cleared to zero. The rotatable dome 22 is shown positioned so that the boundary between the bit positions (on the data track 33) symbolized by the letters "M" and "N" is aligned with the stationary sensor 44 which reads the data track 33. FIG. 30 shows the state of the system after the dome 22 has rotated one incremental tick of motion to the right. The data bit position represented by the letter "M" has just moved past the senor 44, and is read (i.e., shifted right) into bit position 1 (i.e., the "centermost" bit position) of the dome right motion serial shift register function 75, and into the leftmost bit position of shift register function 75Z. Also, a one is shifted into the corresponding bit position of the dome right motion mask register function 75A, while the value of the dome right motion mask register function 75A''' is counted up to a value of one. In FIG. 31 the dome 22 has rotated 4 more ticks (i.e., 5 ticks since power-up), while in FIG. 32 it has rotated an additional 5 ticks (i.e., 10 ticks total). Note that in FIG. 32 the dome 22 has made sufficient motion following power-up to initialize the system, so that the "framing window" becomes defined. Accordingly, the "framing window" is shown starting with FIG. 32, and appears on all the figures that follow it. The remaining figures show the state of the system after further motions to both the right and the left.

After the dome 22 rotates at least M consecutive incremental ticks of motion to the right (FIG. 32), then the M-bit-wide "framing window" is aligned with the leftmost-M bits of the right shift register function 75. (This corresponds to the bit positions normally connected to the right tag decoding function 83). Any further rotation of the dome 22 to the right (FIG. 33) will not change the alignment of the "framing window". If the dome 22 now reverses direction and rotates left (FIG. 34), the M-bit-wide "framing window" will move left one bit position within the 2N-bit-wide "viewing window" (i.e., within the shift register function set 76-75) for each incremental tick of motion the dome 22 moves left, and will temporarily straddle the boundary between shift register functions 76 and 75 (See FIGS. 34 and 35). After the dome 22 rotates at least M consecutive incremental ticks of motion to the left, the M-bit-wide "framing window" is aligned with the rightmost-M bits of the left shift register function 76 (this corresponds to the bit positions normally connected to the left tag decoding function 82), and the "framing window" no longer straddles the boundary between shift register functions 76 and 75 (See FIG. 36). Any further rotation of the dome 22 to the left will not change the alignment of the "framing window" within the "viewing window" (See FIG. 37).

If the alignment of the "framing window" on the leftmost-M bit positions of the right shift register function 75 is defined as the reference position (i.e., position 0), and the alignment of the "framing window" on the rightmost-M bit positions of the left shift register function 76 is defined as position M (e.g., position 9), then the set of all permitted alignments of the "framing window" within the "viewing window" can be identified by the set of alignment positions zero to M (e.g., 0 to 9).

An up/down counter function (similar in operation to the up/down counter functions described in an earlier section) may be used to keep track of the alignment position of the "framing window" within the "viewing window". Such a counter function is zeroed on power-up, and is counted up (to a maximum value of M, e.g., 9) for each incremental tick of motion the dome 22 rotates left, and counted down (to a minimum value of zero) for each incremental tick of motion the dome 22 rotates right. The value in this "alignment position" up/down counter gives the alignment position of the "framing window" within the "viewing window", and corresponds to the number of bits to the right the "framing window" must be shifted to align it to the reference alignment position (i.e., position 0).

It should be noted that the above-described "alignment position" up/down counter function operates identically to the left mask register up/down counter function 76A''' described in an earlier section. Accordingly, that counter function 76A''' may also be used to keep track of the alignment position of the "framing window" within the "viewing window".

In an earlier section that discussed approaches to improving redundancy during direction reversals, the concept of the snapshot shift register function set 76'-76' was first introduced, and a preliminary procedure described for selecting the set of M consecutive data bits from the function set 75'-75' to present to a common tag decoding function 83' (i.e., a procedure for aligning "framing window" to the reference position). However, it was pointed out that that preliminary procedure would not function correctly in the general case where the width in bits N of the shift-register-based mask register functions 76A and 75A exceeded the value M. The problem with that preliminary procedure results from the fact that the shift-register-based mask register function 76A does not accurately measure the alignment position of the framing window (in the case where N exceeds M) because the function 76A is allowed to accumulate more than M consecutive one bits. This is analogous to the mask register up/down counter function 76A''' counting up past the value M, since the number of consecutive one bits in mask register function 76A parallels the value contained in the mask register up/down counter function 76A'''.

Figure 25:
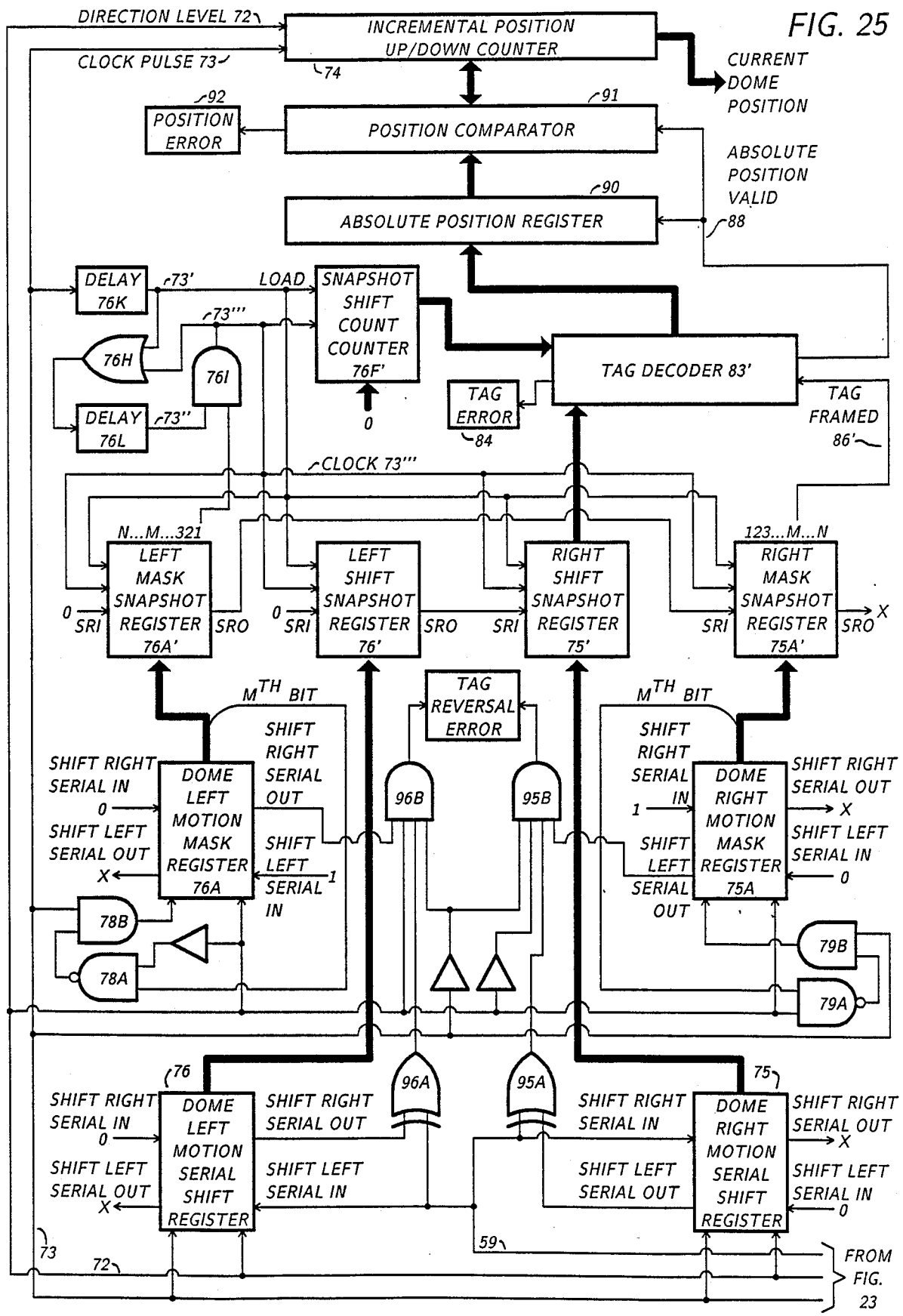

If the shift-register-based left mask register function 76A can be constrained from accumulating more than M consecutive one bits, then it may be used to accurately measure the alignment position of the framing window. In the special case where N equals M, the width of the left mask register function 76A itself provides this constraint. In the general case where N exceeds M, the constraint may be implemented by using the output of the Mth bit position from the right edge of the left mask register function 76A to disable shift clock pulses from reaching function 76A when the dome 22 rotates left. This is accomplished as follows:

As illustrated in FIG. 25, the output of the Mth bit position from the right edge of left mask register function 76A is connected to one input of a 2-input NAND gate function 78A, whose other input is connected to an inverted version of the direction level signal 72 (which is high when the dome 22 rotates left). The output of this NAND gate function 78A is connected to one input of a 2-input AND gate function 78B, whose other input is connected to the clock pulse signal 73. The output of AND gate function 78B is connected to the shift clock input of left mask register function 76A. Thus, when the dome 22 rotates left, as soon as M one bits have shifted left into the left mask register function 76A, the output of the Mth bit position from the right edge of function 76A goes high. Since the dome 22 is rotating left, the output of NAND gate function 78A goes low. As a result, AND gate function 78B inhibits further clock pulse signals 73 from reaching the shift clock input of the left mask register function 76A as long as the dome 22 continues rotating left. When the dome 22 rotates right, the output of NAND gate function 78A goes high, so that AND gate function 78B allows subsequent clock pulse signals 73 to reach the shift clock input of the left mask register function 76A.

With the addition of NAND gate function 78A and AND gate function 78B, the left mask register function 76A is constrained so that it will never contain more than M consecutive one bits, and these M one bits will be positioned in the rightmost-M bit positions of the left mask register function 76A. Hence, the leftmost N minus M bit positions of the left mask register function 76A will always contain zero. With these modifications in place, the left mask register function 76A correctly measures the alignment position of the M-bit-wide framing window, and the preliminary procedure (presented in an earlier section) for aligning the framing window to the reference position functions correctly. Further, that procedure may be simplified to eliminate the explicit test for the occurrence of M shifts.

Additional improvements result from the addition of NAND gate function 78A and AND gate function 78B. With these gate functions added, the Mth bit position from the right edge of the left mask register function 76A acquires added significance, namely, the output of this bit position can be used directly to indicate when the M data bits most recently read from the data track 33 are contained within the rightmost-M bit positions of left shift register function 76. This is in fact the exact condition desired for selecting data bits for presentation to the tag decoder function 82. As a result, the output of the Mth bit position from the right edge of the left mask register function 76A may be used to generate a more accurate version of the "left tag framed" signal 80 that was previously generated by the framing gating function 78. Thus, the framing gating function 78 may be folded into the operation of the left mask register function 76A (and its associated gate functions 78A and 78B), and the M-bit-wide AND gate previously used to implement the framing gating function 78 may be eliminated.

A similar simplification can be achieved for the right side by connecting a NAND gate function 79A and AND gate function 79B to the right mask register function 75A. In this case, the output of Mth bit position from the left edge of right mask register function 75A may serve as the "right tag framed" signal 81, and is connected to one input of the 2-input NAND gate function 79A. The other input to NAND gate function 79A is connected to the direction level signal 72, which is high when the dome rotates right. The output of NAND gate function 79A is connected to one input of the 2-input AND gate function 79B, whose other input is connected to the clock pulse signal 73, and whose output is connected to the shift clock input of the right mask register function 75A. The M-bit-wide AND gate previously used to implement the framing gating function 79 may be eliminated as well.

With the addition of the NAND gate functions 78A and 79A, and AND gate functions 78B and 79B, there is now a clear analogy between the operation of the shift-register-based mask register functions 75A and 76A, and the up/down-counter-based mask register functions 75A''' and 76A'''. In each case, a "tag framed" signal is used to inhibit a corresponding mask register function from either counting up past the value M, or from shifting in more than M one bits.

An alternative system that provides full redundancy during direction reversals

Figure 26:
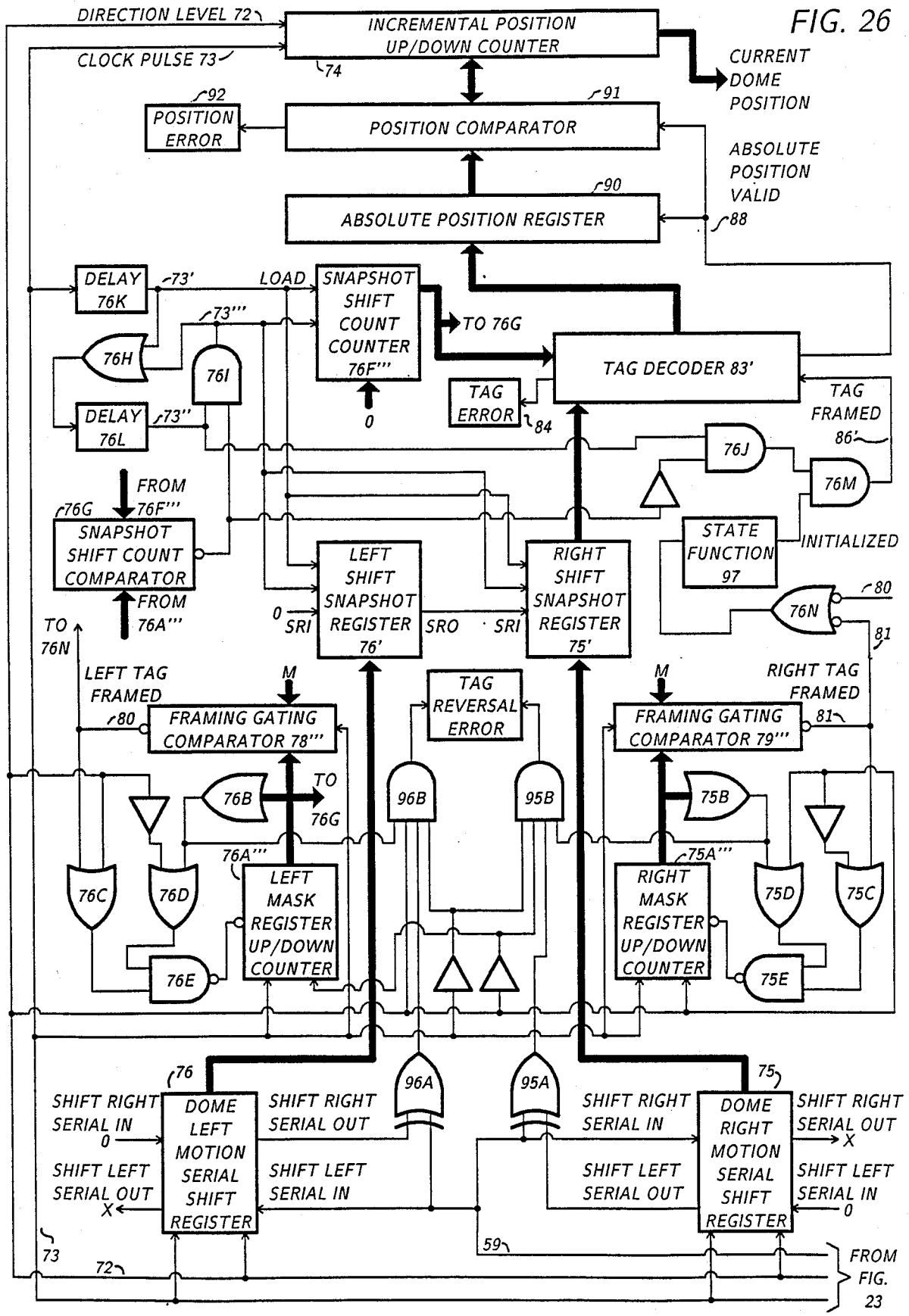

This section describes an alternative implementation of the system as shown in FIG. 26, which once properly initialized, provides full redundancy (i.e., it decodes a newly obtained absolute position tag 36 on each incremental tick of motion), even during direction reversals. This implementation employs a specific combination of some of the alternative functions described in earlier sections. In particular, it employs the "snapshot" shift register functions 76' and 75' (but not the "snapshot" mask register functions 76A' and 75A'), the mask register up/down counter functions 76A''' and 75A''' (plus the associated gating functions 76B to 76E, and 75B to 75E), the framg gating functions 78''' and 79''', a common tag decoding function 83', a new "snapshot shift count" counter function 76F''' and comparator function 76G (plus associated gating and delay functions 76H to 76N), and a new "initialization state" function 97. This implementation eliminates the need for separate left side and right side tag decoding and error checking functions (82 and 83), and also eliminates the need for either an absolute position multiplexer 87 or absolute position tag multiplexer 87'. The included functions are connected to each other, and to the remaining standard functions 75, 76, and 90, as follows:

The parallel outputs of the standard left and right shift register functions 76 and 75 are connected to the parallel inputs of the corresponding "snapshot" shift register functions 76' and 75'. The snapshot shift register functions 76' and 75' are used to make an instantaneous copy, or snapshot, of the contents of the standard shift register functions 76 and 75, respectively. The snapshot functions 76' and 75' (which may be implemented using unidirectional shift register functions, since they only need to shift right) are connected in cascade (i.e., the shift right serial ouput (SRO) of the snapshot function 76' is connected to the shift right serial input (SRI) of the snapshot function 75'.) The leftmost-M bits of the right snapshot shift register function 75' (which correspond to the reference alignment position of the "framing window") are connected to the parallel input of the common tag decoding and error checking function 83'. The direction input (if any) of the snapshot shift register functions 76' and 75' is permanently set so that these shift register functions always shift to the right.

The parallel output of the left mask register up/down counter function 76A''' (which keeps track of the alignment position of the "framing window") is connected to the left framing gating function 78''', to OR gate function 76B, and to one set of the parallel inputs to the "snapshot shift count" comparator function 76G. (The associated gating functions 76B to 76E are connected to function 76A''' as described in an earlier section.) The other set of parallel inputs to the "snapshot shift count" comparator function 76G is connected to the parallel output of the "snapshot shift count" counter function 76F''''. The parallel output of function 76F'''' is also connected to the "alignment position" input of the tag decoder function 83'. The parallel inputs to counter function 76F'''' are all tied low, so that a pulse on the "load" input of counter function 76F'''' will clear the counter to zero. The right mask register up/down counter function 75A''', its associated gating functions 75B to 75E, and its corresponding right framing gating function 79''', are all connected as described in an earlier section.

The left tag framed signal 80 (generated by the left framing gating function 78'''), and the right tag framed signal 81 (generated by the right framing gating function 79''') are ORed together in OR-gate function 76 and used to set the "initialization state" function 97 (which may be implemented as a flip-flop) to the "initialized" (or "set") state; the function 97 is cleared to the "uninitialized" (or "clear") state on power-up.

The clock pulse signal 73 is connected to the shift clock inputs of the shift register functions 76 and 75, to the clock inputs of the mask register up/down counter functions 76A''' and 75A''', and to a delay function 76K. The delay function 76K (which may be implemented using one shot multivibrator functions) produces a delayed clock pulse signal 73', the amount of the delay providing sufficient time for the shift register functions 76 and 75 to shift, and the mask register up/down counter functions 76A''' and 75A''' to count.

The delayed clock pulse signal 73' is connected to the "load" input of the "snapshot shift count" counter function 76F'''' (to allow counter function 76F'''' to be cleared to zero), and to the "load" input on the snapshot shift register functions 76' and 75' (to allow functions 76' and 75' to take a snapshot of shift register functions 76 and 75, respectively). The delayed clock pulse 73' is also connected to one input of a 2-input OR gate function 76H, whose output is connected to the input of another delay function 76L. The delay function 76L (which may also be implemented using one shot multivibrator functions) produces a doubly-delayed clock pulse signal 73'', the amount of the delay providing sufficient time for the counter function 76F'''' to be cleared or counted, and sufficient time for the snapshot shift register functions 76' and 75' to be loaded or shifted.

The doubly-delayed clock pulse signal 73'' is connected to one input of a 2-input AND gate function 76I, whose other input is connected to the active-low "equal-to" output of the "snapshot shift count" comparator function 76G. The output of AND gate function 76I (which is high during the clock signal 73'' if the contents of the "snapshot shift count" counter function 76F'''' does not equal the framing alignment position contained in the left mask register up/down counter function 76A''') is connected to the shift clock input of the snapshot shift register functions 76' and 75', the count clock input on counter function 76F'''', and to the other input of the 2-input OR gate function 76H (whose output, as described earlier, is connected to the input of delay function 76L). The doubly-delayed clock pulse signal 73'' is also connected to one input of a 2-input AND gate function 76J, whose other input is connected to an inverted version of the "equal-to" output of the "snapshot shift count" comparator function 76G.

The output of AND gate function 76J (which is high during the clock pulse signal 73'' if the contents of the "snapshot shift count" counter function 76F'''' equals the framing alignment position contained in the left mask register up/down counter function 76A''') is connected to one input of a 2-input AND gate function 76M, whose other input is connected to the output of the "initialization state" function 97. The output of AND gate function 76M (which is high during the clock pulse signal 73'' if in the "initialized" state and if the framing window in the snapshot shift register function set 76'-75' is aligned to the reference position) is connected to the "tag framed" input of the tag decoder function 83'.

This alternative system operates as follows:

On power-up, the standard shift register functions 76 and 75, snapshot shift register functions 76' and 75', and left and right mask register up/down counter counter functions 76A''' and 75A''' are all cleared to zero, and the "initialization state" function 97 set to the "uninitalized (or "clear") state.

After the dome 22 rotates M consecutive incremental ticks of motion either direction, either a left tag framed signal 80 or a right tag framed signal 81 is generated by the respective framing gating function 78''' or 79''', thus setting the "initialization state" function 97 to the "initialized" state. From that point on, for each incremental tick of motion (i.e., for each clock pulse 73), the following operations are performed:

The clock pulse signal 73 causes the shift register functions 76 and 75 to shift, and the mask register up/down counter functions 76A''' and 75A''' to count, as described in earlier sections.

The delayed clock pulse signal 73' (produced by the delay function 76K) triggers the "snapshot shift count" counter function 76F'''' to be loaded with zeroes, and the snapshot shift register functions 76' and 75' to be loaded with the contents of the shift register functions 76 and 75, respectively.

The doubly-delayed clock pulse signal 73" (produced by the delay function 76L), is gated with the active-low "equal-to" output of the "snapshot shift count" comparator function 76G by AND gate functions 76I and 76J. If the framing window in the snapshot shift register set 76'-75' is already aligned to the reference position (i.e., the contents of "snapshot shift count" counter function 76F'" equals the contents of the left mask register up-/down counter function 76A'"), then AND gate functions 76J and 76M will produce a "tag framed" signal 86', triggering the tag decoder function 83' to attempt decoding of the potential tag 36 framed in the referenced alignment position (i.e., leftmost-M bit positions) of the right snapshot shift register function 75'.

Otherwise, if the framing window is not aligned (i.e., the contents of "snapshot shift count" counter function 76F'" does not equal the framing alignment position contained in the left mask register up/down counter function 76A'"), then AND gate function 76I will generate a clock pulse signal 73'", causing the snapshot shift register function set 76'-75' to shift right one bit position, and causing the "snapshot shift count" counter function 76F'" to count up one count.

Clock pulse signal 73'" is also connected to feed back into the second input of 2-input OR gate function 76H (whose first input, as described earlier, is connected to the output of delay function 76K, and whose output is connected to the input of delay function 76L), thus retriggering delay function 76L, and producing another doubly-delayed clock pulse signal 73". This retriggered clock pulse signal 73" in turn triggers AND gate functions 76I and 76J to re-test the "equal-to" output of the "snapshot shift count" comparator function 76G. If the output of the comparator function 76G is "not-equal", then AND gate function 76I generates another clock pulse signal 73'", again causing the snapshot shift register set 76'-75' to shift right one bit, and causing the "snapshot shift count" counter function 76F'" to count up one count.

This cycle of clock pulse signal 73" alternating with clock pulse signal 73'" will continue to repeat until the contents of counter function 76F'" equals the contents of counter function 76A'", thus indicating that the alignment of the framing window to the reference position is complete. Once the alignment is complete, AND gate function 76I will cease generating any further clock pulse signals 73'", and AND gate functions 76J and 76M will generate the "tag valid" signal 86' to activate the tag decoder function 83'.

At the conclusion of this alignment process, the leftmost-M bits of the right snapshot shift register function 75' (i.e., the bits of the aligned "framing window") are applied to the parallel input of the common tag decoding and error checking function 83'. If the applied bits correspond to a valid tag 36, that tag 36 is decoded into an absolute position. The tag decoder function 83' then adjusts this absolute position to compensate for the "framing window" alignment by subtracting off (modulo J) the value of the "framing window" alignment position contained in the snapshot shift count counter function 76F'" and supplied to the "alignment position" input of the tag decoder function 83'. The adjusted absolute position is then fed from the parallel output of the tag decoder function 83' directly to the absolute position register 90. The tag decoder function 83' generates an "absolute position valid" signal 88, triggering the absolute position register 90 to latch the adjusted absolute position, and triggering the position comparator 91 to make a comparison.

A few variations may be applied to this system. First, as shown in FIG. 25, one may replace the up/down-counter-based mask register functions (75A'" and 76A'") and comparator based framing gating functions (79'" and 78'") with their corresponding shift-register-based mask register functions (75A and 76A); the mask register functions 75A and 76A, when used with the corresponding gating functions 79A, 79B, 78A, and 78B, provide the framing gating functions 79 and 78 as well. Such a system would also include the snapshot mask register functions 75A' and 76A' (connected in cascade), the "snapshot shift count" counter function 76F', gate functions 76H and 76I, and delay functions 76K and 76L. In this system, the parallel output of the "snapshot shift count" counter function 76F' connects directly to the "alignment position" input of a common tag decoder function 83'. Also, the output of the "snapshot shift count" comparator function 76G is replaced by the output of the rightmost bit position of the left snapshot mask register function 76A'. Finally, the snapshot mask register functions 76A' and 75A' receive the clock pulse signal 73' on their respective "load" inputs, and the clock pulse signal 73'" on their respective shift clock inputs.

This shift-register-based system operates as follows:

The clock pulse signal 73' produced by the delay function 76K clears the "snapshot shift count" counter function 76F' to zero, triggers the snapshot shift register functions 76' and 75' to latch the contents of the corresponding shift register functions 76 and 75, and triggers the snapshot mask register functions 76A' and 75A' to latch the contents of the corresponding mask register functions 76A and 75A, respectively. When the output of the rightmost bit position of the left snapshot mask register function 76A' is low, this indicates (just like a low output from the comparator function 76G) that the framing window in the snapshot shift register set 76'-75' is aligned to the reference position. If the output of this bit position is high (indicating the framing window is not yet aligned), it causes AND gate function 76I to generate a clock pulse signal 73'", triggering the snapshot register functions (76', 75', 76A', 75A') to shift right one bit, and the "snapshot shift counter" function 76F' to count up one count.

The clock pulse signal 73'" feeds back through OR gate function 76H to retrigger the delay function 76L, which produces another clock pulse signal 73". Successive cycles of clock pulse signal 73" alternating with clock pulse signal 73'" will eventually result in the alignment of the framing window to the reference position, and "snapshot shift count" counter function 76F' will contain a count of the number of shifts that were required to achieve alignment. The output of the Mth bit position from the left edge of the right snapshot mask register function 75A' is used as the "tag framed" signal 86', which triggers the tag decoder 83' to attempt decoding of the tag 36. The tag decoder 83' uses the "snapshot shift count" value from the counter function 76F' (which it receives via its "alignment position" input) to adjust the decoded absolute position to compensate for the shift in framing alignment.

Another variation involves implementations in which the serial shift register functions are in fact implemented as circuit simulations executed by the program of a microcomputer 70. In such cases, it may be possible to directly extract the desired bits from the "framing window" (using some type of bit-field extraction instructions), without the need to shift the "framing window" into the reference alignment position.

Other variations involve mechanisms for computing the adjustment to the decoded absolute position in those implementations where subtraction modulo J is not easily implemented directly. In such cases, the unadjusted absolute position (obtained from the "table lookup" phase of the tag decoder 83' operation) may be copied into a new up/down counter function equal in width to the up/down counter function 74. This new up/down counter function is then decremented (i.e., counted down) by the value of the "framing window" alignment position contained in the left mask register function up/down counter function 76A'''. The new counter function would be constrained to count modulo J in the same manner that counter function 74 is so constrained, as described in an earlier section of this specification.

In all of the various implementations described in this section, it is assumed that the time required to align the "framing window" and decode the tag 36 into an adjusted absolute position is extremely short relative to the period between incremental ticks. If the motion of the encoder band is sufficiently fast that this is not the case, then the implementations described in the previous sections may be preferred, since they require less time to process each tick.

An alternative implementation providing full redundancy during direction reversals and employing a common shift register function 75Z and snapshot function 75Z'

Figure 28:
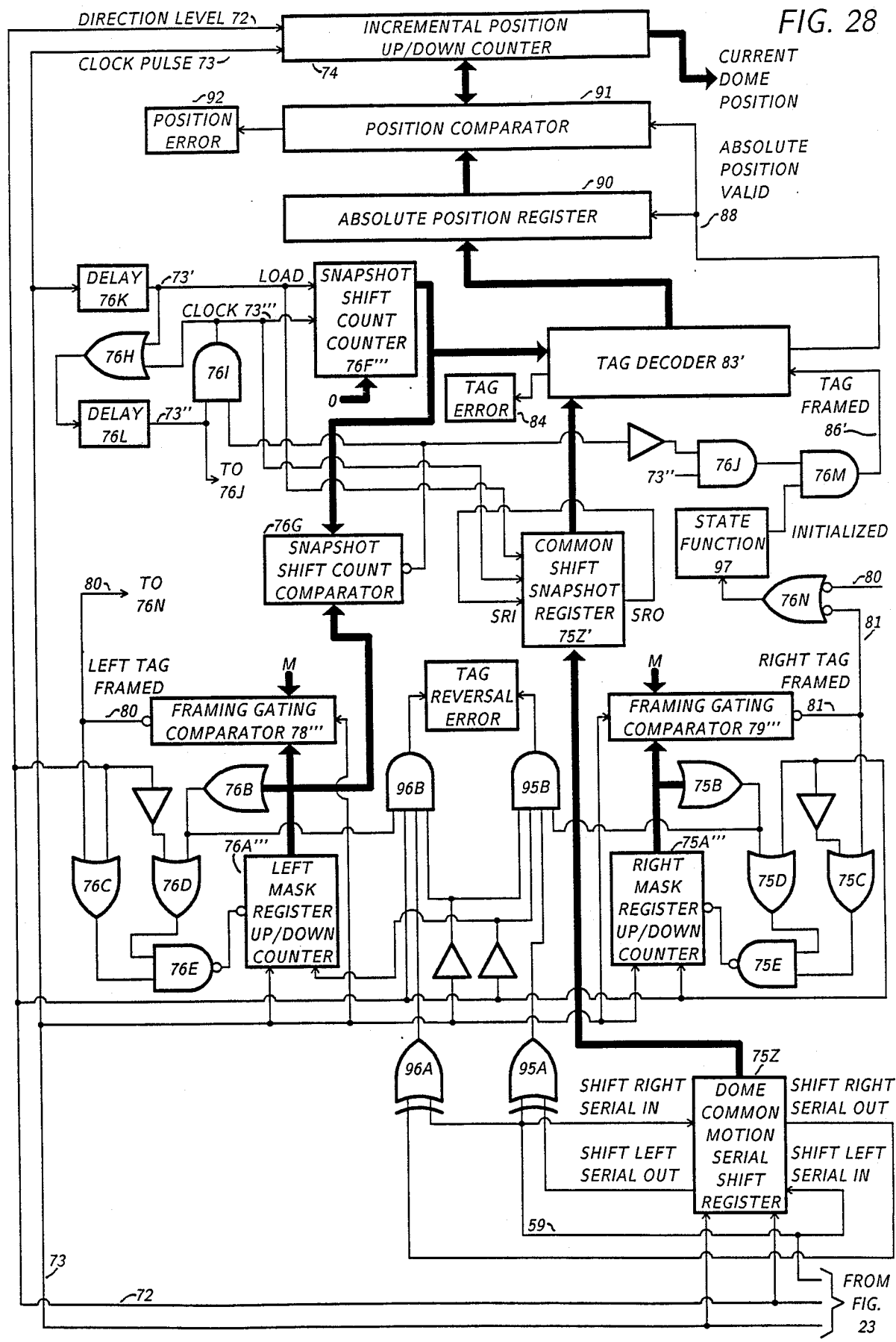

An alternative implementation, shown in FIG. 28, represents a blend of the implementations illustrated in FIGS. 26 and 27. Like the system of FIG. 27, the system shown in FIG. 28 employs only a single (common motion) shift register function 75Z. Like the system of FIG. 26, the system of FIG. 28 employs a snapshot shift register function 75Z', shift count counter function 76F'''', snapshot shift count comparator function 76G, and common tag decoder function 83' to provide decoding of tags 36, even during direction reversals.

The system of FIG. 28 functions essentially the same as that of FIG. 26, except for the following differences. First, it eliminates the left motion serial shift register 76 and its corresponding left shift snapshot register 76'. Second, the shift right serial output (SRO) of the common shift snapshot register function 75Z' is fed back into the shift right serial input (SRI) of function 75Z' As a result, shift right operations on function 75Z' result in an effective "rotate right" operation, with the rightmost-bit of register function 75Z' rotating into the leftmost-bit of function 75Z'.

As was noted in the description of the system shown in FIG. 27 (and illustrated in FIGS. 34, 35, and 38), the contents of register function 75Z are scrambled during direction reversals. However, as can be seen from the examples shown in FIGS. 34, 35, and 38, by rotating the contents of register function 75Z to the right by the number of bit positions indicated by the framing alignment position (as provided by functions 76F'''' or 76A'''), the contents are effectively unscrambled. Since the snapshot function 75Z' takes a snapshot of shift register function 75Z, rotation of the contents of the snapshot function 75Z' provides this descrambling function. Also, the rotation operation always insures that the unscrambled tag 36 ends up in the leftmost-M bit positions of the snapshot register function 75Z', and it is these bit positions that are connected to the tag decoder function 83'. Thus, the number of bits N in shift register function 75Z may exceed M (e.g., 9) provided that all N of these bits are connected to the parallel input of the snapshot register function 75Z'.

Some alternative dome and track structures

Figure 11:
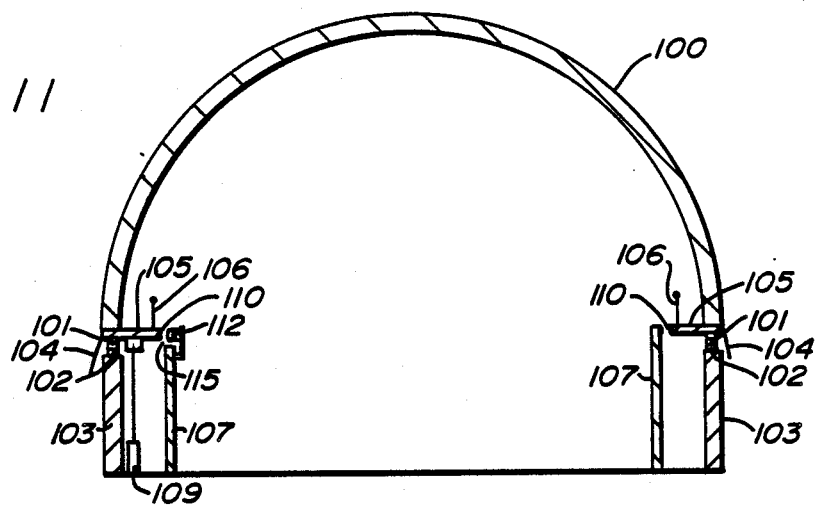
FIG. 11 is a simplified view in elevation and in section of an observatory dome having an alternative form of encoding system embodying the principles of the present invention.

First alternative structure (FIGS. 11 and 12):

FIG. 11 shows a dome 100 mounted by wheels 101 on a rail 102 supported by a stationary cylindrical concrete wall 103. There is an exterior shroud 104 to shield the interior of the domed structure from the weather. The dome 100 has a walkway 105 with a railing 106, and below the inner edge of the walkway 105 there may be a sheetrock wall 107. Slip rings 108 transfer electricity onto the moving dome 100 from an electrical panel 109.

A reflective encoder-band 110 is attached, preferably with glue, to a vertical edge 111 of the rotating walkway 105. A read head 112, like the read head 40, is rigidly mounted by a fixed portion 113 to the sheetrock wall 107, with a parallelogram linkage portion 114 joining the movable part of the read head 112 to the fixed portion 113. There is an opening 115 cut at the top of the sheetrock wall 107 to make the encoding band visible to the read head 112. The wheels and pivoting block of the read head 112 have been omitted from FIGS. 11 and 12, for the sake of clarity.

This system functions almost exactly like that described previously.

Figure 12:
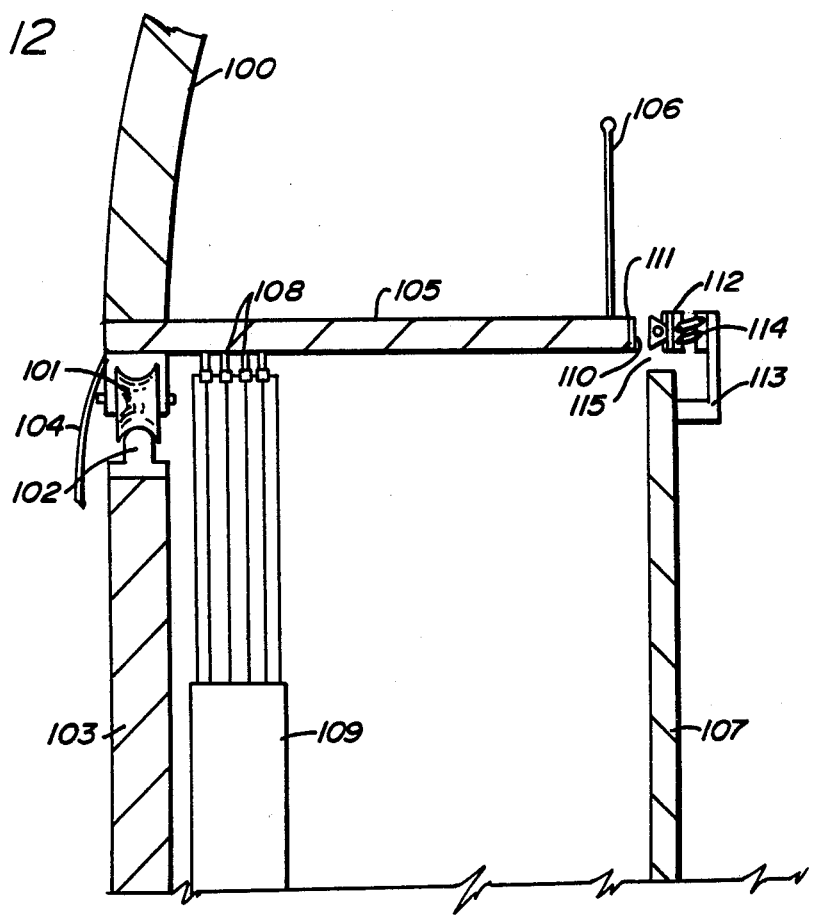
FIG. 12 is an enlargement of a portion of the dome of FIG. 11 and pertinent encoding system.
Figure 13:
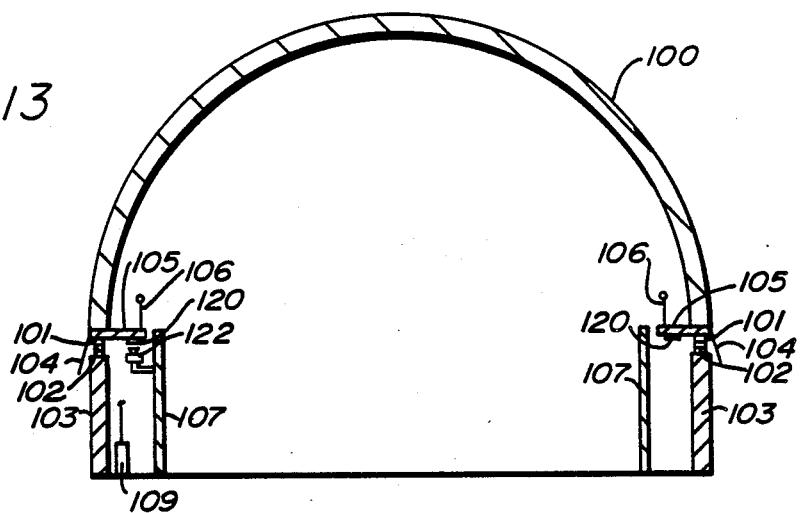
FIG. 13 is a view similar to FIG. 11 of a dome with a modified form of encoding system according to this invention.
Figure 14:
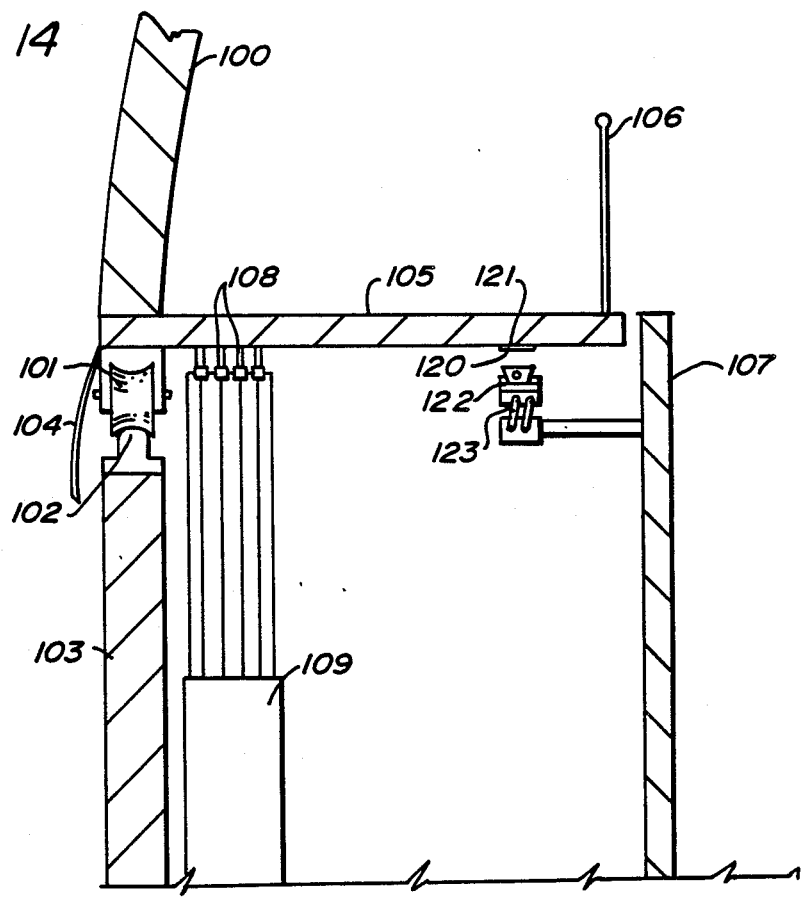
FIG. 14 is an enlargement of a portion of FIG. 13.

Second alternative structure (FIGS. 13 and 14):

In the structure shown in FIGS. 13 and 14, an annular flat encoder band 120 is placed on an horizontal surface 121 (see FIG. 14) on the bottom of the walkway 105 (or other rotating part of the dome 100, provided that such a surface is available and accessible), rather than on the inside vertical surface as in FIGS. 11 and 12. In this configuration, a read head 122 is mounted underneath the walkway 105, and its optical sensors look up at the encoder band 120 above. As a result, radial run-out in the dome 100 does not change the spacing between the up-looking read head 122 and the encoder band 120, and thus does not cause the optical sensors 42, 43, and 44 to go in and out of focus. Rather, radial run-out of the dome 100 causes a motion of the encoder band 120 in the plane of dome rotation and perpendicular to the direction of rotation. This motion can be accommodated by making each of the two (timing and data) tracks wider in the direction corresponding to this motion (i.e., the direction perpendicular to the direction of rotation.) Thus, in this configuration, the read head 122 can be rigidly mounted if the dome 100 in question exhibits *only* radial run-out and is not subject to other mechanical anomalies in its rotation.

Another advantage of this location is that it may provide an easier way for coping with domes which exhibit both axial and radial run-out. For such domes, if the encoder band 110 is mounted vertically, as shown in FIG. 12, the side-looking read head assembly 112 requires two separate parallelogram linkages 45 (one to compensate for the radial run-out and the other to compensate for the axial run-out) operating at right angles. (On the read head used for the encoder on the dome of the Lick 1-meter telescope, only a single parallelogram linkage 45 is needed since this dome has negligible axial motion but does have significant radial run-out.) If, instead, the encoder band 120 is mounted horizontally, as shown in FIG. 14, the up-looking read head assembly 122 requires only a single parallelogram linkage 123 to compensate for axial run-out. The radial run-out is handled as described in the previous paragraph. Note that in FIGS. 13 and 14, the wheels and pivoting block of the read head 122 have been omitted from the drawings, in the interest of clarity.

Locating the encoder band under the rotating part of a dome 100 does have some disadvantages. A major disadvantage of this configuration is that the encoder band 120 and read head 122 are located in a dirtier environment where they may be exposed to oil and lubricants from the dome "trucks" and dome drive motors. Another disadvantage is that the segments of the encoder band 120 become sectors of an annular ring, rather than segments of a cylinder. Thus, apparatus such as mylar strips used to form the band 120 may need to be printed as slightly curved pieces, the degree of curvature depending on the radius of the encoder band. This is easily accomplished, since the patterns for the mylar strips may be computer generated. However, it might be more difficult to apply the layer of aluminized mylar tape to the curved segments of mylar since curved segments of aluminized tape are not presently readily available. This can be compensated for by using extra tape to cover the rectangular area which bounds the curved segment.

Fortunately, the curvature problem becomes less pronounced as the radius of the encoder band 120 increases, and for large domes the curvature of each segment may be sufficiently small so that the band can be assembled from straight segments. In this case, instead of forming a perfect circle, the encoder band 120 forms an "N" sided polygon. For a dome comparable in size to the one on the Lick 3-meter telescope, "N" would be about 350 if a 10-inch segment size is used. A 350-sided polygon looks very much like a circle.

Figure 17:
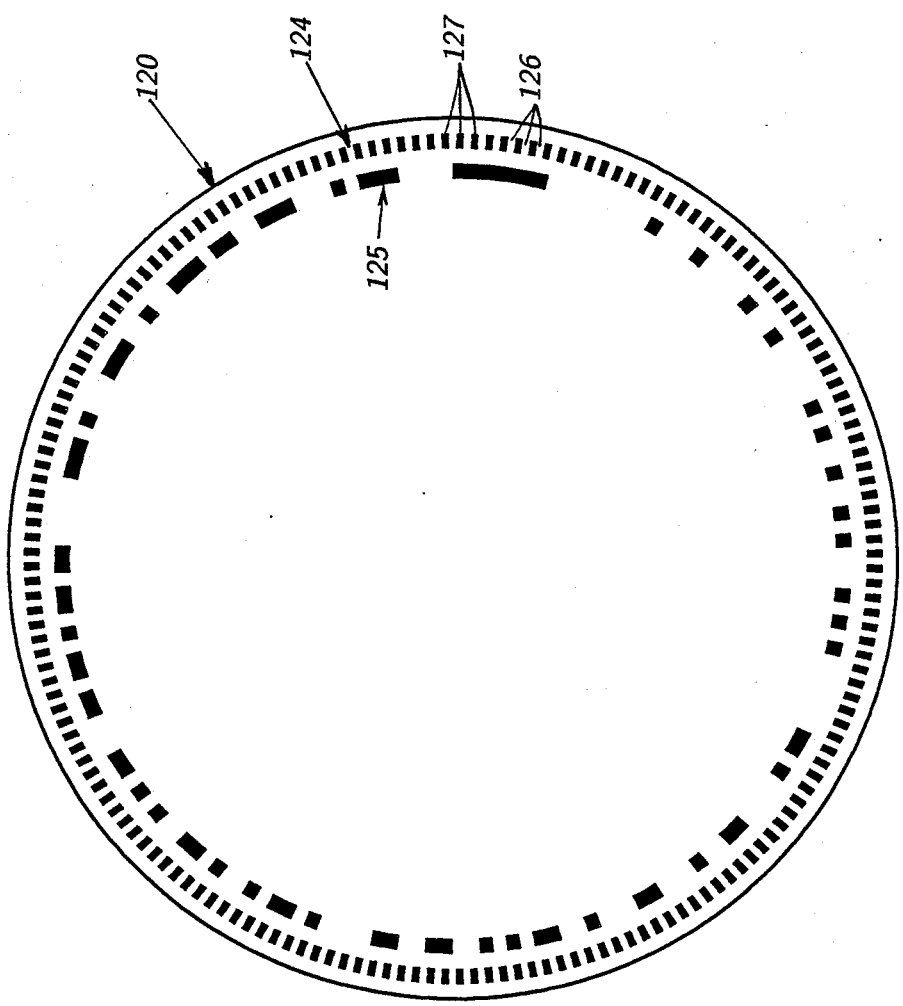
FIG. 17 is a plan view of a glass disk having a pattern for an incremental-absolute optical rotary encoder embodying the principles of the invention.

A flat band type of encoding track (FIG. 17):

For use in a structure like that of FIGS. 13 and 14, a band pattern 120 like that shown in FIG. 17 may be used. There is an outer circle providing a timing track 124 and an inner circle providing a data track 125. The timing track 124 alternates reflective stripes 126 with non-reflective stripes 127, while the data track has a chain code sequence.

This pattern 120 may comprise an annulus. Also, for somewhat smaller encoders, it may be placed on a glass disk.

Figure 15:
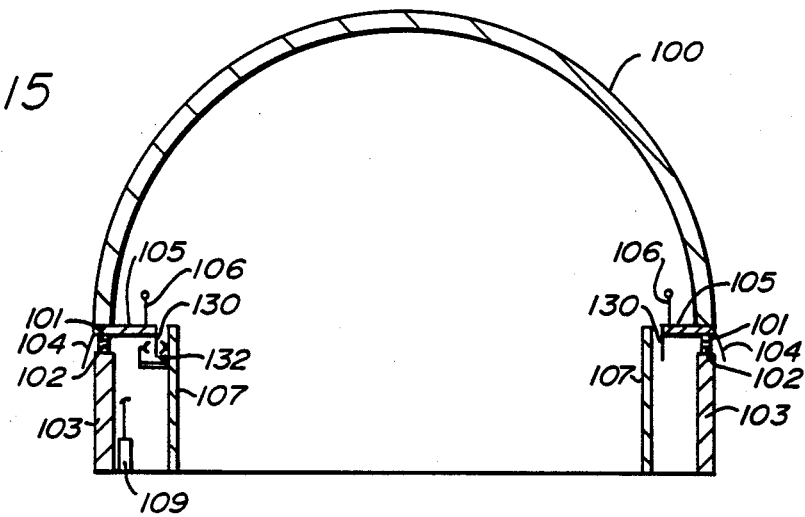
FIG. 15 is a view simiar to FIGS. 11 and 13 of a dome with yet another form of encoding system embodying the invention.
Figure 16:
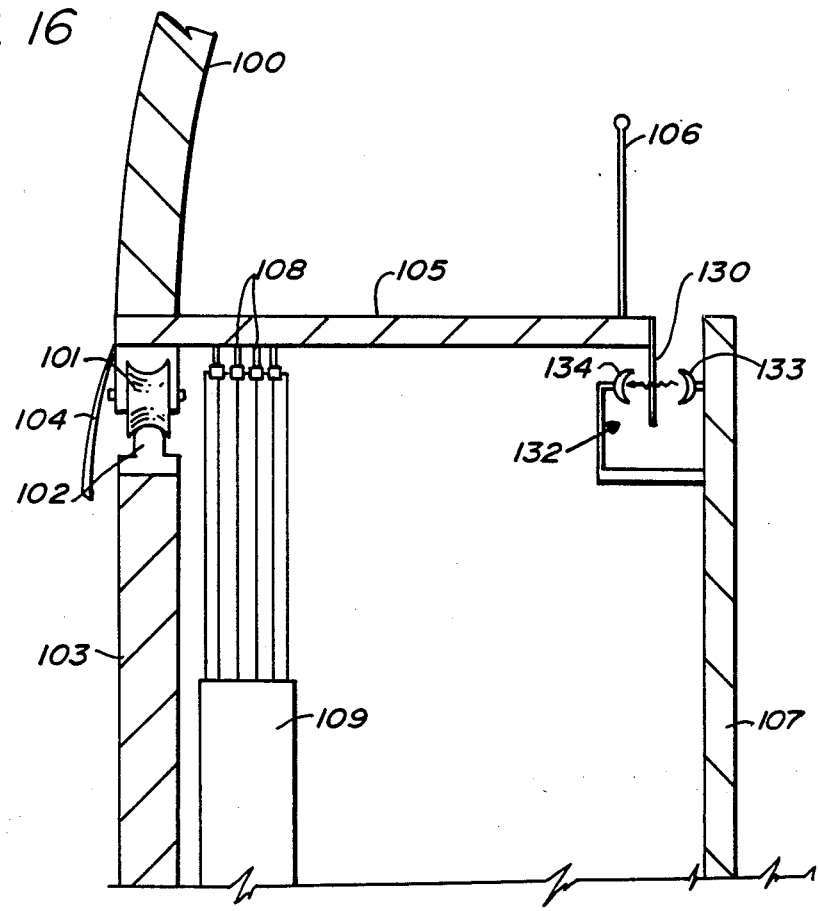
FIG. 16 is an enlargement of a portion of FIG. 15.

Third alternative structure—FIGS. 15 and 16:

In the third alternative implementation, illustrated in FIGS. 15 and 16, a transmissive band 130 is used in place of a reflective one. The transmissive band 130 may be hung like a skirt from the bottom of the walkway 105 or other rotating part of the dome 100. This may be accomplished on a dome such as that of the Shane 3-meter telescope by gluing the ½-inch upper margin of 3-inch high by 10-inch long mylar strips, which are used to form the band 130, onto the bottom ½-inch of the inner vertical surface of the walkway on the rotating part of the dome. Each of the three optical sensors 134 (only one of which is shown in FIGS. 15 and 16) in the read head assembly 132 is composed of two physically separate parts. Each sensor's light source 133 may be on the radially inner side of the band 130 and aimed outwardly, while the optical detector 134 may then be on the other, radially outer, side of the band 130 and aimed inwardly. By using a reasonably fast, well-focused beam, the depth of focus can be made very large. Thus, the image of the band 130 on the optical sensor 134 remains in focus, regardless of radial or axial run-out, or vertical warping. Accordingly, both parts of the optical sensor 133, 134 can be rigidly mounted, so that the only moving part of the encoder is the dome 100. Further, there is *no* physical contact between the fixed read head 132 and the rotating dome 100 and its encoder band 130. The only "contact" is the optical sensor's light beam passing through the transmissive band 130. Finally, using a transmissive band 130 rather than a reflective one eliminates the need for the layer of aluminized mylar tape, thus removing the cost of this material and the labor to apply it to the mylar strips.

The main disadvantage of this scheme is that the mylar strips, which are far from rigid, are literally dangling in the air, and are thus vulnerabe to damage. This may be solved by gluing the mylar strips onto a clear but rigid material, such as Plexiglas, which is in turn rigidly mounted to the dome 100 itself. Alternatively, if computer-controlled milling equipment is available, the encoder band 130 may be made from strips of inexpensive aluminum stock, which may then be rigidly mounted to the dome 100. The patterns, instead of being printed on mylar would instead be cut as holes in the aluminum, and the logical sense of the signals complemented.

Another disadvantage is that the optical sensors 134 for the read head 132 which scans the transmissive band 130 may not be as readily available nor as inexpensive as those used in a read head 40 or 112 for scanning a reflective band 110 or 120.

Because the "dangling transmissive band" scheme eliminates any physical contact between the read head 130 and the surface being encoded, it may also be useful in encoder applications where one must tolerate radial and/or axial run out of the encoder band surface but cannot tolerate the mechanical/frictional drag created by an encoder pick-off or read head assembly which does make contact. While this is not a concern for massive objects like telescope domes, it may be a concern when measuring the position of low-mass, low-inertia rotating devices that spin on high-quality bearings.

Some Advantages of the Invention

This system of the present invention has several advantages over the more traditional solution of mechanically coupling a rotary encoder to the dome. To start with, mechanical complexity is reduced by eliminating most moving parts, such as pinch rollers, chains, sprockets, and reducing gears. If the dome 22 does not suffer from warping or run-out (either radial or axial) that causes the motion of the encoder track surface 31, 111, or 121 to exceed the depth of focus of the optical sensors 42, 43, and 44, then the read head 40 or 112 or 122 can be completely stationary. In this case, the parallelogram linkage 45 or 114 or 123 can be eliminated, and the block 47 need not pivot. The dome 22 itself will be the only moving part in the system, and all mechanical connections between the read head 40 or 112 or 122 and the dome 22 will be eliminated.

Otherwise, out-of-round domes are readily taken care of by the parallelogram linkage 45, in conjunction with the wheels 48 and 49, together with their tires 50 and 51. Similarly, warped tracks are taken care of by mounting the block 47, which holds the sensors 42, 43, and 44, so that it pivots vertically to compensate for the vertical warping.

Another advantage of the encoder of this invention is that a gear reduction is not required, as is the case of an absolute rotary encoder coupled to the dome. A gear reduction is expensive and is also a significant source of error. If the gearing does not produce the exact reduction required, a rotary encoder will incur a small incremental error on each rotation. Then, as said above, if the dome is rotated repeatedly in the same direction, this incremental error accumulates and may grow unacceptably large. Additional errors result from mechanical backlash in the gears. These errors are eliminated by the present invention.

Another advantage of this system is that it overcomes a number of the deficiencies inherent in other proposed encoder designs.

U.S. Pat. No. 3,531,798 (Dureau) proposes the use of a cyclic code on the data track of a dual track encoder. An adjacent timing track provides clock pulses to control the sampling of the data track, and to step a cyclic code generator which generates a sequence of codes identical to those on the data track; the output of this generator is compared to the codes read from the data track in order to detect reading errors.

However, unlike the hybrid encoder of this invention, the device proposed by Dureau provides no mechanism for handling bi-directional motion of the encoder, nor any explicit method for translating the code values from the data track into position values. Neither does it provide any explicit mechanism for correcting reading errors, or of detecting the failure of one of its signal channels. Neither does it provide both incremental and absolute positions.

U.S. Pat. No. 3,702,471 (Kennedy et al.) proposes the use of a relatively complex system in which a data track containing chain codes and an adjacent timing track are both either actively scanned by a moving light beam, or read by multiple sensors arranged in parallel. The devices proposed by Kennedy et al. do provide for bi-directional motion, and for converting the codes read from the data track into position values. Further, these devices provide absolute position information without the need for any initializing motion.

However, the devices proposed by Kennedy et al. require either multiple sensors in parallel, or a single sensor employing some type of active scanning or sweeping, in order to read the data track, while the hybrid encoder of this invention requires only a single, non-scanning sensor. Also, unlike the encoder of this invention, the devices proposed by Kennedy et al. provide no mechanism for detecting the failure of one of its signal channels. Further it would be difficult to modify existing optical incremental encoder packages to employ the system proposed by Kennedy et al.

U.S. Pat. No. 3,982,106 (Stutz) proposes a dual track encoder in which the unique spacing between any pair of adjacent marks on a data track conveys absolute position information about each such otherwise identical mark, while an adjacent timing track scanned by sensors in quadrature provides incremental position. The absolute position provided by the unique spacing between the marks on the data track is used to initialize the incremental position, and subsequently to cross-check it. This rather elegant design provides for bi-directional operation, and for both incremental and absolute position indications. Further, conventional optical incremental encoders could be modified to employ the system proposed by Stutz.

However, unlike the hybrid encoder of this invention, the Stutz device cannot provide absolute position information at regular intervals along the data track, nor can it initialize the incremental position after reading only a single mark or tag. Neither can it detect the failure of a single sensor channel. Also, the "error correcting" scheme Stutz employs for resetting the incremental position after encountering a mark from the data track can often lead to magnification of a small incremental error into a much larger one.

U.S. Pat. No. 4,628,298 (Hafle et al.) proposes three different devices. The first employs a single data track containing a chain code sequence, and an adjacent timing track used in reading the data track. However, like the device proposed by Dureau, this first device is not capable of measuring bi-directional motions.

The second device proposed by Hafle et al. is a bi-directional encoder that uses two data tracks, each containing a chain code sequence, and two timing tracks (arranged in quadrature) which are used to control the sampling of adjacent data tracks and to determine which direction the encoder is rotating. Only one data track is used at a time, with one data track used for clockwise motions and the other used for counterclockwise motions. Based on the discussion (page 5, line 57 through page 6, line 12 of the Hafle et al. patent) which immediately precedes the definition of the two data tracks (page 6, line 13 through page 6, line 16 of the Hafle et al. patent) one might conclude that the chain code sequences on the two data tracks are in fact mirror images of each other.

The Hafle et al. patent does not describe the relationship between the chain code sequences on their two data tracks 34 and 36, (their numbers) nor does it indicate whether they are the same sequence or different sequences. Neither does the Hafle et al. patent explicitly demonstrate that an appropriate arrangement of chain code sequences on the two data tracks does in fact exist. In particular, they do not demonstrate that a consistent reading of code cycles is obtained during a direction reversal. The Hafle et al. patent merely asserts (in claim 8, page 16, lines 65–66) that the first chain code sequence is " . . . valid for a first direction of rotation . . . " (e.g. clockwise), and further asserts (in claim 8, page 16, line 67 through page 17, line 1) that the second chain code sequence is " . . . valid for a direction of rotation which is opposite the first direction of rotation . . . " Because the relationship between the chain code sequences on the two data tracks is never defined, it is difficult to determine exactly how Hafle et al. intended this device to operate.

However, based on the described operation of the shift registers used to accumulate the data read from the two data tracks, it appears that the chain code sequences on the two data tracks are not mirror images of each other, but are in fact identical. The only difference between the two data tracks appears to be that the corresponding code cycles (of the otherwise identical chain code sequences they contain) are azimuthally offset relative to each other by an amount equal to the width in bits N of the shift register used to assemble the data read from the two data tracks.

If the above-described configuration of the two data tracks is in fact what Hafle et al. intended, then such an implementation may offer little improvement over an implementation containing only a single chain code data track read by two different sensors (one sensor for clockwise rotations, the other for counterclockwise)

spaced N code cycles apart. (Such an implementation was previously described in an earlier section of this specification.) The only advantage their implementation may offer is that it may be less susceptible to thermal or vibration induced variations in the spacing between the two sensors, provided that the sensors for the two data tracks are physically locked together in the same mount. However, this improvement is offset by the added complexity of the second data track. Further, the need to switch back and forth between these two data tracks whenever the direction of rotation is reversed is a potential source of problems, and may impose very tight alignment, spacing, and skewing tolerances on the two data tracks and the sensors that scan them.

The third device proposed by Hafle et al. uses a single track on which the data and clock pulses are combined by using clock signals of varying duty cycle to encode that data. However, this device is not truly bi-directional, since it must be provided with an external level to inform the encoder logic as to the direction of rotation. Further, this device cannot handle discrete, non-continuous motions, due to the nature of the phase lock loop it uses to synchronize to the variable duty cycle clocks generated by the data track.

Thus, unlike the hybrid encoder of this invention, none of the three devices proposed by Hafle et al. provide for truly bi-directional (discrete and continuous) motion using only three sensors and three tracks. Neither do any of these devices provide both incremental and absolute position information, nor are any of them capable of diagnosing the failure of a single sensor channel.

U.S. Pat. No. 4,633,224 (Gipp et al.) proposes the use of a conventional gray code multi-track absolute encoder combined in a common package with a conventional single-track incremental encoder. This device provides both absolute and incremental position indications, and can measure bi-directional motions.

While the device proposed by Gipp et al. uses the absolute portion of the encoder to detect and correct errors incurred by the incremental portion, it provides no explicit method either for detecting or correcting reading errors in the absolute portion of the encoder. Neither does it provide any explicit method for detecting single-channel failures. Finally, the absolute portion of the encoder requires multiple data tracks, as opposed to the single data track required by the hybrid encoder of this invention.

Automatic Detection of Errors

The encoder of this invention provides redundancy, and this enables the hybrid encoder to provide automatic detection of errors, because, unlike most encoders, there is redundant information which is cross-checked. Without some type of redundancy, it is very difficult to detect, diagnose, or correct errors.

In conventional optical incremental encoders, it is often difficult to detect spurious counts that occur as a result of dust or scratches on the glass disk of the encoder, dimming of the encoder's light source, or electrical noise. While the use of digital noise filtering in the quadrature decoding circuitry of such encoders (as provided by integrated circuits such as the HCTL-2000 Quadrature Decoder/Counter Interface IC by Hewlett-Packard Corporation of Palo Alto, California) may reduce the likelihood of such errors, it may not eliminate them completely. Incorrect position information has thus tended to go undetected. These problems have occurred many times during use of such encoders.

Similar problems can occur with absolute encoders as well, although these could be reduced by the addition of some redundancy in the form of a parity track. However, the addition of such a track would cut the available resolution of the encoder in half.

Gray-code absolute encoders provide some error detecting capability, because on any incremental step only a single bit should make a transition. Thus, if more than one bit changes at once (as might happen if there were dust, scratches, or electrical noise), then a Gray-code encoder can signal an error. On the other hand, if a given bit or group of bits get stuck in one state (as would happen if a light source dimmed or burned out, or a light sensor failed), those bits will make no transitions. Thus for some motions of the encoder, no motion will be reported and no error will be detected.

In the hybrid (absolute and incremental) encoder of this invention, the comparison of redundant sources of information greatly increases the likelihood that most typical malfunctions which will cause an error will be reported. Scratches, dust, or electrical noise affecting the signal from the data track 33 will result in the corruption of an absolute position tag 36. This will cause either a tag validity error or adjacency error to be reported, and the tag 36 to be rejected. The addition of check bits 38 to the tag 36 of the hybrid encoder does not cut the encoder's resolution in half (or more), since (unlike the case of the absolute encoder) it does not require the addition of separate tracks. Rather, since all the tags 36 and check bits 38 are embedded within the same chain code sequence 37, the check bits 38 for a given tag 36 will be contained within some other, subsequent tag 36. Thus, the addition of check bits 38 does not reduce the number of tags 36 that can be contained within the chain code sequence 37 on the data track 33, and therefore has no negative impact on either the absolute or incremental resolution of the hybrid encoder.

The only costs imposed by the addition of the check bits 38 is the addition of C extra bits to the shift register functions (75 and 76), mask register functions (75A and 76A), framing gating functions (78 and 79), and the tag decoder functions (82 and 83), plus any additional logic required to process the check bits 38. Since shift registers and gates are often sized in multiples of 4 or 8 bits, the C extra bits required by the shift register and gating functions in some cases may already be present, and thus cost nothing.

The additional logic required to process the check bits 38 depends on the number of bits C used for the check bits 38 and the complexity of error detection (and correction) to be performed. An additional bit added the address of the entries in the look-up table which performs the tag decoding function (82 or 83), thus doubling the number of entries in the table. The index into this table is formed by appending the single check bit 38 onto the pattern of bits of its corresponding tag 36. At least half of the entries in this look-up table correspond to combinations of tags 36 and check bits 38 which are not to be found within the chain code sequence 37. These entries contain a special value used to signal a tag validity error. The remaining entries in the look-up table correspond to valid combinations of tags 36 and check bits 38, and contain the value of the absolute position of the tag 36 on the data track 33. Thus, the tag decoding and check bit processing operations are folded into a single table look-up operation.

Other methods, requiring less memory but more computations, may be used to perform the tag decoding and check bit processing (i.e., error checking) functions. In a first method, the tag decoding functions 82 or 83 would still be done using a conventional look-up table. The check bit 38 processing would be done by applying the logical functions used to generate the chain code sequence 37 to derive the correct pattern of check bits from the tag 36 obtained from the register 76 or 75. The derived pattern of check bits would then be compared to the check bits 38 actually read from the data track 33 and obtained from the register 76 or 75. If the derived pattern of check bits matched the check bits 38 obtained from the register 76 or 75, the tag would be considered valid and tag decoding would proceed. If a mismatch was detected, a tag validity error would be diagnosed, and tag decoding inhibited. Depending on the number of bits C in the check bits 38, and the nature of the logical functions used to generate the chain code, correction of the invalid tag might be possible, in which case tag decoding could still proceed.

In a second method, the bits corresponding to the chain code sequence 37 on the data track 33 may be stored in memory as a binary string. When the framing gating function 78 or 79 indicates a tag 36 is properly framed in register 76 or 75, a second, smaller binary string would be formed by appending the check bits 38 onto the pattern of bits of the tag 36. The larger, chain code binary string would then be searched to see if it contained a substring matching the second, smaller binary string formed from the tag 36 and check bits 38. If a match is found, the position of the substring within the larger chain code binary string can convey the absolute position of the tag 36 on the data track 33. If a match is not found, a tag validity error may be signaled. Error correction might be provided by searching the chain code binary string a second time, looking instead for substrings having a minimum hamming distance from the second, smaller string.

In addition to problems reading the signal from the data track, scratches, dust, or electrical noise can affect the signals from the timing track. This will usually result in corruption of the incremental position and sometimes in the corruption of a nearby absolute position tag 36, since errors on the timing track may cause incorrect shifting of the tag 36 into the shift registers 75 and 76. In either case, this will cause an error to be reported. If a tag 36 has been corrupted, either a tag validity error or adjacency error will be reported. Ultimately, when the next valid tag 36 becomes properly framed, a mismatch will be detected between the corrupted incremental position and the absolute position corresponding to the "properly framed" tag 36. This will cause a position mismatch error to be reported. The corrupted incremental position will then be corrected by resetting it to match the absolute position corresponding to the "properly framed" valid tag 36.

Figure 9A:
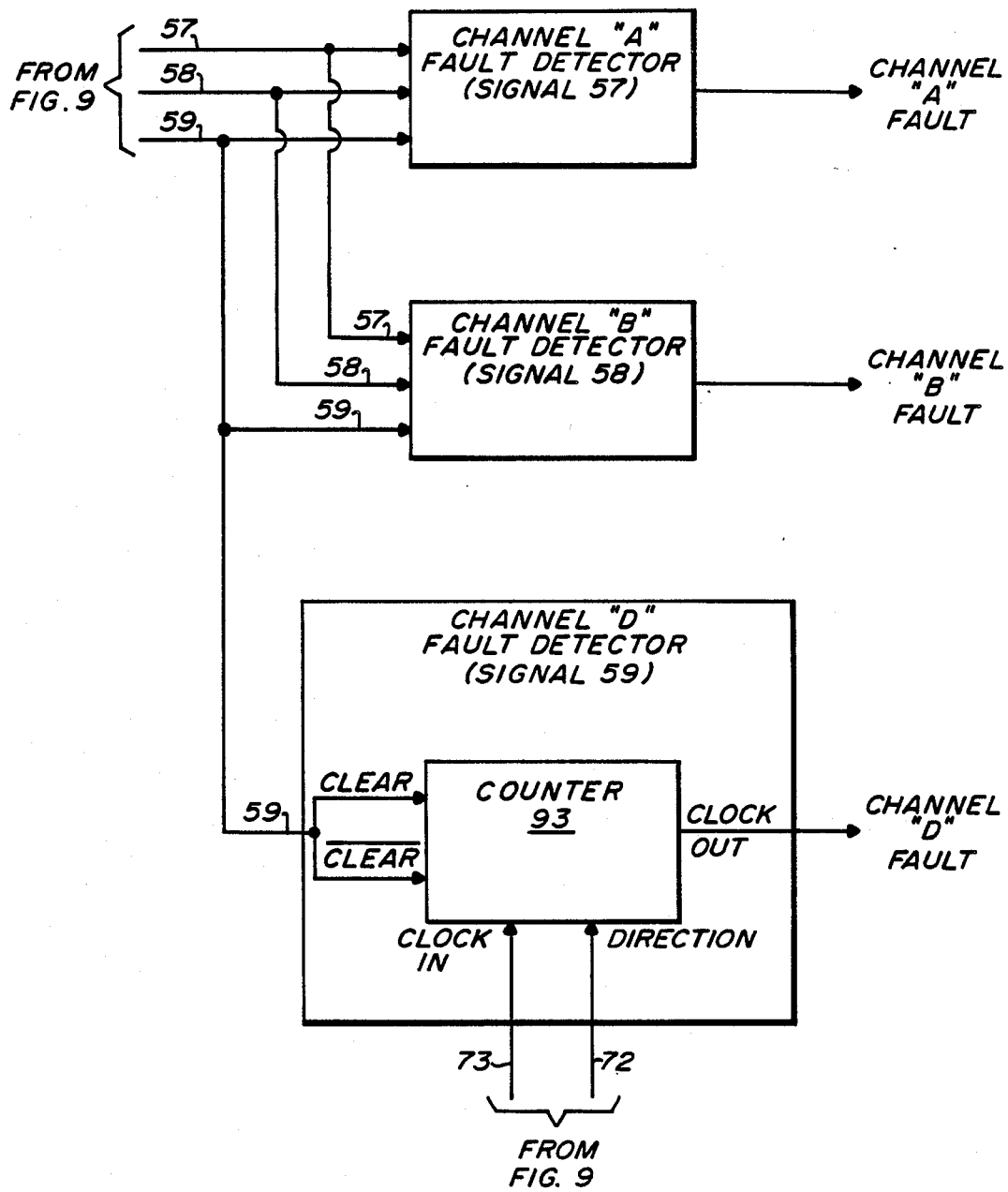
FIG. 9A is a continuation of FIG. 9, showing a fault detection system therefor.

Diagnosis of errors (FIG. 9A)

So far, it has been demonstrated how the hybrid encoder will detect most typical errors, but it has not been indicated how it can diagnose or isolate the cause of an error. For the types of errors discussed thus far (noise, scratches, dust), a precise diagnosis is not possible, although the different classes of error (tag validity error, adjacency error, tag reversal error, position mismatch error) help to isolate the probable causes.

For example, if some tags 36 repeatably read correctly while others repeatably cause errors, the problem is probably (although not necessarily) with the encoder track surface 31 and not with the read head sensors, electronics, or signal processing logic. Knowing which tags cause errors identifies where on the encoder track surface 31 scratches or dust might be. For non-repeatable errors, more likely causes are electrical noise or an incorrect mechanical adjustment of the read head assembly 40, which causes the optical sensors to drift in and out of focus.

There are, however, certain failure modes in which a more definite diagnosis can be made. In particular, failures of either the light source, light sensor, or associated electronics for one of the three signal channels (two channels "A" and "B" corresponding to the signals 57 and 58 from the timing track 32 and one channel "D" for the signal 59 from the data track 33 as shown in FIG. 9A) produce a recognizable signature which will point to the failed channel. The failed channel is located by comparing in pairs the signals from each of the three channels. If analysis of the signals from a given pair of channels indicates that the encoder is making significant motion (i.e., the incremental position is changing by more than a minimum amount, usually one count), and the signal from the third channel shows no transitions, then the signal from the third channel has failed.

In the case of the conventional incremental encoder, where there are only the two channels from the timing track, there is only a signal channel available to use to cross-check the opposing channel. (Note that many conventional incremental encoders have a third track which provides a single index pulse per revolution. However, since this pulse is generated so infrequently, it cannot be relied on for making a rapid diagnosis of the failure of the other channels.) A single channel cannot provide sufficient information to determine unambiguously whether or not the encoder is making a significant motion.

It is tempting to suggest that a fault could be detected simply by counting the signal transitions from each of the two channels, channel signal 57 and channel signal 58. If no transitions are seen on the channel signal 58 after some given number of transitions are seen on the channel signal 57, the conclusion could (erroneously) be made that the signal 58 has failed. Unfortunately, although this scheme will detect real failures, it will also erroneously detect failures where none has occurred. If the encoder is making a fine (i.e., the incremental position change is only one count or less) rocking motion back and forth across a single stripe on the timing track 32, then the signal 57 could produce many transitions without any transitions being generated from the signal 58, even though the signal 58 had not failed. Such rocking motions are indeed possible, particularly for domes and telescopes subjected to gentle wind buffeting.

In the case of the encoder of this invention, there is always sufficient information from any pair of channels to diagnose unambiguously a single-channel failure, (i.e., loss of the signal) from the third channel. Such failures are detected as soon as some minimal amount of motion actually occurs.

If the signal 59 from the single channel of the data track 33 fails, this can be detected quickly by using a second, smaller up/down counter 93. This counter 93 is clocked by the same direction level 72 and clock pulse 73 used by the incremental position up/down counter 74. This second up/down counter 93 is zeroed (cleared)

whenever any transition is detected on the signal 59. There should always be some transition detected from the signal 59 whenever the encoder moves an amount equal to the width of a tag 36. If this second up/down counter 93 counts (in either direction) a motion exceeding this amount and does not get reset to zero, then the signal 59 from the data track (channel D) has failed.

The signals 57 and 58 from the two channels (A and B) of the timing track 32 are equivalent with one exception. The transitions on the signal 59 are 225 degrees out-of-phase with those of the signal 57 and 135 degrees out-of-phase with those of the signal 58, as shown in FIG. 8. Clearly, the signal 57 is 90 degrees out-of-phase with the signal 58. Thus, phase information can be obtained by comparing any combination of two channels, and failures of the signals 57 and 58 (A or B) can be treated much the same.

If there is a failure of the signal 58, phase information can be recovered instead from the signal 59, although not as often, since the signal 59 makes transitions less often than the signal 58. Because of this phase relationship, any transitions from either of the signals 58 or 59 will occur between opposing transitions of the signal 57. If during the interval between two opposing transitions of the the signal 57, a transition is detected on the signal 59 but is not detected on the signal 58, then the signal 58 has failed.

Failures of the signal 57 can be dealt with in much the same way, since there is sufficient phase information from the other two channels to determine if significant motion has occurred. Any transitions of the signals 57 or 59 will occur between opposing transitions of the signal 58. If during the interval between two opposing transitions of the signal 58, a transition is detected on the signal 59 but is not detected on the signal 57, then the signal 57 has failed.

In summary, the hybrid encoder provides robust error detection and diagnosis through the use of redundant information, and does so, without compromising positional resolution, and without requiring additional optical or analog electronic components inside a conventional incremental encoder package.

Most encoders currently available (either incremental or absolute) do not provide this type of needed redundancy, and cannot detect whether they are malfunctioning.

The novel combination of incremental and absolute encoding

A distinctly novel feature of this invention is that the encoder combines the features of incremental and absolute encoders into a single system, using only three optical sensors 42, 43, and 44. This number is far fewer than the number of sensors normally used in absolute encoders alone. It is also the same number of sensors found in encoders which provide only incremental position plus a single index pulse. In fact existing incremental encoders can be redesigned to use this technique with only minimal changes to the encoder optics and geometry.

Figure 18:
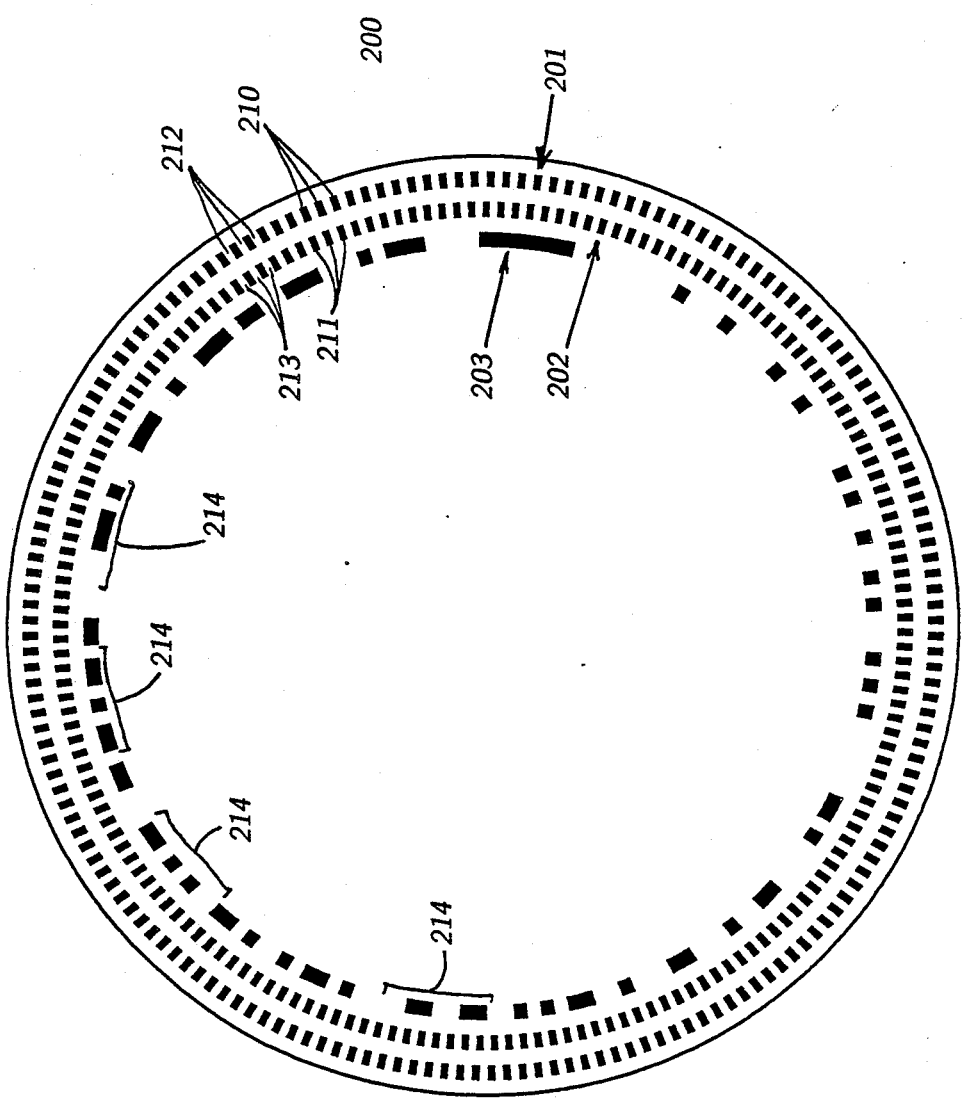
FIG. 18 is a plan view like FIG. 17 of a glass disk with a modified pattern for the rotary encoder.
Figure 20:
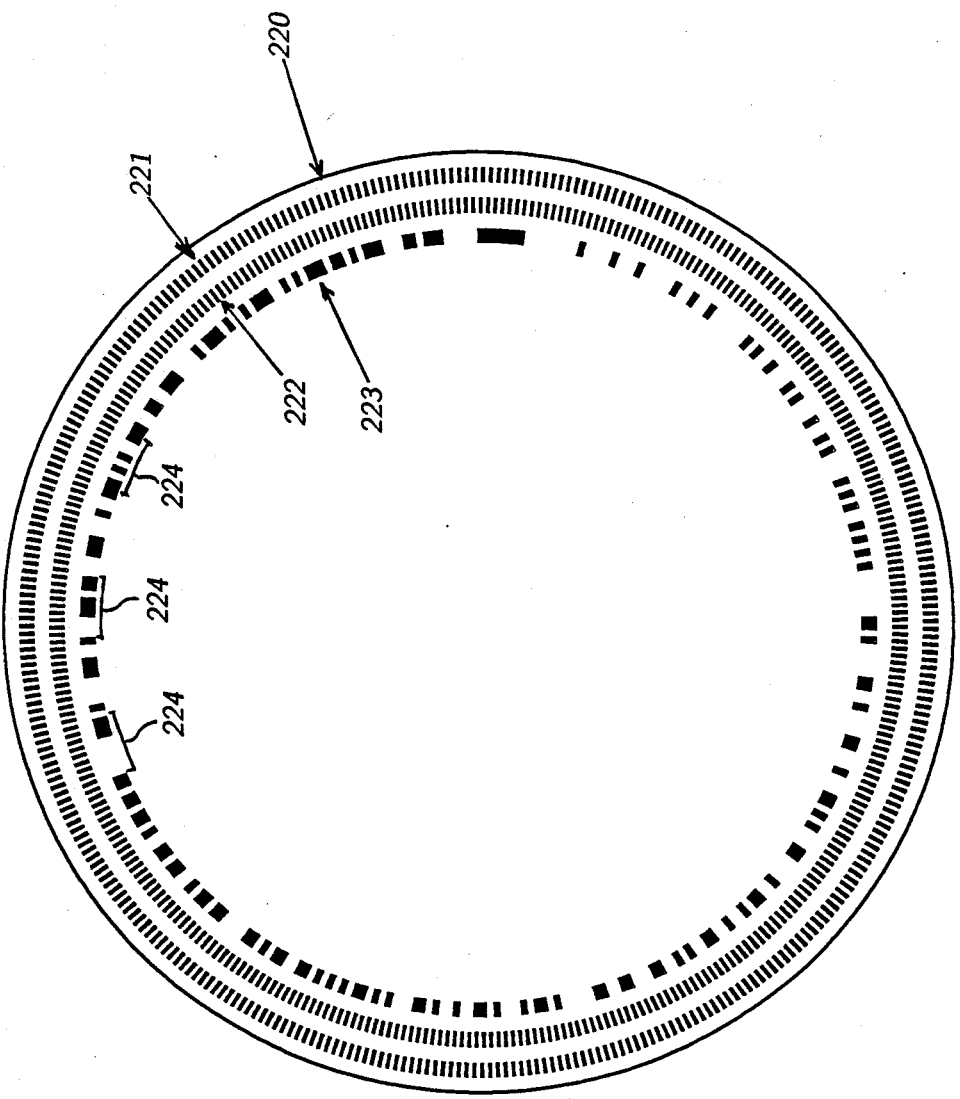
FIG. 20 is a view like FIG. 18, showing another modified pattern.

General Use Rotary Encoder (FIGS. 18-20)

The encoder of this invention may also be fabricated in a conventional rotary encoder package for general use, not just in telescope domes. This may be accomplished by converting the optical track which is normally used to provide a single index position into a data track for providing absolute position.

Conventional optical incremental encoders normally use two separate optical tracks as timing tracks, plus a third track if an index pulse is provided. Each of these tracks is scanned by its own optical sensor. The azimuthal alignment of the two timing tracks is arranged so that they are in spatial quadrature, i.e., the resulting signals are 90-degrees out-of-phase. The reason for using two separate tracks is that it allows the two optical sensors scanning these tracks to be mechanically locked together, thus eliminating the need for extremely precise mechanical adjustment of the spacing between the sensors and insuring that the phase relationship remains stable despite thermal variation or mechanical vibration.

In the specific implementation of the hybrid encoder heretofore described, only one optical track is used for the timing track 32. However, this single track is scanned by two optical sensors 42 and 43, and quadrature is achieved by adjusting the spacing between these two sensors 42 and 43. This can be done because the physical scale of the dome is so large, and consequently the spacing between stripes on the timing track is so coarse that the adjustments in the spacing of these two sensors required to achieve proper quadrature are correspondingly coarse. The pattern of FIG. 17 may be used on glass disks in appropriate cases.

In implementations in which finer incremental line spacings are required, as would be the case where a hybrid encoder is fabricated in a standard rotary encoder package, the adjustment of the spacing between these two optical sensors requires greater precision and stability than is usually possible. Therefore, if one were to make a hybrid encoder for a standard rotary encoder package, there should be two separate timing tracks with the azimuthal alignment of these two tracks providing the quadrature, as in a conventional incremental encoder and as shown in FIGS. 18 and 20.

FIG. 18 shows a transparent glass disk 200 having two timing tracks 201 and 202 and a data track 203. The timing tracks 201 and 202 are offset to provide quadrature. As FIG. 19 shows, light sources 204 and 205, respectively, are aligned radially with the tracks 201 and 202 and, as shown in FIG. 19, are on opposite sides of the disk 200 from their similarly aligned phototransistors 206 and 207. A light source 208 is used for the data track 203 and addresses a transistor 209. All of the light sources may be LED's or something else. (Note that while it may be possible to illuminate all three tracks 201, 202, and 203 using only a single light source, this is not desirable from the standpoint of redundancy and error detection, since a failure of such a single light source would completely disable the encoder and its failure detection mechanisms). FIG. 18 shows 180 incremental lines per revolution, giving an incremental resolution of two degrees. The respective dark stripes 210 and 211 of the tracks 201 and 202 are opaque and the respective clear strips 212 and 213 are transparent. The data track 203 has 180 absolute position tags 214 embedded within the 180 bit chain code sequence on the data track 203, giving an absolute resolution of two degrees.

FIG. 20 shows a similar glass disk 220 with two timing tracks 221 and 222 and a data track 223. Here there are 360 incremental lines per revolution, for an incremental resolution of one degree. There are 360 absolute position tags 224, for an absolute resolution of one degree. Typically, such glass disks may have thousands of incremental lines per revolution.

Figure 21:
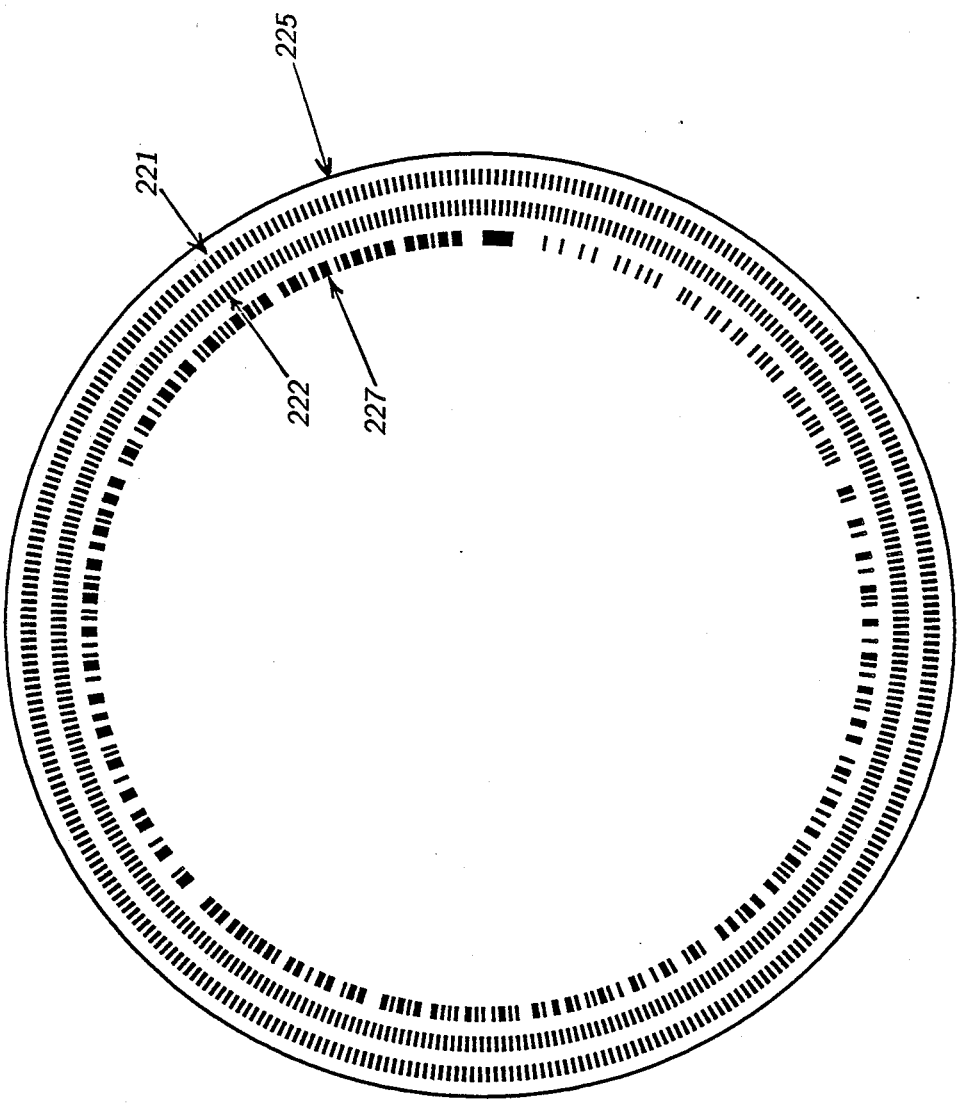
FIG. 21 is a view like FIG. 20 of a disk like that of FIG. 20 except that the data track is different in order to accommodate operation of its phase comparator at 2X the frequency used for the disk of FIG. 20.
Figure 22:
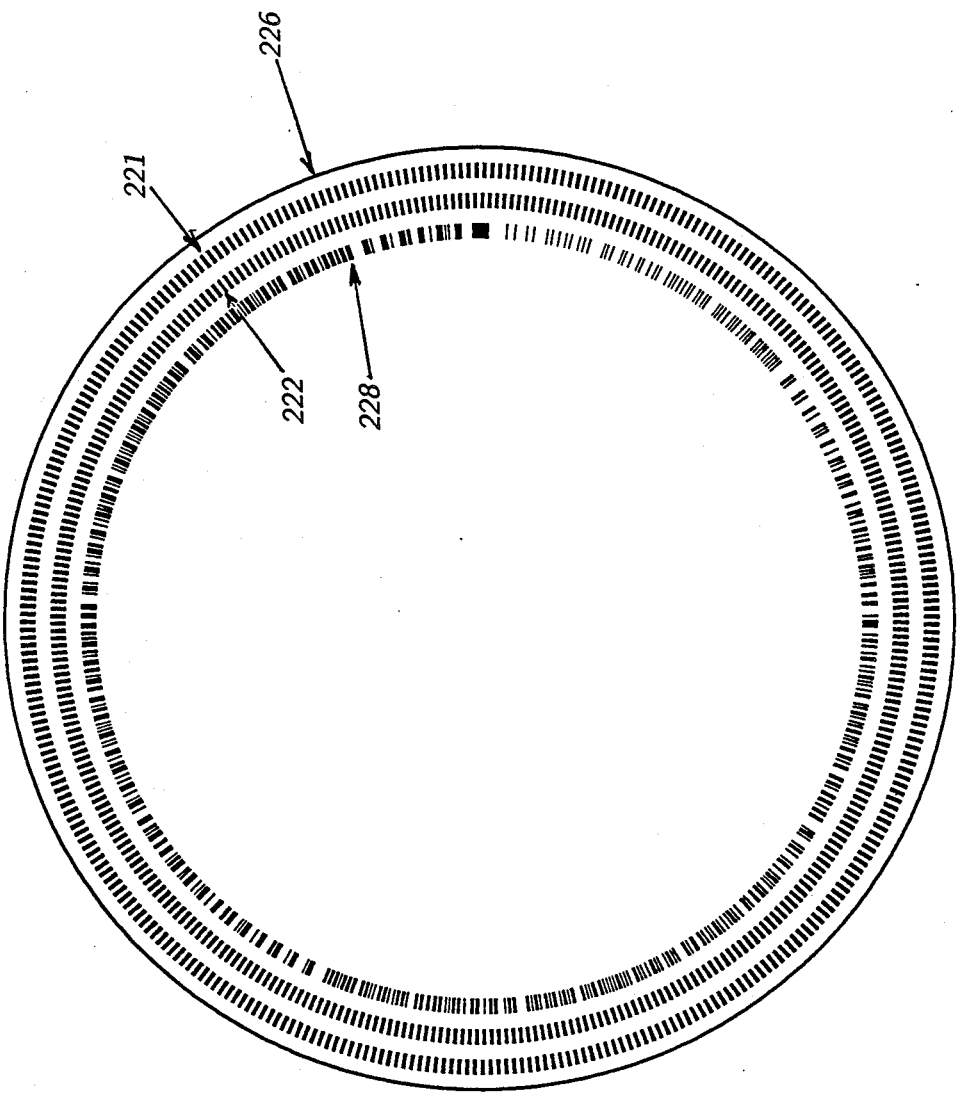
FIG. 22 is another similar view with a data track for use with a phase comparator operated at 4X the frequency used for the disk of FIG. 20.

As described earlier, incremental resolution can also be increased by operating the phase comparator 71 at either twice (2X) or four times (4X) the spatial frequency of the incremental lines on the timing track. These higher operating frequencies also yield a tighter packing of the bits of the chain code sequence 37 on the data track 33. Thus, both incremental and absolute resolution can be increased together. This i illustrated in FIGS. 21 and 22, which are identical to FIG. 20, except that they show, respectively, glass disks 225 and 226 designed for use with a phase comparator 71 operated at twice (2X) or four times (4X) the spatial frequency of the lines. Thus, while the timing tracks 221 and 222 are identical in FIGS. 20, 21, and 22, the data tracks 223 (FIG. 20), 227 (FIG. 21), and 228 (FIG. 22) are different, in accordance with the different frequencies involved.

If the optical sensor for the data track were to be locked in the same mounting with the sensors for the timing track, an azimuthal offset between the data and timing tracks would be needed to provide the phase difference required for detection of single channel failures.

In either case, whether one or two timing tracks are used, two sensors (two light sources 204 and 205 and two phototransistors 206 and 207) are always required for the incremental portion of the hybrid encoder, while a third sensor (light source 208 and phototransistor 209) is required for scanning the data track. Thus, while the complete hybrid encoder always requires exactly three optical sensors, the number of separate optical tracks may be either two or three depending on the specific implementation and the fineness of the incremental line spacing. Note that the number of optical sensors is the same number required for a conventional incremental encoder that provides only incremental position and a separate index pulse. Also note that unlike conventional absolute encoders, the number of optical sensors (three) and optical tracks (two or three) never increases beyond three, regardless of changes in the size or resolution of the encoder.

The only part that would need to be changed inside the rotary incremental encoder package itself would be to install the glass disk 200 or 220 in place of the conventional disk; the sensors and electronics for what was the index track should be usable for what would become the data track. All of the signal processing logic described above (the shift registers, up/down counters, etc.) could and probably should be located outside this package in a separate box.

FURTHER ADVANTAGES OF THE INVENTION (1) All forms of the invention provide both incremental and absolute position at regularly spaced intervals.

(2) All forms of the invention provide for bi-directional operation without the use of any externally generated direction information.

(3) All forms of the invention provide for position measurement of objects capable of both discrete and continuous motions in both directions.

(4) The incremental and absolute positions can be clocked by a phase comparator operating, e.g., at either once (1X), twice (2X) or four times (4X) the spatial frequency of the stripes on the timing track.

(5) Only three (non-sweeping) optical sensors are ever needed, regardless of encoder size or resolution.

(6) At most, three optical tracks are needed, and in some implementations, two tracks will suffice.

(7) Single channel failures can be readily detected and isolated.

(8) The encoding of absolute positions into absolute position tags that are embedded within the chain code sequence on the data track enables the data track to be self-synchronizing.

The combination of these eight features distinguish the encoder of this invention from all other existing encoders that we are aware of.

To those skilled in the art to which this invention relates, many changes in construction and widely differing embodiments and applications of the invention will suggest themselves without departing from the spirit and scope of the invention. The disclosures and the descriptions herein are purely illustrative and are not intended to be in any sense limiting.

What is claimed is:

1. An encoding system for determining the absolute and the incremental positions of a movable member relative to a stationary member, including in combination:

an encoding band supported by one said member and having
 a timing and incremental encoding track comprising at least one series of alternating activating stripes and non-activating stripes, and
 a single data track comprising a series of absolute position tags disposed at regular intervals along said data track, each said tag being distinctly different from every other said tag and each comprising a serial bit stream for encoding the absolute position corresponding to the location of its tag along said data track,
reading means supported by the other said member and having three non-sweeping sensing means, two in quadrature with each other for said timing and incremental encoding track, and one for said data track, each said sensing means having a single energy-source-energy-sensor pair including means for generating an analog signal voltage,
said movable members being capable of both discrete and continuous motion in both directions, and
decoding means actuated by said analog signal voltages for determining the incremental and absolute positions of said movable member relative to said stationary member,
whereby said absolute and incremental positions can be determined solely from said system without dependence on any additional information external to said system.

2. The system of claim 1 wherein said decoding means comprises:

(1) timing track phase comparator means connected to said two in-quadrature sensing means for comparing the phase relationship of their two signal voltages and producing a direction level signal and a clock pulse signal, (2) up/down counter means connected to said direction level and clock pulse signals and having readout means for indicating the current position of said movable member, (3) left-motion serial shift register means connected to said direction level and clock pulse signals and also to said third sensing means, (4) right-motion serial shift register means connected to said direction level and clock pulse signals and also to said third sensing means, (5) left-motion mask register means connected to said direction level and clock pulse signal, (6) right-motion mask register means connected to said direction level and clock pulse signal, (7) two framing gating means, each connected to said clock pulse signal and to one of said mask registers means, (8) absolute position register means connected to both said shift register means, and (9) position comparator means connected to said absolute position register means and to said up/down counter means.

3. The system of claim 2 having first tag reversal error detector means connected to said direction level signal, to said clock pulse signal, to the signal from said sensing means for said data track, to said right-motion serial shift register means, and to said right-motion mask register means for providing an error signal when a said tag read from said data track by said sensing means for said data track produces a different reading when said tag moves to the left past said sensing means for said data track from the reading produced when said tag moved to the right past said sensing means for said data track, and second tag reversal error detector means connected to said direction level signal, to said clock pulse signal, to the signal from said sensing means for said data track, to said left-motion serial shift register means, and to said left-motion mask register means for providing an error signal when a said tag read from said data track by said sensing means for said data track produces a different reading when said tag moves to the right past said sensing means for said data track from the reading produced when said tag moved to the left past said sensing means for said data track.

4. The system of claim 2 having
shift register means,
activating means for implementing each said mask register means, and
AND gate means for implementing each said framing gating means.

5. The system of claim 2 having
counting means for providing up/down counter functions for implementing each said mask register means, and
comparing means for providing comparator functions for each said framing gating means.

6. The system of claim 2 having means for providing shift register functions for implementing both said mask register means and said framing gating means.

7. The system of claim 2 wherein said sensing means send their voltage signals through operational amplifier means and Schmitt trigger means en route from said two in-quadrature sensing means, to said phase comparator means and, from said third sensing means en route to said shift register means.

8. The system of claim 2 whereby said signals from said shift register means pass, through respective decoder and error checking means and from there to absolute position multiplexer means, while en route to said absolute position register means.

9. The system of claim 2 having three fault-detection means, to which said three sensing means and said timing track phase comparator means also send their respective signals, for outputting a fault signal when a signal derived from any of the respective sensing means has by itself failed.

10. The system of claim 1 wherein said band is cylindrical and is supported perpendicular to the plane of motion of said movable member.

11. The system of claim 1 wherein said band is flat and annular and is supported parallel to the plane of motion of said movable member.

12. The system of claim 2 having
absolute position tag multiplexer means and
decoder and error checking means,
whereby said signals from said shift registers pass through said absolute position tag multiplexer means and from there to said decoder and error checking means, while en route to said absolute position register means.

13. The system of claim 1 wherein said decoding means comprises (1) timing track phase comparator means connected to said two in-quadrature sensing means for comparing the phase relationship of their two signal voltages and producing a direction level signal and clock pulse signal, (2) first delay means connected to said clock pulse signal for producing a once-delayed version of said clock pulse signal, (3) second delay means connected to said once-delayed clock pulse signal for producing a twice-delayed version of said clock pulse signal, (4) up/down counter means connected to said direction level and clock pulse signals and having readout means for indicating the current position of said movable member, (5) left-motion serial shift register means connected to said direction level and clock pulse signals and also to said third sensing means, (6) right-motion serial shift register means connected to said direction level and clock pulse signals and also to said third sensing means, (7) left-motion mask register shift register means connected to said direction level and clock pulse signals, (8) right-motion mask register shift register means connected to said direction level and clock pulse signals, (9) left-motion serial shift register snapshot means connected to said left-motion serial shift register means and said once-delayed and twice-delayed clock pulse signals,

(10) right-motion serial shift register snapshot means connected to said right-motion serial shift register means and said once-delayed and twice-delayed clock pulse signals,

(11) left-motion mask register shift register snapshot means connected to said left-motion mask register shift register means and to said once-delayed and twice-delayed clock pulse signals,

(12) right-motion mask register shift register snapshot means connected to said right-motion mask register shift register means and to said once-delayed and twice-delayed clock pulse signals,

(13) snapshot shift-count counter means connected to said once-delayed and twice-delayed clock pulse signals,

(14) framing gating means connected to said right-motion mask register shift register snapshot means,

(15) absolute position register means connected to said right-motion shift register snapshot means, and

(16) position comparator means connected to said absolute position register means and to said up/down counter means.

14. The system of claim 13 having operational amplifier means and Schmitt trigger means, through which said sensing means send their voltage signals en route from said two in-quadrature sensing means, to said phase comparator means and, from said third sensing means en route to said shift register means.

15. The system of claim 13 having decoder and error checking means through which said signals from said right-motion serial shift register snapshot means pass while en route to said absolute position register means.

16. The system of claim 13 having three fault-detection means, to which said three sensing means and said timing track phase comparator means also send their respective signals, for outputting a fault signal when a signal derived from any of the respective sensing means has by itself failed.

17. The system of claim 1 wherein said decoding means comprises (1) timing track phase comparator means connected to said two in-quadrature sensing means for comparing the phase relationship of their two signal voltages and producing a direction level signal and clock pulse signal, (2) first delay means connected to said clock pulse signal for producing a once-delayed version of said clock pulse signal, (3) second delay means connected to said once-delayed clock pulse signal for producing a twice-delayed version of said clock pulse signal, (4) up/down counter means connected to said direction level and clock pulse signals and having readout means for indicating the current position of said movable member, (5) left-motion serial shift register means connected to said direction level and clock pulse signals and also to said third sensing means, (6) right-motion serial shift register means connected to said direction level and clock pulse signals and also to said third sensing means, (7) left-motion mask register counter means connected to said direction level and clock pulse signals, (8) right-motion mask register counter means connected to said direction level and clock pulse signals, (9) left-motion serial shift register snapshot means connected to said left-motion serial shift register means and said once-delayed and twice-delayed clock pulse signals,

(10) tight-motion serial shift register snapshot means connected to said right-motion serial shift register means and said once-delayed and twice-delayed clock pulse signals,

(11) snapshot shift-count counter means connected to said once-delayed and twice-delayed clock pulse signals,

(12) two framing gating comparator means, each connected to said clock pulse signal and to one of said mask register counter means,

(13) absolute position register means connected to said right-motion shift register snapshot means, and

(14) position comparator means connected to said absolute position register means and to said up/down counter means.

18. The system of claim 17 having operational amplifier means and Schmitt trigger means through which said sensing means send their voltage signals en route from said two in-quadrature sensing means to said phase comparator means and from said third sensing means en route to said shift register means.

19. The system of claim 17 having a decoder and error checking means, whereby said signals from said right-motion shift register snapshot means pass through a said decoder and error checking means while en route to said absolute position register means.

20. The system of claim 17 having three fault-detection means, to which said three sensing means and said timing track phase comparator means also send their respective signals, for outputting a fault signal when a signal derived from any of the respective sensing means has by itself failed.

21. A decoding apparatus actuated by three analog signal voltages from an encoder for determining the incremental and absolute positions of a movable member relative to a stationary member, said encoder having three sensing means for producing said three analog voltages from a timing track and a data track, comprising:

(1) timing track phase comparator means connected to two timing sensing means for comparing the phase relationship of their two analog signal voltages and producing a direction level signal and a clock pulse signal, (2) up/down counter means connected to said direction level and clock pulse signals and having readout means for indicating the current position of said movable member, (3) left-motion serial shift register means connected to said direction level and clock pulse signals and also to said third analog signal voltage, (4) right-motion serial shift register means connected to said direction level and clock pulse signal and also to said third analog signal voltage, (5) left-motion mask register means connected to said direction level and clock pulse signal, (6) right-motion mask register means connected to said direction level and clock pulse signal, (7) two framing gating means, each connected to said clock pulse signal and to one of said mask register means, (8) absolute position register means connected to both said shift register means, and (9) position comparator means connected to said absolute position register means and to said up/down counter means.

22. The decoding apparatus of claim 21 wherein said sensing means send their voltage signals through operational amplifier means and Schmitt trigger means en route from said two timing sensing means to said phase comparator means and, from said third sensing means en route to said shift register means.

23. The decoding apparatus of claim 21 whereby said signals from said shift register means pass through respective decoder and error checking means and from there to absolute position multiplexer means, while en route to said absolute position register means.

24. The decoding apparatus of claim 21 having three fault detector means, connected to said three sensing means and said timing track phase comparator means so that they also send their respective signals to said three fault detector means, said fault detector means outputting a fault signal when the signal derived from the respective sensing means has by itself failed.

25. An optical encoding system for determining the absolute and the incremental positions of a movable member relative to a stationary member, including in combination:

three light sources supported by one said member for emitting three narrow light beams on respective paths, an encoding band supported by the other said member in the paths of said light beams, said band having at least one timing and incremental encoding track comprising least one series of alternating light-blocking stripes and light-passing stripes, and a single data track comprising a series of absolute position tags disposed at regular intervals along said data track, each said tag being distinctly different from every other said tag and each comprising a serial bit stream for encoding the absolute position corresponding to the location of its tag along said data track, a read head supported by said one said member and having three non-sweeping optical sensors, one for each said light beam, two in quadrature with each other for said timing and incremental encoding track, and one for said data track, each said optical sensor including light sensing means for generating an analog signal voltage, said movable member being capable of both discrete and continuous motion in both directions, decoding means actuated by said analog signal voltages for determining the incremental and absolute positions of said movable member relative to said stationary member, and whereby said absolute and incremental positions can be determined solely from said system without dependence on any additional information external to said system.

26. The system of claim 25 wherein said decoding means comprises a computer programmed to function as:

(1) a timing track phase comparator connected to said two timing-track optical sensors for comparing the phase relationship of their two signal voltages and producing a direction level signal and a clock pulse signal, (2) an up/down counter connected to said direction Q level and clock pulse signals and having readout means for indicating the current position of said movable member, (3) a left-motion serial shift register connected to said direction level and clock pulse signals and also to said third optical sensor, (4) a right-motion serial shift register connected to said direction level and clock pulse signal and also to said third optical sensor, (5) a left-motion mask register connected to said direction level and clock pulse signal, (6) a right-motion mask register connected to said direction level and clock pulse signal, (7) two framing gatings, each connected to said clock pulse signal and to one of said mask registers, (8) an absolute position register connected to both said shift registers, and (9) a position comparator connected to said absolute position register and to said up/down counter.

27. The system of claim 26 wherein said optical sensors send their voltage signals through an operational amplifier and a Schmitt trigger en route from said two optical sensors to said phase comparator and, from said third optical sensor en route to said shift registers.

28. The system of claim 26 whereby said signals from said shift registers pass, in said computer, through g elements functioning as respective decoders and error checking means and from there to elements functioning as an absolute position multiplexer, while en route to said absolute position register.

29. The system of claim 26 having three fault detector means, each connected to some subset of the signals from said three optical sensors and said timing track phase comparator, for producing a fault signal if the signal derived from its respective sensor has by itself failed.

30. The system of claim 25 wherein said light-passing stripes comprise reflecting stripes, reflecting light from said beams to said optical sensors.

31. The system of claim 25 wherein said light-passing stripes are transparent stripes through which said light beams pass en route to said optical sensors.

32. The system of claim 25 wherein there is a single timing track, and its two associated light sources and light sensing means are spaced apart at a predetermined distance to provide serial quadrature.

33. The system of claim 25 wherein there are two timing tracks, staggered with respect to each other to provide said quadrature, each having one said light beam and one said optical sensor associated therewith.

34. The system of claim 25 wherein said band is cylindrical and is supported perpendicular to the plane of motion of said movable member.

35. The system of claim 25 wherein said band is flat and annular and is supported parallel to the plane of motion of said movable member.

36. An encoding system for determining the absolute and the incremental positions of a movable member relative to a stationary member, including in combination:

three light sources supported by one said member for sending three narrow light beams on respective paths, a continuous circular encoding band supported by the other said member in the paths of said light beams, said band having a timing and incremental encoding track comprising at least one series of alternating light-blocking stripes and light-passing stripes, and a single data track comprising a series of absolute position tags disposed at regular intervals along said data track, each said tag being distinctly different from every other said tag and each comprising a serial bit stream for encoding the absolute position corresponding to the location of its tag along said data track, a read head supported by said one said member and having three non-sweeping optical sensors, one for each said light beam, two in quadrature with each other for said timing and incremental encoding track, and one for said data track, each said optical sensor including light sensing means for generating an analog signal voltage, comparator means connected to said two timing-track optical sensors for comparing the phase relationship of their two signal voltages and producing a direction level signal and a clock pulse signal,
up/down counter means connected to said direction level and clock pulse signals and having readout means for indicating the current position of said movable member,
left-motion serial shift register means connected to said direction level and clock pulse signals and also to said third optical sensor,
right-motion serial shift register means connected to said direction level and clock pulse signal and also to said third optical sensor,
left-motion mask register means connected to said direction level and clock pulse signal,
right-motion mask register means connected to said direction level and clock pulse signal,
two framing gating means, each connected to said clock pulse signal and to one of said mask register means,
absolute position register means connected to both said shift register means, and
position comparator means connected to said absolute position register means and to said up/down counter means.

37. The system of claim 36 wherein said optical sensors send their voltage signals through an operational amplifier and a Schmitt trigger en route from each of said two optical sensors to said phase comparator means and, from said third optical sensor en route to said shift register means.

38. The system of claim 36 whereby said signals from said shift register means pass through respective decoding means and error checking means and from there to absolute position multiplexer means, while en route to said absolute position register means.

39. The system of claim 36 having
first fault detector means connected to the signals from the three optical sensors for producing a fault signal if the signal derived from the first of said two in quadrature sensors has by itself failed,
second fault detector means connected to the signals from the three optical sensors for producing a fault signal if the signal derived from the second of said two in quadrature sensors has by itself failed, and
third fault detector means connected to said direction level signal, to said clock pulse signal, and to the signal from said optical sensor for said data track, for providing a fault signal if the signal derived from said data track sensor has by itself failed.

40. The system of claim 36 wherein said light-passing stripes comprise reflecting stripes, reflecting light from said beams to said optical sensor.

41. The system of claim 40 wherein said band is supported by said movable member perpendicular to the plane of said movable member and is cylindrical.

42. The system of claim 40 wherein said band is a flat annulus supported by said movable member parallel to the plane of said movable member.

43. The system of claim 36 wherein said light passing stripes are transparent stripes through which said light beams pass en route to said optical sensor.

44. The system of claim 43 wherein said band is cylindrical and is supported by said movable member.

45. The system of claim 43 wherein said band is a flat annulus supported by said movable member.

46. The system of claim 36 wherein there is a single timing track and its two associated light sources and light sensing means are spaced apart at a predetermined distance to provide said quadrature.

47. The system of claim 36 wherein there are two timing tracks, staggered with respect to each other to provide said quadrature, each having one said light beam and one said optical sensor associated therewith.

48. An encoding system for determining the absolute and the incremental positions of a movable member relative to a stationary member, including in combination:
an encoding band supported by one said member, said band having
a single timing track for timing and incremental encoding, comprising a series of alternating dark stripes and reflective stripes, and
a single data track comprising a series of absolute position tags disposed at regular intervals along said data track, each said tag being distinctly different from every other said tag and each comprising a serial bit stream for encoding the absolute position corresponding to the location of its tag along said data track,
a read head supported by the other said member and having three non-sweeping optical sensors, two for said timing track, being spaced apart to provide quadrature, and one for said data track, each said optical sensor including a light source coupled with light sensing means for generating an analog signal voltage,
timing track phase comparator means connected to said two timing-track optical sensors for comparing the phase relationship of their two signal voltages and producing a direction level signal and a clock pulse signal,
up/down counter means connected to said direction level and clock pulse signals and having readout means for indicating the current position of said movable member,
left-motion serial shift register means connected to said direction level and clock pulse signals and also to said third optical sensor,
right-motion serial shift register means connected to said direction level and clock pulse signal and also to said third optical sensor,
left-motion mask register means connected to said direction level and clock pulse signal,
right-motion mask register means connected to said direction level and clock pulse signal,
two framing gating means, each connected to said clock pulse signal and to one of said mask register means,
absolute position register means connected to both said shift register, and
position comparator means connected to said absolute position register means and to said up/down counter means.

49. The system of claim 48 wherein said optical sensors send their voltage signals through an operational amplifier and a Schmitt trigger en route from said two optical sensors to said phase comparator means and, from said third optical sensor en route to said shift register means.

50. The system of claim 48 whereby said signals from said shift register means pass through respective decoding means and error checking means and from there to absolute position multiplexer means, while en route to said absolute position register means.

51. The encoding system of claim 48 having a first fault detector circuit connected to the signals from said three optical sensors and producing a fault signal if the signal derived from the first of said two optical sensors for said timing track has by itself failed, a second fault detector connected to the signals from said three optical sensors and producing a fault signal if the signal derived from the second of said two optical sensors for said timing track has by itself failed, and a third fault detector connected to said direction level signal, to said clock pulse signal, and to the signal from said optical sensor for said data track and providing a fault signal if the signal derived from said data track sensor has by itself failed.

52. The system of claim 48 wherein said band is cylindrical and is supported perpendicular to the plane of said movable member by its said member.

53. The system of claim 48 wherein said band is a flat annulus and is supported parallel to the plane of said movable member by its said member.

54. An encoding system for determining the absolute and the incremental positions of a movable member relative to a stationary member, including in combination:

an encoding band supported by one said member, said band having
a single timing track for timing and incremental encoding comprising a series of alternating opaque stripes and transparent stripes, and
a single data track comprising a series of absolute position tags disposed at regular intervals along said data track, each said tag being distinctly different from every other said tag and each comprising a serial bit stream for encoding the absolute position corresponding to the location of its tag along said data track,
three light source means supported by the other said member and directing respective beams toward said band,
a read head supported by said other member and having three optical sensors on the opposite side of said band from said light source means, two for said timing track, being spaced apart to provide quadrature, and one for said data track, each said optical sensor including light sensing means for generating an analog signal voltage,
timing track phase comparator means connected to said two timing-track optical sensors for comparing the phase relationship of their two signal voltages and producing a direction level signal and a clock pulse signal,
up/down counter means connected to said direction level and clock pulse signals and having readout means for indicating the current position of said movable member,
left-motion serial shift register means connected to said direction level and clock pulse signals and also to said third optical sensor,
right-motion serial shift register means connected to said direction level and clock pulse signal and also to said third optical sensor,
left-motion mask register means connected to said direction level and clock pulse signal,
right-motion mask register means connected to said direction level and clock pulse signal,
two framing gating means, each connected to said clock pulse signal and to one of said mask register means,
absolute position register means connected to both said shift register means, and
position comparator means connected to said absolute position register means and to said up/down counter means.

55. The system of claim 54 wherein said optical sensors send their voltage signals through an operational amplifier and a Schmitt trigger en route from said two sensors to said phase comparator means and, from said third optical sensor en route to said shift register means.

56. The system of claim 54 whereby said signals from said shift register means pass through respective decoding means and error checking means and from there to absolute position multiplexer means, while en route to said absolute position register means.

57. In a system for determining the absolute and the incremental positions of a movable telescope dome of a dome building having a stationary portion, the combination of:

a circular encoding band supported by said movable dome, said band having
a timing track for timing and incremental encoding comprising at least one series of narrow stripes all around said band, alternating light-absorbing and light-passing stripes, and
a data track comprising a series of absolute position tags disposed at regular intervals along said data track, each said tag being distinctly different from every other said tag and each comprising a serial bit stream for encoding the absolute position corresponding to the location of its tag along said data track,
a read head supported by said stationary portion of said dome building and having three optical sensors aimed at said band, two for said timing track, being spaced apart a predetermined distance for quadrature, and one for said data track, each said optical sensor including a light-emitting diode coupled with a phototransistor for generating an analog signal voltage from the transmission of the light-emitting diode light from said tracks,
said read head being mounted on wheels in rolling contact with said band and mounted to said stationary portion through a parallelogram linkage and spring-urged toward a set distance from said band, so that out-of-roundness of said dome is compensated.

58. The system of claim 57 wherein said read head is pivotally mounted relative to said parallelogram linkage.

59. The system of claim 57 wherein there is a single timing track and its two associated light sources and light sensing means are spaced apart at a predetermined distance to provide said quadrature.

60. The system of claim 57 wherein there are two timing tracks, staggered with respect to each other to provide said quadrature, each having one said light beam and one said optical sensor associated therewith.

61. An optical encoding system for determining the absolute and the incremental positions of a movable member relative to a stationary member, including in combination:

three light sources supported by one said member for emitting three narrow light beams on respective paths, an encoding band supported by the other said member in the paths of said light beams, said band having
a single timing and incremental encoding track comprising at least one series of alternating light-blocking stripes and light-passing stripes, and
a single data track comprising a series of absolute position tags disposed at regular intervals along said data track each said tag being distinctly different from every other said tag and each comprising a serial bit stream for encoding the absolute position corresponding to the location of its tag along said data track, and
a read head supported by said one said member and having three non-sweeping optical sensors, one for each said light beam, two in quadrature with each other for said timing and incremental encoding track, and one for said data track, each said optical sensor including light sensing means for generating an analog signal voltage,
said movable member being capable of both discrete and continuous motion in both directions,
whereby said absolute and incremental positions can be determined solely from said system without dependence on any additional information external to said system.

62. An encoding system for determining the absolute and the incremental positions of a movable telescope dome of a dome building having a stationary portion, including in combination:
an encoding band supported by a generally cylindrical surface of said movable dome around the complete circle thereof, said band having
a timing track for timing and incremental encoding comprising a series of narrow stripes all around said band, alternating dark and reflective stripes, and
a data track comprising a series of absolute position tags disposed at regular intervals along said data track, each said tag being distinctly different from every other said tag and each comprising a serial bit stream for encoding the absolute position corresponding to the location of its tag along said data track,
a read head supported by said stationary portion of said dome building and having three non-sweeping optical sensors aimed at said band, two for said timing track, being spaced apart a predetermined distance, and one for said data track, each said optical sensor including a light-emitting diode coupled with a phototransistor for generating an analog signal voltage from the reflection of the light-emitting diode light from said tracks,
said read head being mounted to its rigid support through a parallelogram linkage, and spring means urging it toward a set distance from said band, so that out-of-roundness of said dome is compensated.

63. An encoding system for determining the absolute and the incremental positions of a movable telescope dome of a domed building having a stationary portion, including in combination:
an encoding band supported by a generally cylindrical surface of said movable dome around the complete circle thereof, said band having
a timing track for timing and incremental encoding comprising a series of narrow stripes all around said band, alternating dark and reflective stripes, and
a data track comprising a series of absolute position tags disposed at regular intervals along said data track, each said tag being distinctly different from every other said tag and each comprising a serial bit stream for enclosing the absolute position corresponding to the location of its tag along said data track,
a read head supported by said stationary portion of said dome building and having three non-sweeping optical sensors aimed at said band, two for said timing track, being spaced apart a predetermined distance, and one for said data track, each said optical sensor including a light-emitting diode coupled with a phototransistor for generating an analog signal voltage from the reflection of the light-emitting diode light from said tracks,
said read head being mounted on wheels in rolling contact with said cylindrical surface.

64. An encoding system for determining the absolute and the incremental positions of a movable telescope dome of a dome building having a stationary portion, including in combination:
an encoding band supported by a generally cylindrical surface of said movable dome around the complete circle thereof, said band having
a timing track for timing and incremental encoding comprising a series of narrow stripes all around said band, alternating dark and reflective stripes, and
a data track comprising a series of absolute position tags disposed at regular intervals along said data track, each said tag being distinctly different from every other said tag and each comprising a serial bit stream for encoding the absolute position corresponding to the location of its tag along said data track,
a read head supported by said stationary portion of said dome building and having three non-sweeping optical sensors aimed at said band, two for said timing track, being spaced apart a predetermined distance, and one for said data track, each said optical sensor including a light-emitting diode coupled with a phototransistor for generating an analog signal voltage from the reflection of the light-emitting diode light from said tracks,
timing track phase comparator means connected to said two timing-track optical sensors for comparing the phase relationship of their two signal voltages and producing a direction level signal and a clock pulse signal,
up/down counter means connected to said direction level and clock pulse signals and having readout means for indicating the current dome position,
dome left-motion serial shift register means connected to said direction level and clock pulse signals and also to said third optical sensor,
dome right-motion serial shift register means connected to said direction level and clock pulse signal and also to said third optical sensor,
dome left-motion mask register means connected to said direction level and clock pulse signal,
dome right-motion mask register means connected to said direction level and clock-pulse signal,
two framing gating means, each connected to said clock pulse signal and to one of said mask register means,
absolute position register means connected to both said shift register means, and position comparator means connected to said absolute position register means and to said up/down counter means.

65. The system of claim 64 wherein said optical sensors send their voltage signals through an operational amplifier and a Schmitt trigger en route from said two optical sensors to said phase comparator means and, from said third optical sensor en route to said shift register means.

66. The system of claim 64 whereby said signals from said shift register means pass through respective decoding means and error checking means and from there to absolute position multiplexer means, while en route to said absolute position register means.

67. The system of claim 64 having
first fault detector means connected to the signals from said three optical sensors for producing a fault signal if the signal derived from the first of said two timing track optical sensors has by itself failed,
second fault detector means connected to the signals from said three optical sensors for producing a fault signal if the signal derived from the second of said two timing track optical sensors has by itself failed, and
third fault detector means connected to said direction level signal, to said clock pulse signal, and to the signal from said optical sensor for said data track, for providing a fault signal if the signal derived from said data track sensor has by itself failed.

68. An encoding system for determining the absolute and the incremental positions of a movable member relative to a stationary member, including in combination:
a circular encoding band on said movable member, said band having
a single timing track means for timing and incremental encoding comprising a series of alternating opaque stripes and transparent stripes, and
a single data track comprising a series of absolute position tags disposed at regular intervals along said data track, each said tag being distinctly different from every other said tag and each comprising a serial bit stream for encoding the absolute position corresponding to the location of its tag along said data track,
three light source means mounted on said stationary member and directing respective beams toward said band, and
a read head secured to said stationary member and having three non-sweeping optical sensors on the opposite side of said band from said light source means, two for said timing track, being spaced apart, and one for data track, each said optical sensor including light sensing means for generating an analog signal voltage,
said members being capable of both discrete and continuous motion in both directions around a circular path,
whereby said absolute and incremental positions can be determined solely from said system without dependence on any additional information external to said system.

69. An encoding system for determining the absolute and the incremental positions of a movable member relative to a stationary member, including in combination:
a circular encoding band on said movable member, said band having
timing track means for timing and incremental encoding comprising a series of alternating opaque stripes and transparent stripes, and
a data track comprising a series of absolute position tags disposed at regular intervals along said data track, each said tag being distinctly different from every other said tag and each comprising a serial bit stream for encoding the absolute position corresponding to the location of its tag along said data track,
three light source means mounted on said stationary member and directing respective beams toward said band,
a read head secured to said stationary member and having three optical sensors on the opposite side of said band from said light source means, two for said timing track, being spaced apart, and one for said data track, each said optical sensor including light sensing means for generating an analog signal voltage,
timing track phase comparator means connected to said two timing-track-means optical sensors for comparing the phase relationship of their two signal voltages and producing a direction level signal and a clock pulse signal,
up/down counter means connected to said direction level and clock pulse signals and having readout means for indicating the current position of said movable member,
left-motion serial shift register means connected to said direction level and clock pulse signals and also to said third optical sensor,
right-motion serial shift register means connected to said direction level and clock pulse signal and also to said third optical sensor,
left-motion mask register means connected to said direction level and clock pulse signals,
right-motion mask register means connected to said direction level and clock pulse signals,
two framing gating means, each connected to said clock pulse signal and to one of said mask register means,
absolute position register means connected to both said shift register means, and
position comparator means connected to said absolute position register means and to said up/down counter means.

70. The system of claim 69 wherein said optical sensors send their voltage signals through an operational amplifier and a Schmitt trigger en route from said two optical sensors to said phase comparator means and, from said third optical sensor en route to said shift register means.

71. The system of claim 69 whereby said signals from said shift register means pass through respective decoding means and error checking means and from there to absolute position multiplexer means, while en route to said absolute position register means.

72. A method for determining the absolute and the incremental positions of a movable member relative to a stationary member, comprising the steps of:
sending three separate beams of light toward one said member,
intercepting said beams by an encoding band secured to the other said member, said band having a timing track for timing and incremental encoding portion comprising a series of narrow alternating light-beam blocking and light-beam passing stripes and a data track comprising a series of absolute position tags disposed at regular intervals along said data track, each said tag being distinctly different from every other said tag, and each comprising a serial bit stream for encoding the absolute position corresponding to the location of its tag along said data track, two of said light beams being directed at spaced-apart loci along said timing track and one directed to a locus along said data track, generating an analog signal voltage from the light from each beam after the interception, two such voltages from said timing track and one from said data track, comparing the phase relationship of the two analog voltages from said timing track and producing direction level signals and clock pulse signals therefrom, counting the clock pulse signals, thereby indicating the current incremental position of said movable member, sending said direction level and clock pulse signals and a logic level derived from the third analog voltage to left-motion serial shift register means, and also to right-motion serial shift register means, framing the output from each said shift register means and sending the resultant output of each to absolute position register means, comparing the absolute position register values with those from said counting step, and resetting said incremental position to match the value contained in the absolute position register means, should they disagree.

73. The method of claim 72 wherein said sending step comprises additionally sending said direction level and clock pulse signals and the signals derived from the step of intercepting said three light beams to a fault detection circuit and there comparing, two at a time, the signals derived from the step of intercepting said three light beams and determining whether the signal derived from any signal from said light beam interception has by itself failed.

74. The method of claim 72 wherein said timing track comprises a single track.

75. The method of claim 72 wherein said timing track comprises two tracks.

76. The method of claim 72 wherein said intercepting step comprises impinging said separate beams of light on said encoding band, said band's having a timing and incremental encoding portion comprising a series of narrow alternating dark and reflective stripes and a data track comprising a series of absolute position tags.

77. The method of claim 72 wherein said intercepting step comprises sending the three light beams through said band via a timing and incremental encoding portion comprising a series of narrow alternating opaque and transparent stripes and a data track comprising a series of absolute position tags.

78. A method for encoding the absolute and the incremental positions of a movable member relative to a stationary member, comprising the steps of:

sending three separate beams of light toward a stationary position, intercepting said beams by an encoding band secured to said movable member, said band having a timing track for timing and incremental encoding portion comprising a series of narrow alternating light-beam blocking and light-beam passing stripes and a single data track comprising a series of absolute position tags disposed at regular intervals along said data track, each said tag being distinctly different from every other said tag and each comprising a serial bit stream for encoding the absolute position corresponding to the location of its tag along said data track, two of said light beams being directed at spaced-apart loci along said timing track and one directed to a locus along said data track, generating an analog signal voltage from the light from each beam after the interception, two such voltages in quadrature from said timing track and one from said data track, said members being capable of both discrete and continuous motion in both directions around a circular path, and whereby said absolute and incremental positions can be determined solely from said system without dependence on any additional information external to said system.

79. The method of claim 78 wherein said timing track comprises a single track.

80. The method of claim 78 wherein said timing track comprises two tracks.

81. The method of claim 78 wherein said intercepting step comprises impinging said separate beams of light on said encoding band, said band's having a timing and incremental encoding portion comprising a series of narrow alternating dark and reflective stripes and a data track comprising a series of absolute position tags.

82. The method of claim 78 wherein said intercepting step comprises sending the three light beams through said band via a timing and incremental encoding portion comprising a series of narrow alternating opaque and transparent stripes and a data track comprising a series of absolute position tags.

83. The system of claim 1 wherein said decoding means comprises
(1) timing track phase comparator means connected to said two in-quadrature sensing means for comparing the phase relationship of their two signal voltages and producing a direction level signal and clock pulse signal,
(2) up/down counter means connected to said direction level and clock pulse signals and having readout means for indicating the current position of said movable member,
(3) common-motion serial shift register means connected to said direction level and clock signals and also to said third sensing means,
(4) left-motion mask register means connected to said direction level and clock pulse signals,
(5) right-motion mask register means connected to said direction level and clock pulse signals,
(6) two framing gating means each connected to said clock pulse signal and to one of said mask register means,
(7) absolute position register means connected to said common-motion serial shift register means, and
(8) position comparator means connected to said absolute position register means and to said up/down counter means.

84. The system of claim 83 wherein said sensing means send their voltage signals through operational amplifier means and Schmitt trigger means en route from said two in-quadrature sensing means, to said phase comparator means and, from said third sensing means en route to said shift register means.

85. The system of claim 83 whereby said signals from said common-motion serial shift register means pass through a decoder and error checking means, while en route to said absolute position register means.

86. The system of claim 83 having three fault-detection means, to which said three sensing means and said timing track phase comparator means also send their respective signals, for outputting a fault signal when a signal derived from any of the respective sensing means has by itself failed.

87. The system of claim 83 wherein said mask register means are implemented using shift register functions and wherein said framing gating means are implemented using AND gate functions.

88. The system of claim 83 wherein said mask register means are implemented using up/down counter functions and wherein said framing gating means are implemented using comparator functions.

89. The system of claim 83 wherein said mask register means and said framing gating means are implemented using the same shift register function.

90. The system of claim 83 having first tag reversal error detector means connected to said direction level signal, to said clock pulse signal, to the signal from said sensing means for said data track, to said common-motion serial shift register means, and to said right-motion mask register means for providing an error signal if a said tag read from said data track by said sensing means for said data track produces a different reading when said tag moves to the left past said sensing means for said data track from the reading produced when said tag moved to the right past said sensing means for said data track, and second tag reversal error detector means connected to said direction level signal, to said clock pulse signal, to the signal from sad sensing means for said data track, to said common-motion serial shift register means, and to said left-motion mask register means for providing an error signal if a said tag read from said data track by said sensing means for said data track produces a different reading when said tag moves to the right past said sensing means for said data track from the reading produced when said tag moved to the left past said sensing means for said data track.

91. The system of claim 1 wherein said decoding means comprises (1) timing track phase comparator means connected to said two in-quadrature sensing means for comparing the phase relationship of their two signal voltages and producing a direction level signal and clock pulse signal, (2) first delay means connected to said clock pulse signal for producing a once-delayed version of said clock pulse signal, (3) second delay means connected to said once-delayed clock pulse signal for producing a twice-delayed version of said clock pulse signal, (4) up/down counter means connected to said direction level and clock pulse signals and having readout means for indicating the current position of said movable member, (5) common-motion serial shift register means connected to said direction level and clock pulse signals and also to said third sensing means, (6) left-motion mask register shift register means connected to said direction level and clock pulse signals, (7) right-motion mask register shift register means connected to said direction level and clock pulse signals, (8) common-motion serial shift register snapshot means connected to said common-motion serial shift register means and said once-delayed and twice-delayed clock pulse signals, (9) left-motion mask register shift register snapshot means connected to said left-motion mask register shift register means and to said once-delayed and twice-delayed clock pulse signals,

(10) right-motion mask register shift register snapshot means connected to said right-motion mask register shift register means and to said once-delayed and twice-delayed clock pulse signals,

(11) snapshot shift count counter means connected to said once-delayed and twice-delayed clock pulse signals,

(12) framing gating means connected to said right-motion mask register shift register snapshot means,

(13) absolute position register means connected to said common-motion shift register snapshot means, and

(14) position comparator means connected to said absolute position register means and to said up/down counter means.

92. The system of claim 91 wherein said sensing means send their voltage signals through operational amplifier means and Schmitt trigger means en route from said two in-quadrature sensing means, to said phase comparator means and, from said third sensing means en route to said shift register means.

93. The system of claim 91 whereby said signals from said common-motion shift register snapshot means pass through a decoder and error checking means, while en route to said absolute position register means.

94. The system of claim 91 having three fault-detection means, to which said three sensing means and said timing track phase comparator means also send their respective signals, for outputting a fault signal when a signal derived from any of the respective sensing means has by itself failed.

95. The system of claim 91 having first tag reversal error detector means connected to said direction level signal, to said clock pulse signal, to the signal from said sensing means for said data track, to said common-motion serial shift register means, and to said right-motion mask register means for providing an error signal if a said tag read from said data track by said sensing means for said data track produces a different reading when said tag moves to the left past said sensing means for said data track from the reading produced when said tag moved to the right past said sensing means for said data track, and second tag reversal error detector means connected to said direction level signal, to said clock pulse signal, to the signal from said sensing means for said data track, to said common-motion serial shift register means, and to said left-motion mask register means for providing an error signal if a said tag read from said data track by said sensing means for said data track produces a different reading when said tag moves to the right past said sensing means for said data track from the reading produced when said tag moved to the left past said sensing means for said data track.

96. The system of claim 1 wherein said decoding means comprises
  (1) timing track phase comparator means connected to said two in-quadrature sensing means for comparing the phase relationship of their two signal voltages and producing a direction level signal and clock pulse signal,
  (2) first delay means connected to said clock pulse signal for producing a once-delayed version of said clock pulse signal,
  (3) second delay means connected to said once-delayed clock pulse signal for producing a twice-delayed version of said clock pulse signal,
  (4) up/down counter means connected to said direction level and clock pulse signals and having readout means for indicating the current position of said movable member,
  (5) common-motion serial shift register means connected to said direction level and clock pulse signals and also to said third sensing means,
  (6) left-motion mask register counter means connected to said direction level and clock pulse signals,
  (7) right-motion mask register counter means connected to said direction level and clock pulse signals,
  (8) common-motion serial shift register snapshot means connected to said common-motion serial shift register means and said once-delayed and twice-delayed clock pulse signals,
  (9) snapshot shift-count counter means connected to said once-delayed and twice-delayed clock-pulse signals,
  (10) two framing gating means, each connected to said clock pulse signal and to one of said mask register counter means,
  (11) absolute position register means connected to said common-motion shift register snapshot means, and
  (12) position comparator means connected to said absolute position register means and to said up/down counter means.

97. The system of claim 96 wherein said sensing means send their voltage signals through operational amplifier means and Schmitt trigger means en route from said two in-quadrature sensing means, to said phase comparator means and, from said third sensing means en route to said shift register means.

98. The system of claim 96 whereby said signals from said common-motion shift register snapshot means pass through a decoder and error checking means, while en route to said absolute position register means.

99. The system of claim 96 having three fault-detection means, to which said three sensing means and said timing track phase comparator means also send their respective signals, for outputting a fault signal when a signal derived from any of the respective sensing means has by itself failed.

100. The system of claim 96 having
  first tag reversal error detector means connected to said direction level signal, to said clock pulse signal, to the signal from said sensing means for said data track, to said common-motion serial shift register means, and to said right-motion mask register means for providing an error signal if a said tag read from said data track by said sensing means for said data track produces a different reading when said tag moves to the left past said sensing means for said data track from the reading produced when said tag moved to the right past said sensing means for said data track, and
  second tag reversal error detector means connected to said direction level signal, to said clock pulse signal, to the signal from said sensing means for said data track, to said common-motion serial shift register means, and to said left-motion mask register means for providing an error signal if a said tag read from said data track by said sensing means for said data track produces a different reading when said tag moves to the right past said sensing means for said data track from the reading produced when said tag moved to the left past said sensing means for said data track.

* * * * *